US012588181B2

(12) United States Patent
Lin et al.

(10) Patent No.: US 12,588,181 B2
(45) Date of Patent: Mar. 24, 2026

(54) MEMORY DEVICE AND METHOD FOR FORMING THE SAME

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Hsin-Cheng Lin, Taipei City (TW); Tao Chou, New Taipei City (TW); Chee-Wee Liu, Taipei City (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 436 days.

(21) Appl. No.: 18/170,965

(22) Filed: Feb. 17, 2023

(65) Prior Publication Data

US 2024/0284653 A1     Aug. 22, 2024

(51) Int. Cl.
H10B 10/00          (2023.01)
(52) U.S. Cl.
CPC .................................. H10B 10/125 (2023.02)
(58) Field of Classification Search
None
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |

(Continued)

FOREIGN PATENT DOCUMENTS

| | | |
|---|---|---|
| TW | 201640651 A | 11/2016 |
| TW | 202230363 A | 8/2022 |
| TW | 202234402 A | 9/2022 |

OTHER PUBLICATIONS

Naoto Horiguchi, "Nanosheet device architectures to enable CMOS scaling in 3nm and beyond: Nanosheet, Forksheet and CFET", 2021 Symposia on VLSI Technology and Circuits, pp. 1-44.

*Primary Examiner* — Khaja Ahmad
(74) *Attorney, Agent, or Firm* — Maschoff Brennan

(57)          ABSTRACT

A memory device includes a first pull-down transistor, a first pass-gate transistor, a second pull-down transistor, a second pass-gate transistor, a first pull-up transistor, and a second pull-up transistor. A first power line, a first bit line, and a second bit line is provided, the first power line includes first and second portions separated from each other, wherein in a cross-sectional view, the second portion of the first power line is laterally between the first and second bit lines along a direction. A first via electrically connects the first portion of the first power line to the first pull-down transistor. A second via electrically connects the first bit line to the first pass-gate transistor. A third via electrically connects the second portion of the first power line to the second pull-down transistor. A fourth via electrically connects the second bit line to the second pass-gate transistor.

20 Claims, 54 Drawing Sheets

(56) References Cited

U.S. PATENT DOCUMENTS

| 9,608,116 | B2 | 3/2017 | Ching et al. | |
|---|---|---|---|---|
| 11,538,814 | B2 | 12/2022 | Hwang et al. | |
| 11,665,878 | B2 | 5/2023 | Chanemougame et al. | |
| 2013/0181297 | A1* | 7/2013 | Liaw | H10D 86/215 |
| | | | | 257/E27.099 |
| 2013/0272056 | A1* | 10/2013 | Liaw | G11C 8/14 |
| | | | | 365/154 |
| 2014/0133218 | A1* | 5/2014 | Liaw | G11C 11/412 |
| | | | | 438/283 |
| 2018/0069011 | A1 | 3/2018 | Colinge et al. | |
| 2022/0208258 | A1 | 6/2022 | Zhu | |

* cited by examiner

MEMORY DEVICE AND METHOD FOR FORMING THE SAME

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
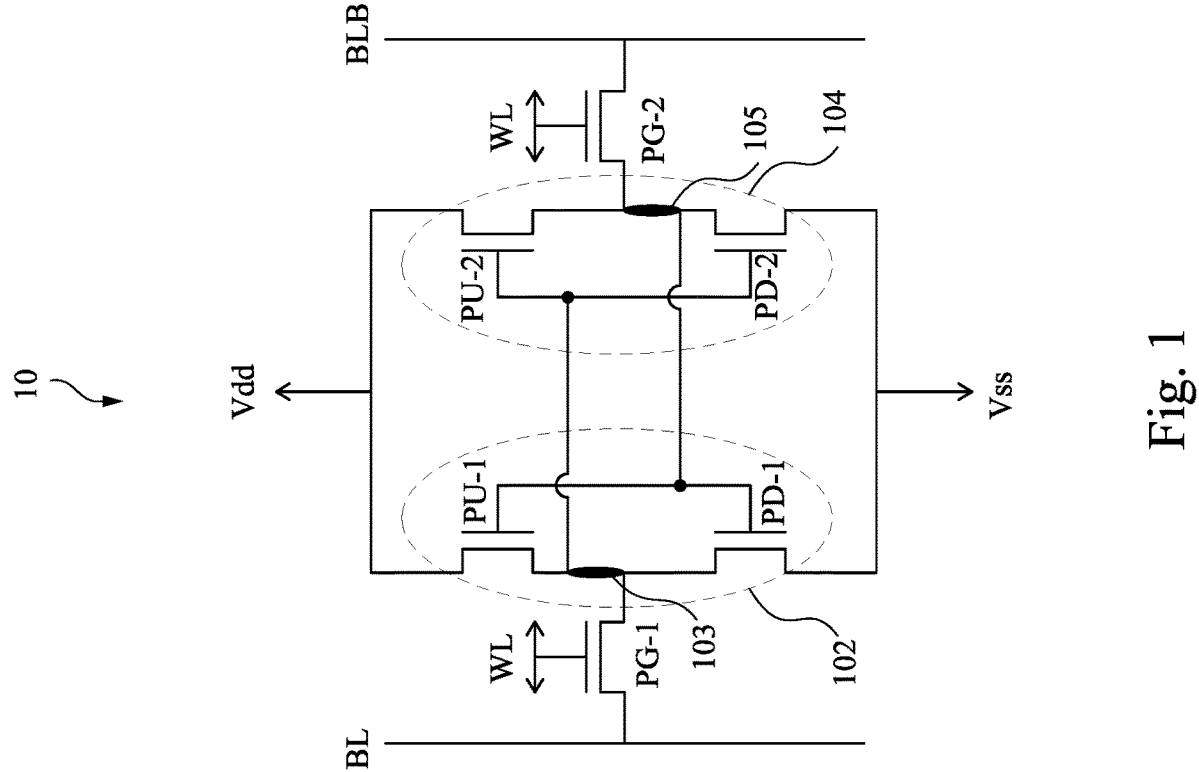
FIG. 1 is a circuit diagram of a six transistor (6T) SRAM cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit (IC) structures and methods of forming the same. More particularly, some embodiments of the present disclosure are related to gate-all-around (GAA) devices. A GAA device includes a device that has its gate structure, or portions thereof, formed on four-sides of a channel region (e.g., surrounding a portion of a channel region). The channel region of a GAA device may include nanosheet channels, bar-shaped channels, and/or other suitable channel configurations. In some embodiments, the channel region of a GAA device may have multiple horizontal nanosheets or horizontal bars vertically spaced, making the GAA device a stacked horizontal GAA (S-HGAA) device. The GAA devices presented herein include a p-type metal-oxide-semiconductor GAA device and an n-type metal-oxide-semiconductor GAA device stack together. Further, the GAA devices may have one or more channel regions (e.g., nanosheets) associated with a single, contiguous gate structure, or multiple gate structures. One of ordinary skill may recognize other examples of semiconductor devices that may benefit from aspects of the present disclosure. In some embodiments, the nanosheets can be interchangeably referred to as nanowires, nanoslabs, nanorings, or nanostructures having nano-scale size (e.g., a few nanometers), depending on their geometry. In addition, the embodiments of the disclosure may also be applied, however, to a variety of metal oxide semiconductor transistors (e.g., complementary-field effect transistor (CFET) and fin field effect transistor (FinFET)).

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

The present disclosure will be described with respect to embodiments in a specific context, a static random-access memory (SRAM) formed with a gate-all-around (GAA) configuration. The embodiments of the disclosure may also be applied, however, to a variety of semiconductor devices. Various embodiments will be explained in detail with reference to the accompanying drawings.

Static random-access memory (SRAM) is a type of volatile semiconductor memory that uses bistable latching circuitry to store bits. Bit in an SRAM is stored on four transistors (PU-1, PU-2, PD-1, and PD-2) that form two cross-coupled inverters. This memory cell has two stable states which are used to denote 0 and 1. Two additional access transistors (PG-1 and PG-2) are electrically connected to the two cross-coupled inverters and serve to control the access to a storage cell during read and write operations.

FIG. 1 is a circuit diagram of a six transistor (6T) SRAM cell. The SRAM cell 10 includes a first inverter 102 formed by a pull-up transistor PU-1 and a pull-down transistor PD-1. The SRAM cell 10 further includes a second inverter 104 formed by a pull-up transistor PU-2 and a pull-down transistor PD-2. Furthermore, both the first inverter 102 and second inverter 104 are coupled between a power line Vdd and a power line Vss. In some embodiments, the power line Vss may be ground potential. In some embodiment, the pull-up transistor PU-1 and PU-2 can be p-type transistors while the pull-down transistors PD-1 and PD-2 can be n-type transistors, and the claimed scope of the present disclosure is not limited in this respect.

In FIG. 1, the first inverter 102 and the second inverter 104 are cross-coupled. That is, the first inverter 102 has an input connected to the output of the second inverter 104. Likewise, the second inverter 104 has an input connected to the output of the first inverter 102. The output of the first inverter 102 is referred to as a storage node 103. Likewise, the output of the second inverter 104 is referred to as a storage node 105. In a normal operating mode, the storage node 103 is in the opposite logic state as the storage node 105. By employing the two cross-coupled inverters, the SRAM device 10 can hold the data using a latched structure so that the stored data will not be lost without applying a refresh cycle as long as power is supplied through Vdd.

In an SRAM device using the 6T SRAM cells, the cells are arranged in rows and columns. The columns of the SRAM array are formed by a bit line (signal line) pairs, namely a first bit line BL and a second bit line BLB. The cells of the SRAM device are disposed between the respective bit line pairs. As shown in FIG. 1, the SRAM device 10 is placed between the bit line BL and the bit line BLB.

In FIG. 1, the SRAM device 10 further includes a first pass-gate transistor PG-1 connected between the bit line BL and the output 103 of the first inverter 102. The SRAM device 10 further includes a second pass-gate transistor PG-2 connected between the bit line BLB and the output 105 of the second inverter 104. The gates of the first pass-gate transistor PG-1 and the second pass-gate transistor PG-2 are connected to a word line WL, which connects SRAM cells in a row of the SRAM array.

In operation, if the pass-gate transistors PG-1 and PG-2 are inactive, the SRAM device 10 will maintain the complementary values at storage nodes 103 and 105 indefinitely as long as power is provided through Vdd. This is so because each inverter of the pair of cross coupled inverters drives the input of the other, thereby maintaining the voltages at the storage nodes. This situation will remain stable until the power is removed from the SRAM, or, a write cycle is performed changing the stored data at the storage nodes.

In the circuit diagram of FIG. 1, the pull-up transistors PU-1, PU-2 are p-type transistors. The pull-down transistors PD-1, PD-2, and the pass-gate transistors PG-1, PG-2 are n-type transistors. In some other embodiments, however, the pull-up transistors PU-1, PU-2 are n-type transistors, and the pull-down transistors PD-1, PD-2, and the pass-gate transistors PG-1, PG-2 are p-type transistors.

The structure of the SRAM device 10 in FIG. 1 is described in the context of the 6T-SRAM. One of ordinary skill in the art, however, should understand that features of the various embodiments described herein may be used for forming other types of devices, such as an 8T-SRAM memory device, or memory devices other than SRAMs, such as standard cell, gated diode or ESD (Electrostatic Discharge) devices. Furthermore, embodiments of the present disclosure may be used as stand-alone memory devices, memory devices integrated with other integrated circuitry, or the like.

Figure 2A:
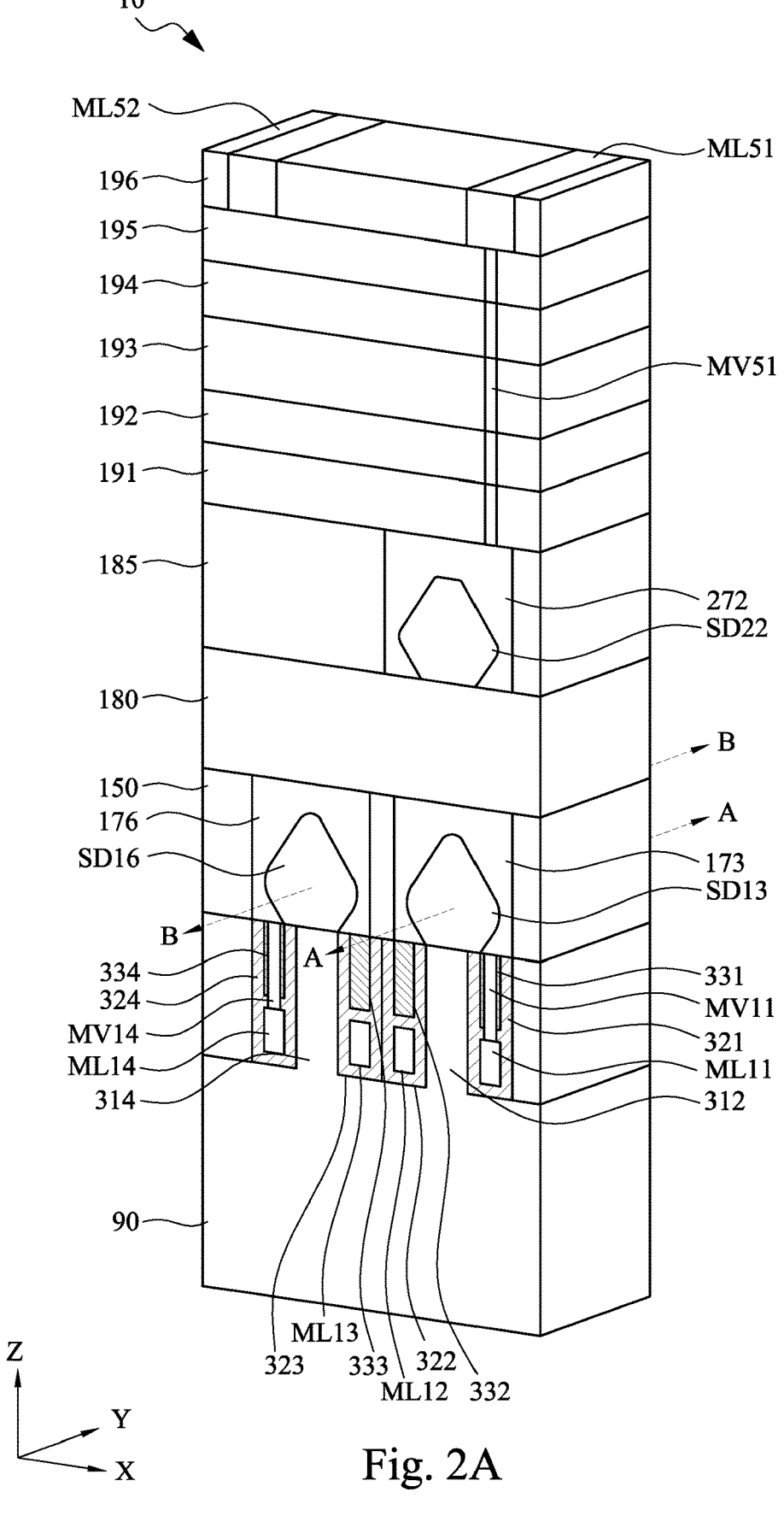
FIGS. 2A, 2B, and 2C are perspective views of an SRAM device according to some embodiments of the present disclosure.
Figure 2B:
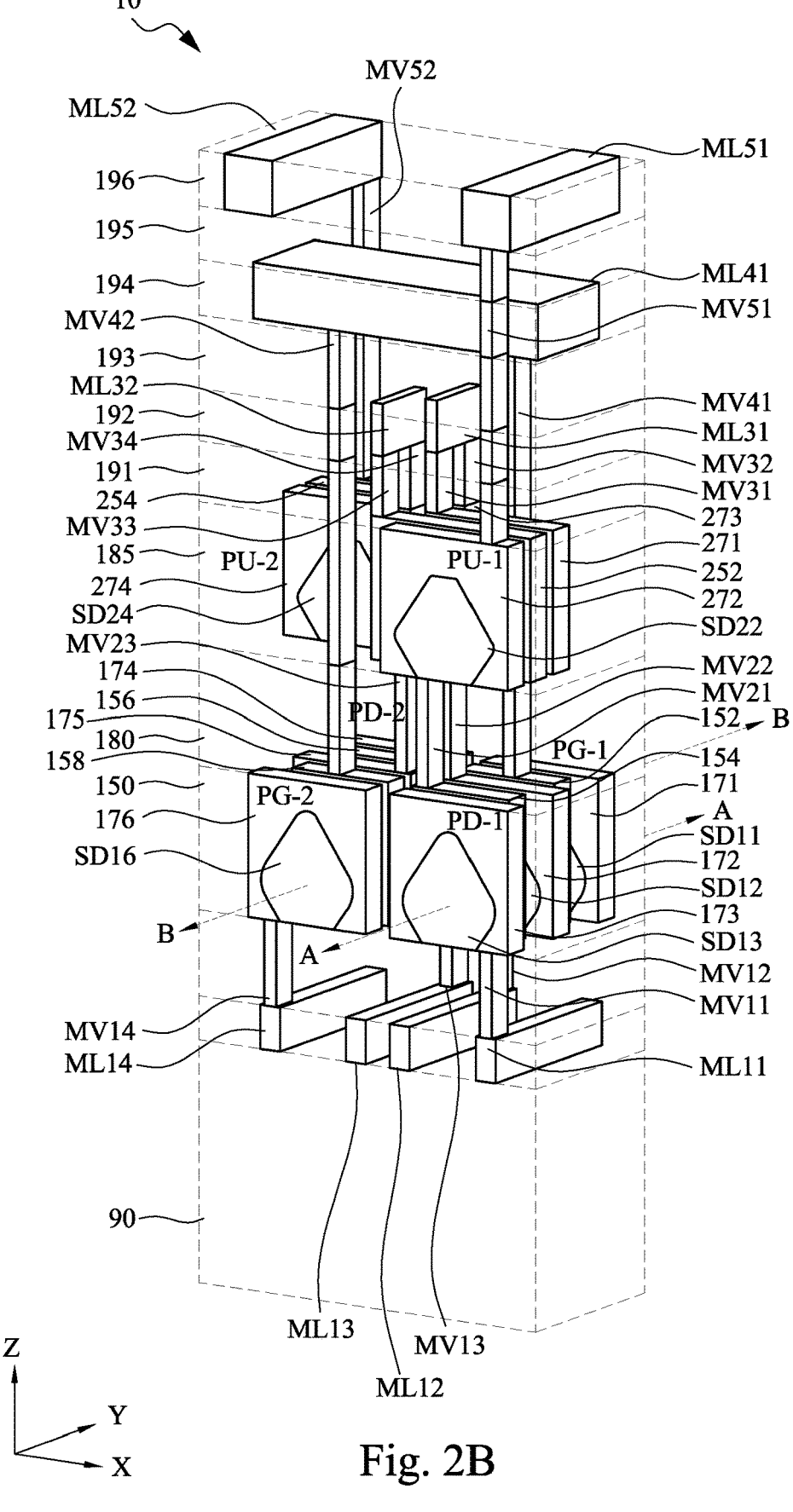
Figure 2C:
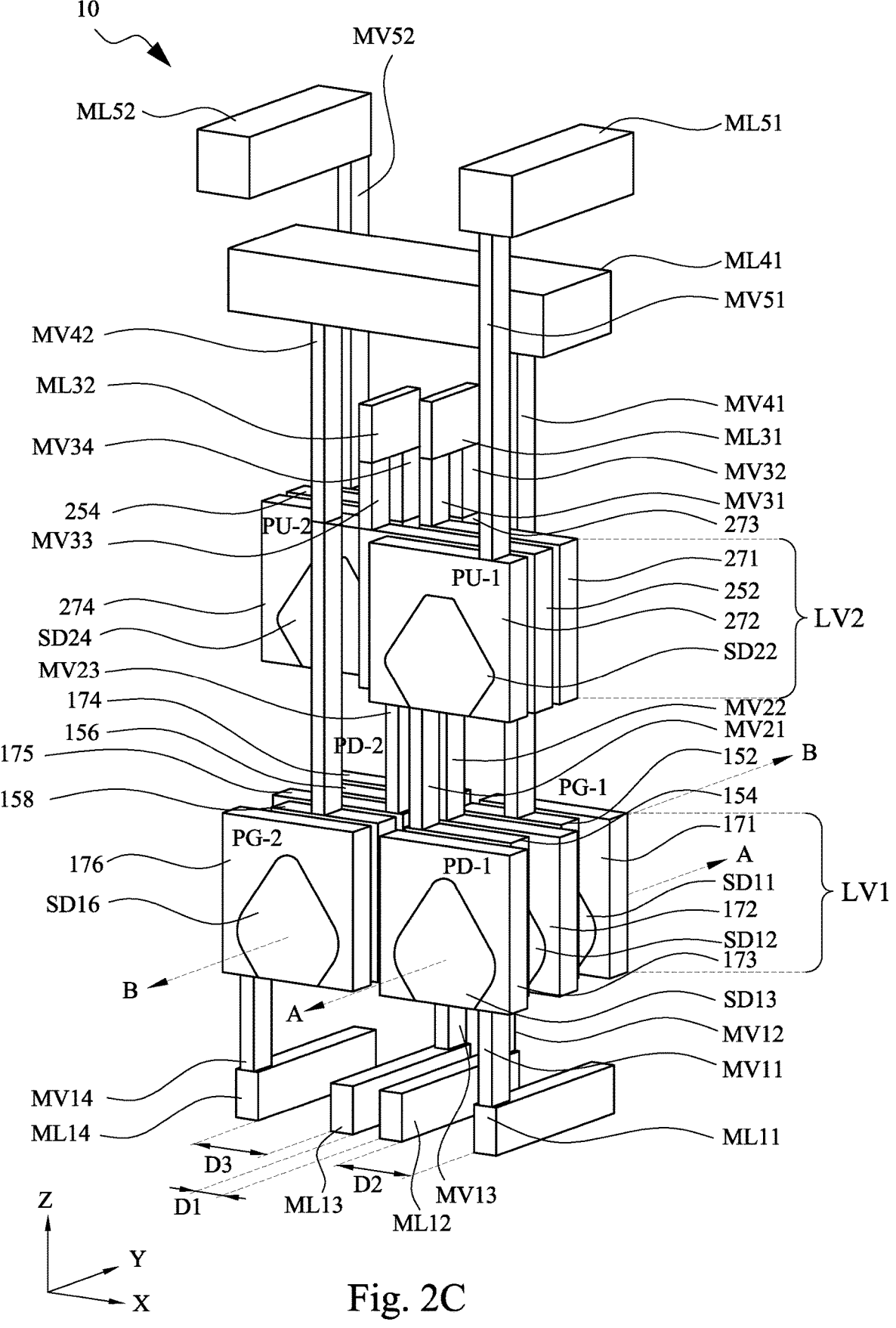
Figure 2D:
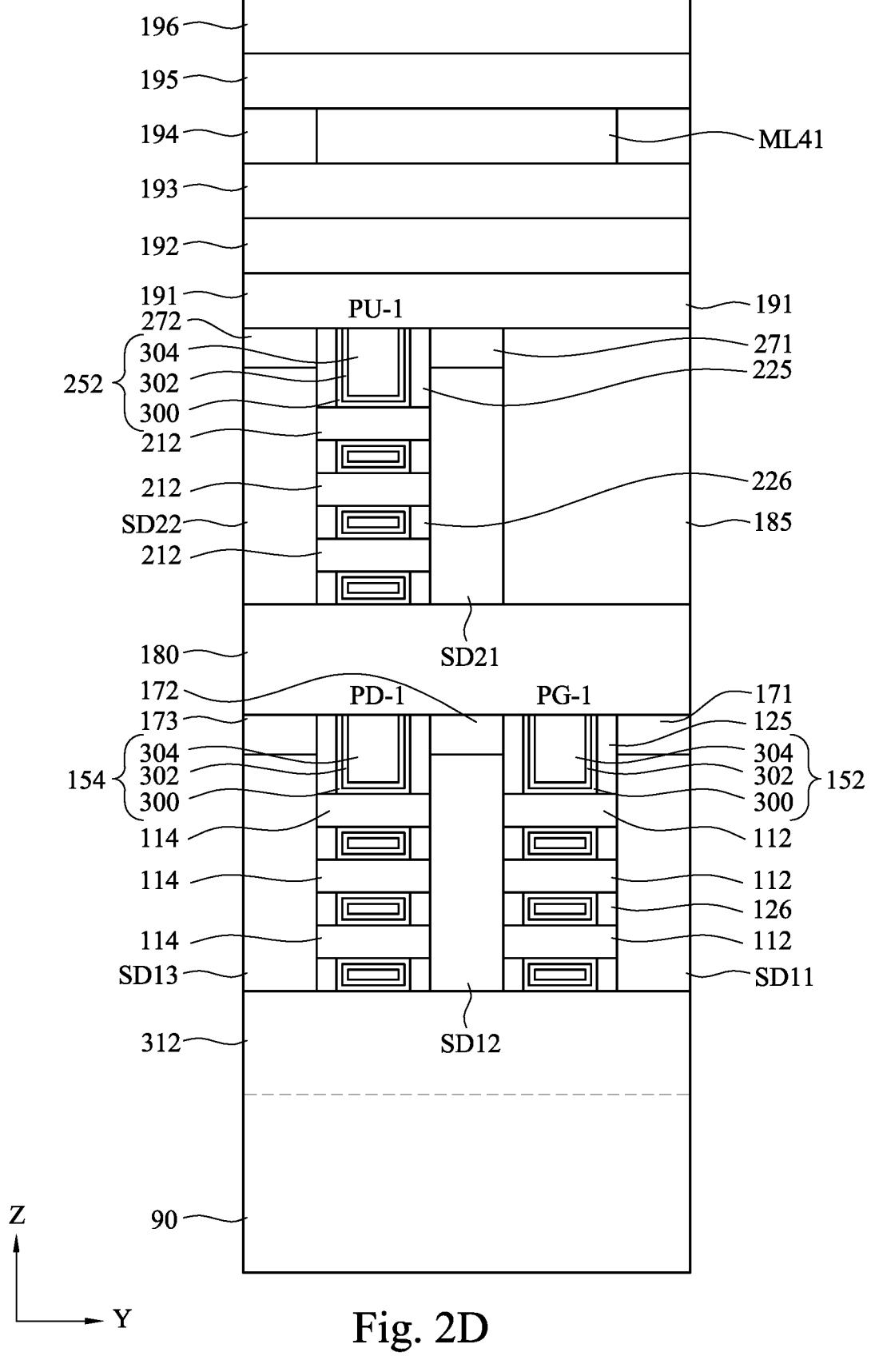
FIGS. 2D and 2E are cross-sectional views of an SRAM device according to some embodiments of the present disclosure.
Figure 2E:
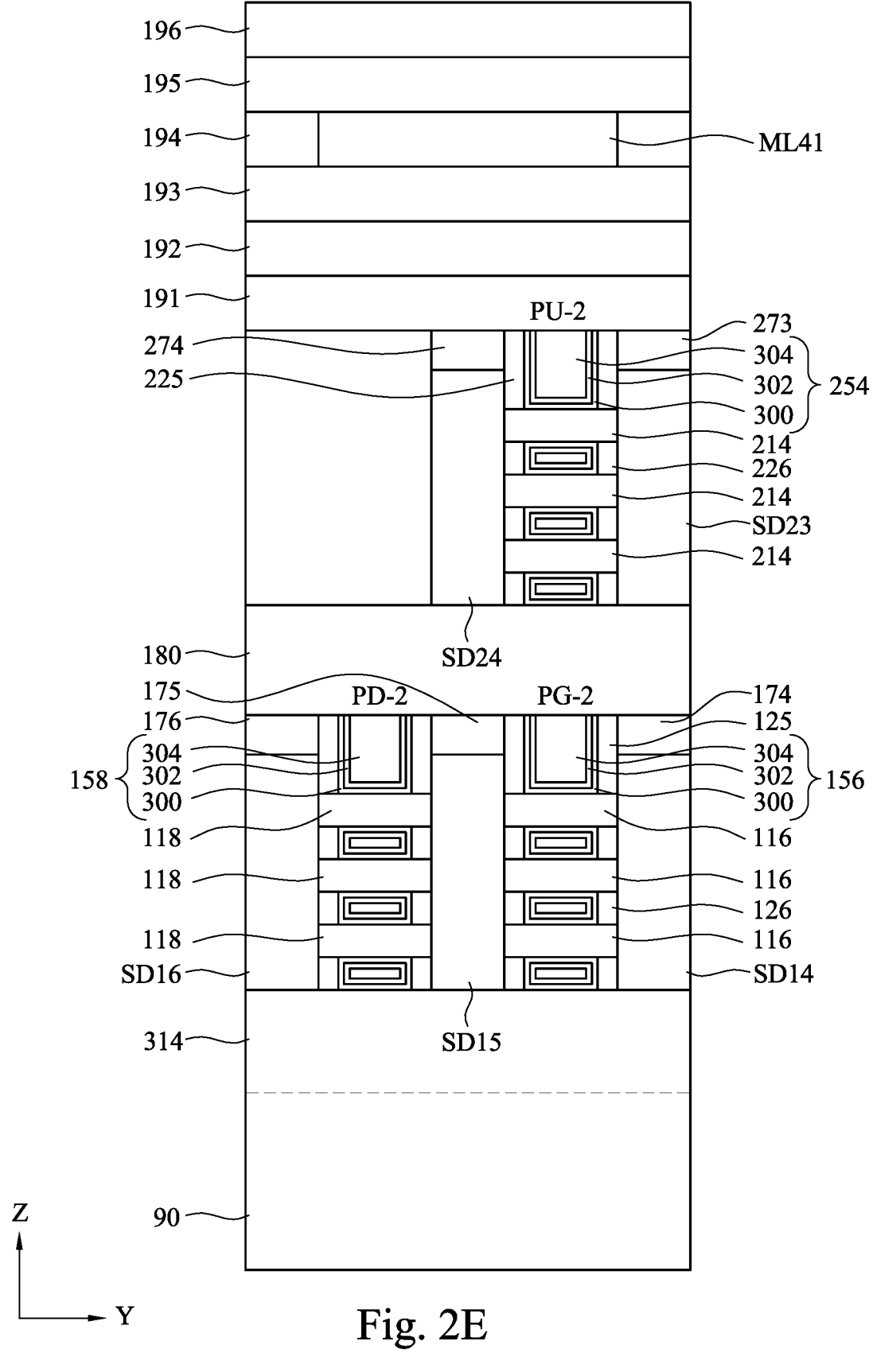

FIGS. 2A, 2B, and 2C are perspective views of an SRAM device according to some embodiments of the present disclosure. FIGS. 2D and 2E are cross-sectional views of an SRAM device according to some embodiments of the present disclosure. In greater detail, FIG. 2C is the perspective view by removing non-conductive elements in the perspective view of FIG. 2A. FIGS. 2D and 2E are cross-sectional views along line A-A and B-B of FIGS. 2A, respectively.

Shown there is an SRAM device 10. The SRAM device 10 includes a substrate 90. The substrate 90 may be made of silicon or other semiconductor materials. Alternatively or additionally, the substrate 90 may include other elementary semiconductor materials such as germanium. In some embodiments, the substrate 90 is made of a compound semiconductor such as silicon carbide (SiC), gallium arsenic (GaAs), indium arsenide (InAs), or indium phosphide (InP). In some embodiments, the substrate 90 is made of an alloy semiconductor such as silicon germanium (SiGe), silicon germanium carbide (SiGeC), gallium arsenic phosphide (GaAsP), or gallium indium phosphide (GaInP). In some embodiments, the substrate 90 includes an epitaxial layer. For example, the substrate 90 has an epitaxial layer overlying a bulk semiconductor.

In some embodiments, the SRAM device 10 is a 6T-SRAM, in which an SRAM unit cell of the SRAM device 10 includes a pass-gate (PG-1) transistor, a pass-gate (PG-2) transistor, a pull-down (PD-1) transistor, a pull-down (PD-2) transistor, a pull-up (PU-1) transistor, and a pull-up (PU-2) transistor disposed over the substrate 90. In some embodiments, the PD-1, PD-2 transistors and the PG-1, PG-2 transistors are at a first level LV1. On the other hand, the PU-1 and PU-2 transistors are at a second level LV2 that is vertically above the first level LV1. That is, the PU-1 and PU-2 transistors are stacked over the PD-1, PD-2, PG-1, PG-2 transistors.

In greater detail, as shown in FIGS. 2B and 2C, the PG-1 and PD-1 transistors are arranged along the Y-direction, and the PG-2 and PD-2 transistors are arranged along the Y-direction. The PG-1 and PD-2 transistors are arranged along the X-direction, and the PG-2 and PD-1 transistors are arranged along the X-direction. As shown in FIGS. 2D and 2E, the PU-1 and PD-1 transistors are arranged along the Z-direction, and the PU-2 and PD-2 transistors are arranged along the Z-direction. In FIG. 2D, the PU-1 transistor may vertically overlap the PD-1 transistor along the Z-direction. As shown in FIG. 2E, the PU-2 transistor may vertically overlap the PD-2 transistor along the Z-direction.

In various embodiments, the PG-1, PG-2, PD-1, PD-2, PU-1, and PU-2 transistors are formed with a gate-all-around (GAA) configuration. That is, the channel regions of each of the PG-1, PG-2, PD-1, PD-2, PU-1, and PU-2 transistors may include a plurality of semiconductor channel layers arranged one above another, and each of the semiconductor channel layers is wrapped around by a respective gate structure.

For example, as shown in FIGS. 2D and 2E, the PG-1 transistor may include semiconductor channel layers 112 arranged one above another along the Z-direction. The PD-1 transistor may include semiconductor channel layers 114 arranged one above another along the Z-direction. The PD-2 transistor may include semiconductor channel layers 116 arranged one above another along the Z-direction. The PG-2 transistor may include semiconductor channel layers 118 arranged one above another along the Z-direction. The PU-1 transistor may include semiconductor channel layers 212 arranged one above another along the Z-direction. The PU-2 transistor may include semiconductor channel layers 214 arranged one above another along the Z-direction.

Each of the PG-1, PG-2, PD-1, PD-2, PU-1, and PU-2 transistors of the SRAM device 10 includes a gate structure. For example, the PG-1 transistor includes a gate structure 152 wrapping around each of the semiconductor channel layers 112. The PD-1 transistor includes a gate structure 154 wrapping around each of the semiconductor channel layers 114. The PD-2 transistor includes a gate structure 156 wrapping around each of the semiconductor channel layers 116. The PG-2 transistor includes a gate structure 158 wrapping around each of the semiconductor channel layers 118. The PU-1 transistor includes a gate structure 252 wrapping around each of the semiconductor channel layers 212. The PU-2 transistor includes a gate structure 254 wrapping around each of the semiconductor channel layers 214.

As shown in the cross-sectional view of FIGS. 2D and 2E, each of the gate structures 152, 154, 156, 158, 252, and 254 include a gate dielectric layer 300, a work function metal layer 302 over the gate dielectric layer 300, and a filling metal 304 over the work function metal layer 302. In some embodiments, the gate dielectric layer 300 includes one layer of high-k dielectric. In some other embodiments, the gate dielectric layer 300 includes multi-layer structure, such as an interfacial layer and a high-k dielectric material. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. Examples of interfacial layer include silicon oxide ($SiO_2$), silicon nitride (SiN), silicon oxynitride (SiON), hBN, aluminum oxide ($Al_2O_3$), other suitable dielectric material, and/or combinations thereof.

The work function metal layer 302 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The filling metal 304 may include tungsten (W), aluminum (Al), copper (Cu), or another suitable conductive material(s).

The SRAM device 10 further includes gate spacers 125 disposed on opposite sidewalls of each of the gate structures 152, 154, 156, and 158, and gate spacers 225 disposed on opposite sidewalls of each of the gate structures 252 and 254. In some embodiments, the gate spacers 125 and 225 may be formed by insulating dielectric material, such as a silicon nitride-based material. Examples of the silicon nitride-based material can be SiN, SiON, SiOCN or SiCN and combinations thereof.

The SRAM device 10 further includes inner spacers 126 vertically between two adjacent semiconductor channel layers 112, 114, 116, and 118, and inner spacers 226 vertically between two adjacent semiconductor channel layers 212 and 214. In some embodiments, the inner spacers 126 and 226 may be formed by insulating dielectric material, such as a silicon nitride-based material. Examples of the silicon nitride-based material can be SiN, SiON, SiOCN or SiCN and combinations thereof.

In various embodiments, each of the PG-1, PG-2, PD-1, PD-2, PU-1, and PU-2 transistors of the SRAM device 10 includes source/drain regions on opposite sides of their respective semiconductor channel layers and on opposite sides of their respective gate structures. For example, the PG-1 transistor includes source/drain epitaxy structures SD11 and SD12 on opposite sides of the gate structure 152, and in contact with opposite ends of each semiconductor channel layer 112. The PD-1 transistor includes source/drain epitaxy structures SD12 and SD13 on opposite sides of the gate structure 154, and in contact with opposite ends of each semiconductor channel layer 114. The PD-2 transistor includes source/drain epitaxy structures SD14 and SD15 on opposite sides of the gate structure 156, and in contact with opposite ends of each semiconductor channel layer 116. The PG-2 transistor includes source/drain epitaxy structures SD15 and SD16 on opposite sides of the gate structure 158, and in contact with opposite ends of each semiconductor channel layer 118. The PU-1 transistor includes source/drain epitaxy structures SD21 and SD22 on opposite sides of the gate structure 252, and in contact with opposite ends of each semiconductor channel layer 212. The PU-2 transistor includes source/drain epitaxy structures SD23 and SD24 on opposite sides of the gate structure 254, and in contact with opposite ends of each semiconductor channel layer 214. As shown in FIGS. 2D and 2E, the PG-1 and PD-1 transistors may share the same source/drain epitaxy structures SD12, and the PG-2 and PD-2 transistors may share the same source/drain epitaxy structures SD15.

The semiconductor channel layer 112, the gate structure 152, and the source/drain epitaxy structures SD11 and SD12 may collectively serve as the PG-1 transistor. The semiconductor channel layer 114, the gate structure 154, and the source/drain epitaxy structures SD12 and SD13 may collectively serve as the PD-1 transistor. The semiconductor channel layer 116, the gate structure 156, and the source/drain epitaxy structures SD14 and SD15 may collectively serve as the PD-2 transistor. The semiconductor channel layer 118, the gate structure 158, and the source/drain epitaxy structures SD15 and SD16 may collectively serve as the PG-2 transistor. The semiconductor channel layer 212, the gate structure 252, and the source/drain epitaxy structures SD21 and SD22 may collectively serve as the PU-1 transistor. The semiconductor channel layer 214, the gate structure 254, and the source/drain epitaxy structures SD23 and SD24 may collectively serve as the PU-2 transistor.

In some embodiments, the source/drain epitaxy structures SD11, SD12, SD13, SD14, SD15, and SD16 may include different conductivity types than the source/drain epitaxy structures SD21, SD22, SD23, and SD24. In some embodiments where the PD-1, PD-2, PG-1, and PG-2 transistors are n-type transistors and the PU-1 and PU-2 transistors are p-type transistors, the source/drain epitaxy structures SD11, SD12, SD13, SD14, SD15, and SD16 are n-type epitaxy structures, and the source/drain epitaxy structures SD21, SD22, SD23, and SD24 are p-type epitaxy structures. On the other hand, in some embodiments where the PD-1, PD-2, PG-1, and PG-2 transistors are p-type transistors and the PU-1 and PU-2 transistors are n-type transistors, the source/drain epitaxy structures SD11, SD12, SD13, SD14, SD15, and SD16 are p-type epitaxy structures, and the source/drain epitaxy structures SD21, SD22, SD23, and SD24 are n-type epitaxy structures. Examples of n-type dopants can be phosphorus (P), arsenic (As), or antimony (Sb), or the like. Examples of p-type dopants can be boron (B), gallium (Ga), indium (In), aluminium (Al), or the like. In some embodiments, the source/drain epitaxy structures SD11, SD12, SD13, SD14, SD15, SD16, SD21, SD22, SD23, and SD24 may include Si, SiGe, Ge, III-V materials, or the like. In some embodiments, the source/drain epitaxy structures SD11, SD12, SD13, SD14, SD15, SD16, SD21, SD22, SD23, and SD24 may include epitaxial material for N-type device (e.g., NFET), such as SiP, SiAs, SiC, or the like. On the other hand, the source/drain epitaxy structures SD11, SD12, SD13, SD14, SD15, SD16, SD21, SD22, SD23, and SD24 may include epitaxial material for P-type device (e.g., PFET), such as SiGeB, SiCB, GeSn (e.g., $Ge_{0.9}Sn_{0.1}$), or the like.

The SRAM device 10 further includes source/drain contacts 171, 172, 173, 174, 175, 176, 177, 176, 271, 272, 273, and 274 that cover the respective source/drain epitaxy structures SD11, SD12, SD13, SD14, SD15, SD16, SD21, SD22, SD23, and SD24. In some embodiments, the source/drain contacts 171, 172, 173, 174, 175, 176, 177, 176, 271, 272, 273, and 274 may made of conductive material, such as metal. The conductive material may include one or more layers of Co, Ni, W, Ti, Ta, Cu, Al, TiN and TaN, or any other suitable material.

As shown in FIGS. 2B and 2C, the SRAM device 10 further includes metal lines ML11, ML12, ML13, and ML14. In some embodiments, the metal lines ML11, ML12, ML13, and ML14 are disposed over the substrate 90 and arranged along the X direction. In some embodiments, the metal lines ML11, ML12, ML13, and ML14 each includes a lengthwise direction extending along the Y-direction. The metal lines ML11, ML12, ML13, and ML14 are at a level that is below the PD-1, PD-2, PG-1, PG-2 transistors.

In some embodiments, each of the metal lines ML11, ML12, ML13, and ML14 may include a width (along the X-direction) in a range from about 1 nm to about 1 μm, a length (along the Y-direction) in a range from about 100 nm to about 20 μm, and a thickness (along the Z-direction) in a range from about 1 nm to about 1 μm.

The SRAM device 10 further includes metal vias MV11, MV12, MV13, and MV14. In some embodiments, when viewed from above (see FIG. 13), the metal via MV11 is aligned at least in part with the metal via MV14 along the X direction. The metal via MV12 is aligned at least in part with the metal via MV13 along the X direction.

In some embodiments, the metal via MV11 is in contact with bottom surface of the source/drain contact 173 that covers the source/drain epitaxy structure SD13 and top surface of the metal line ML11. That is, the metal line ML11 is electrically connected to the source/drain epitaxy structure SD13 of the PD-1 transistor.

In some embodiments, the metal via MV12 is in contact with bottom surface of the source/drain contact 171 that covers the source/drain epitaxy structure SD11 and top surface of the metal line ML12. That is, the metal line ML12 is electrically connected to the source/drain epitaxy structure SD11 of the PG-1 transistor.

In some embodiments, the metal via MV13 is in contact with bottom surface of the source/drain contact 174 that covers the source/drain epitaxy structure SD14 and top surface of the metal line ML13. That is, the metal line ML13 is electrically connected to the source/drain epitaxy structure SD14 of the PD-2 transistor.

In some embodiments, the metal via MV14 is in contact with bottom surface of the source/drain contact 176 that covers the source/drain epitaxy structure SD16 and top surface of the metal line ML14. That is, the metal line ML14 is electrically connected to the source/drain epitaxy structure SD16 of the PG-2 transistor.

In some embodiments where the PU-1, PU-2 transistors are p-type transistors and the PD-1, PD-2, PG-1, PG-2 transistors are n-type transistors, the metal lines ML11 and ML13 may collectively serve as the power line VSS (see FIG. 1) of the SRAM device 10. Stated another way, the metal lines ML11 and ML13 can be regarded as first and second portions of the power line VSS. The metal line ML12 may act as the bit line BL (see FIG. 1) of the SRAM device 10, and the metal line ML14 may act as the bit line BLB (see FIG. 1) of the SRAM device 10. Alternatively, the metal line ML12 may act as the bit line BLB of the SRAM device 10, and the metal line ML14 may act as the bit line BL of the SRAM device 10.

In some embodiments where the PU-1, PU-2 transistors are n-type transistors and the PD-1, PD-2, PG-1, PG-2 transistors are p-type transistors, the metal lines ML11 and ML13 may collectively serve as the power line VDD of the SRAM device 10. Stated another way, the metal lines ML11 and ML13 can be regarded as first and second portions of the power line VDD. The metal line ML12 may act as the bit line BL of the SRAM device 10, and the metal line ML14 may act as the bit line BLB of the SRAM device 10. Alternatively, the metal line ML12 may act as the bit line BLB of the SRAM device 10, and the metal line ML14 may act as the bit line BL of the SRAM device 10.

The SRAM device 10 further includes metal vias MV21, MV22, and MV23. In some embodiments, the metal vias MV21, MV22, and MV23 are at a level that is vertically between the first level LV1 of the PD-1, PD-2, PG-1, PG-2 transistors and the second level LV2 of the PU-1, PU-2 transistors. In some embodiments, the metal via MV21 is in contact with top surface of the gate structure 154 and bottom surface of the gate structure 252. That is, the gate structure 154 of the PD-1 transistor is electrically connected to the gate structure 252 of the PU-1 transistor.

In some embodiments, the metal via MV22 is in contact with top surface of the source/drain contact 172 that covers the source/drain epitaxy structure SD12 and bottom surface of the source/drain contact 271 that covers the source/drain epitaxy structure SD21. That is, the source/drain epitaxy structure SD12 of the PD-1 and PG-1 transistors is electrically connected to the source/drain epitaxy structure SD21 of the PU-1 transistor.

In some embodiments, the metal via MV23 is in contact with top surface of the source/drain contact 175 that covers the source/drain epitaxy structure SD15 and bottom surface of the source/drain contact 274 that covers the source/drain epitaxy structure SD24. That is, the source/drain epitaxy structure SD15 of the PD-2 and PG-2 transistors is electrically connected to the source/drain epitaxy structure SD24 of the PU-2 transistor.

In some embodiments, there is also a metal via MV24 (see FIG. 19, not shown in FIGS. 2B and 2C as being hidden by the metal vias MV21, MV22, and MV23) that is in contact with top surface of the gate structure 156 and bottom surface of the gate structure 254. That is, the gate structure 156 of the PD-2 transistor is electrically connected to the gate structure 254 of the PU-2 transistor.

The SRAM device 10 further includes metal vias MV31, MV32, MV33, and MV34, and metal lines ML31 and ML32. In some embodiments, the metal vias MV31, MV32, MV33, and MV34, and metal lines ML31 and ML32 are at a level that is vertically above the second level LV2 of the PU-1, PU-2 transistors. In some embodiments, the metal via MV31 is in contact with top surface of the source/drain contact 271 that covers the source/drain epitaxy structure SD21 and bottom surface of the metal line ML31. The metal via MV32 is in contact with top surface of the gate structure 254 and bottom surface of the metal line ML31. Accordingly, the source/drain epitaxy structure SD21 of the PU-1 transistor is electrically connected to the gate structure 254 of the PU-2 transistor.

In some embodiments, the metal via MV33 is in contact with top surface of the gate structure 252 and bottom surface of the metal line ML32. The metal via MV34 is in contact with top surface of the source/drain contact 274 that covers the source/drain epitaxy structure SD24 and bottom surface of the metal line ML32. Accordingly, the source/drain epitaxy structure SD24 of the PU-2 transistor is electrically connected to the gate structure 252 of the PU-1 transistor.

The SRAM device 10 further includes a metal line ML41 and metal vias MV41 and MV42. In some embodiments, the metal line ML41 is at a level that is vertically above the second level LV2 of the PU-1, PU-2 transistors, and above the metal lines ML31 and ML32. In some embodiments, the metal via MV41 is in contact with top surface of the gate structure 152 and bottom surface of the metal line ML41. Accordingly, the gate structure 152 of the PG-1 transistor is electrically connected to the metal line ML41. In some embodiments, the metal via MV42 is in contact with top surface of the gate structure 158 and bottom surface of the metal line ML41. Accordingly, the gate structure 158 of the PG-2 transistor is electrically connected to the metal line ML41.

In some embodiments, the metal line ML41 may serve as word line WL (see FIG. 1) of the SRAM device 10. Accordingly, the gate structure 152 of the PG-1 transistor and the gate structure 158 of the PG-2 transistor are electrically connected to the word line WL.

The SRAM device 10 further includes metal lines ML51 and ML52, and metal vias MV51 and MV52. In some embodiments, the metal lines ML51 and ML52 are at a level that is vertically above the second level LV2 of the PU-1, PU-2 transistors, and above the metal lines ML41 and ML42. In some embodiments, the metal via MV51 is in contact with top surface of the source/drain contact 272 that covers the source/drain epitaxy structure SD22 and bottom surface of the metal line ML51. Accordingly, the source/drain epitaxy structure SD22 of the PU-1 transistor is electrically connected to the metal line ML51.

In some embodiments, the metal via MV52 is in contact with top surface of the source/drain contact 273 that covers the source/drain epitaxy structure SD23 and bottom surface of the metal line ML52. Accordingly, the source/drain epitaxy structure SD23 of the PU-2 transistor is electrically connected to the metal line ML52.

In some embodiments where the PU-1, PU-2 transistors are p-type transistors and the PD-1, PD-2, PG-1, PG-2 transistors are n-type transistors, the metal lines ML51 and ML52 may collectively serve as the power line VDD (see FIG. 1) of the SRAM device 10. Stated another way, the metal lines ML51 and ML52 can be regarded as first and second portions of the power line VDD.

In some embodiments where the PU-1, PU-2 transistors are n-type transistors and the PD-1, PD-2, PG-1, PG-2 transistors are p-type transistors, the metal lines ML51 and ML52 may collectively serve as the power line VSS of the SRAM device 10. Stated another way, the metal lines ML51 and ML52 can be regarded as first and second portions of the power line VSS.

The SRAM device 10 further includes semiconductor strips 312 and 314 protruding over the substrate 90. In some embodiments, the semiconductor strips 312 and 314 may include the same material as the substrate 90. For example, the semiconductor strips 312 and 314 may be made of silicon (Si), or other suitable semiconductor materials. In some embodiments, each of the semiconductor strips 312 and 314 extends along the Y-direction. The PG-1 and PD-1 transistors are disposed over the semiconductor strip 312, and the PG-2 and PD-2 transistors are disposed over the semiconductor strip 314.

In some embodiments, top surfaces of the metal lines ML11, ML12, ML13, and ML14 are below top surfaces of the semiconductor strips 312 and 314. The metal lines ML11 and ML12 are disposed on opposite sides of the semiconductor strip 312, and the metal lines ML13 and ML14 are disposed on opposite sides of the semiconductor strip 314. In some embodiments, the metal lines ML12 and ML13 are between the semiconductor strips 312 and 314.

As shown in FIG. 2C, along the X-direction, the distance D1 between the metal lines ML12 and ML13 is less than the distance D2 between the metal lines ML11 and ML12, and is less than the distance D3 between the metal lines ML13 and ML14. This is because there is no semiconductor strip between the metal lines ML12 and ML13 (see FIG. 2A).

With respect to the metal line ML11 and the metal via MV11 (see FIG. 2A), the SRAM device 10 further includes a liner 321 lining sidewalls of the metal line ML11 and lining opposite sides of the metal via MV11. In some embodiments, the liner 321 may further extend to top surface of the metal line ML11. The SRAM device 10 further includes a dielectric material 331 in contact with sidewalls of the metal via MV11. In some embodiments, the dielectric material 331 is separated from the metal line ML11 through the liner 321.

With respect to the metal line ML12 and the metal via MV12 (see FIGS. 2A and 2B), the SRAM device 10 further includes a liner 322 lining sidewalls of the metal line ML12 and lining opposite sides of the metal via MV12 (not shown in FIG. 2A as being hidden). In some embodiments, the liner 322 may further extend to top surface of the metal line ML12. The SRAM device 10 further includes a dielectric material 332 in contact with sidewalls of the metal via MV12 (not shown in FIG. 2A as being hidden). In some embodiments, the dielectric material 332 is separated from the metal line ML12 through the liner 322.

With respect to the metal line ML13 and the metal via MV13 (see FIGS. 2A and 2B), the SRAM device 10 further includes a liner 323 lining sidewalls of the metal line ML13 and lining opposite sides of the metal via MV13 (not shown in FIG. 2A as being hidden). In some embodiments, the liner 323 may further extend to top surface of the metal line ML13. The SRAM device 10 further includes a dielectric material 333 in contact with sidewalls of the metal via MV13 (not shown in FIG. 2A as being hidden). In some embodiments, the dielectric material 333 is separated from the metal line ML13 through the liner 323.

With respect to the metal line ML14 and the metal via MV14 (see FIGS. 2A and 2B), the SRAM device 10 further includes a liner 324 lining sidewalls of the metal line ML14 and lining opposite sides of the metal via MV14. In some embodiments, the liner 324 may further extend to top surface of the metal line ML14. The SRAM device 10 further includes a dielectric material 334 in contact with sidewalls of the metal via MV14 (not shown in FIG. 2A as being hidden). In some embodiments, the dielectric material 334 is separated from the metal line ML14 through the liner 324.

The SRAM device 10 further includes isolation structures 315 and 316 over the substrate 90 and adjacent to the semiconductor strips 312 and 314. In greater detail, the isolation structure 315 is adjacent to the semiconductor strip 312, in which the metal lines ML11 is between the semiconductor strip 312 and the isolation structure 315. In some embodiments, the liner 321 is also in contact with the semiconductor strip 312, the isolation structure 315, and top surface of the substrate 90. Similarly, the isolation structure 316 is adjacent the semiconductor strip 314, in which the metal lines ML14 is between the semiconductor strip 314 and the isolation structure 316. In some embodiments, the liner 324 is also in contact with the semiconductor strip 314, the isolation structure 316, and top surface of the substrate 90.

In some embodiments, the liner 322 is in contact with the semiconductor strip 312, the liner 323, and top surface of the substrate 90. The liner 323 is in contact with the semiconductor strip 314, the liner 322, and top surface of the substrate 90.

The liners 321, 322, 323, and 324 may be made of suitable dielectric material. For example, the liners 321, 322, 323, and 324 may be made of silicon nitride. The dielectric materials 331, 332, 333, and 334 may be made of suitable dielectric material. For example, the dielectric materials 331, 332, 333, and 334 may be made of silicon oxide. The isolation structures 315 and 316 may be shallow trench isolation (STI) structures, suitable isolation structures, combinations of the foregoing, or the like. In some embodiments, the isolation structures 315 and 316 may be made of oxide (e.g., silicon oxide), nitride (e.g., silicon nitride), or combinations thereof. In some embodiments, the isolation structures 315 and 316 are made of a same material as the dielectric materials 331, 332, 333, and 334.

The SRAM device further includes an interlayer dielectric (ILD) layer 150 laterally surrounding the PD-1, PG-1, PD-2, and PG-2 transistors. The SRAM device further includes a semiconductor layer 180 disposed over the ILD layer 150.

The SRAM device further includes an interlayer dielectric (ILD) layer 185 disposed over the semiconductor layer 180 and laterally surrounding the PU-1 and PU-2 transistors. The SRAM device further includes inter-metal dielectric (IMD) layers 191, 192, 193, 194, 195, and 196.

In some embodiments, the metal vias MV21, MV22, MV23, and MV24 are disposed in the semiconductor layer 180. The metal vias MV31, MV32, MV33, and MV34 are disposed in the IMD layer 191. The metal lines ML31 and ML32 are disposed in the IMD layer 192. The metal lines ML41 are disposed in the IMD layer 194. The metal lines ML51 and ML52 are disposed in the IMD layer 196. The metal vias MV41 and MV42 are disposed in the semiconductor layer 180 and the IMD layers 191, 192, 193, and 194. The metal vias MV51 and MV52 are disposed in the IMD layers 191, 192, 193, 194, and 195.

In some embodiments, the ILD layers 150 and 185, and the IMD layers 191, 192, 193, 194, 195, and 196 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

In some embodiments, the metal lines and metal vias described above may be made of suitable conductive material, such as metal. In some embodiments, the conductive material may include Pt, Ti, TiN, Al, W, WN, Ru, RuO, Ta, Ni, Co, Cu, Ag, Au, or the like.

FIGS. 3 to 31 illustrate a method in various stages of forming an SRAM device in accordance with some embodiments of the present disclosure.

Figure 3:
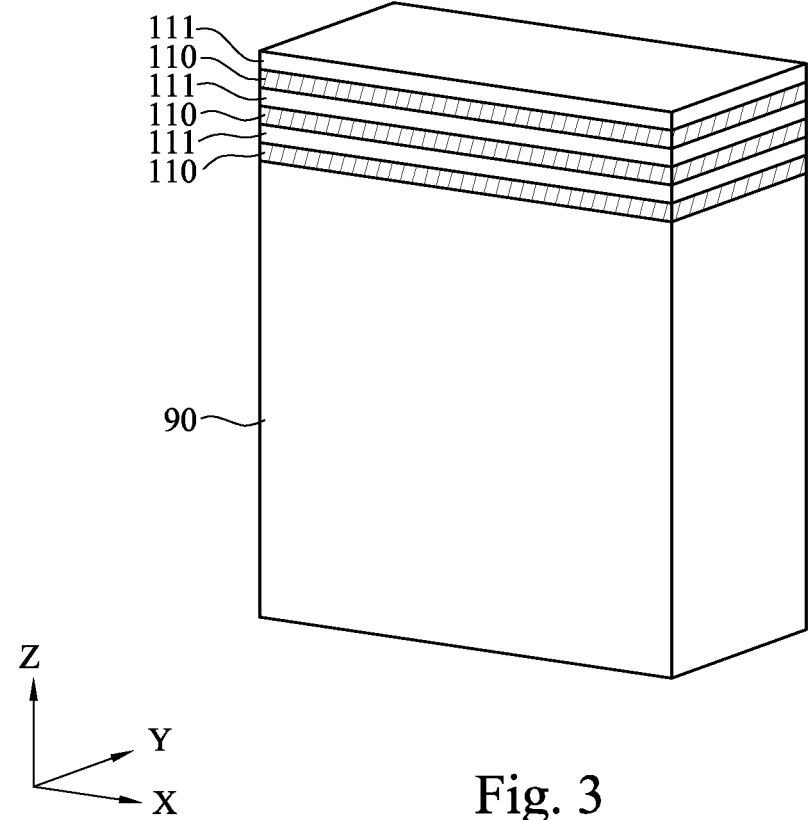
FIGS. 3 to 31 illustrate a method in various stages of forming an SRAM device in accordance with some embodiments of the present disclosure.

Reference is made to FIG. 3. A substrate 90 is provided. Then, semiconductor layers 110 and semiconductor layers 111 are alternately deposited over the substrate 90. In some embodiments, the semiconductor layers 110 are made from SiGe. For example, the germanium percentage (atomic percentage concentration) of the semiconductor layers 110 is in the range between about 10 percent and about 50 percent, while higher or lower germanium percentages may be used. It is appreciated, however, that the values recited throughout the description are examples, and may be changed to different values. For example, the semiconductor layers 110 may vary from $Si_{0.5}Ge_{0.5}$ to $Si_{0.9}Ge_{0.1}$, in which the proportion between Si and Ge may vary from embodiments, and the disclosure is not limited thereto. In some embodiments, the semiconductor layers 111 may be a pure silicon layer that is free of germanium. The semiconductor layers 111 may also be substantially pure silicon layer, for example, with a germanium percentage lower than about 1 percent. In some embodiments, the semiconductor layers 110 and 111 may be deposited over the substrate 90 using suitable deposition process, such as chemical vapor deposition (CVD), molecular beam epitaxy (MBE), or other suitable process(es).

Figure 4A:
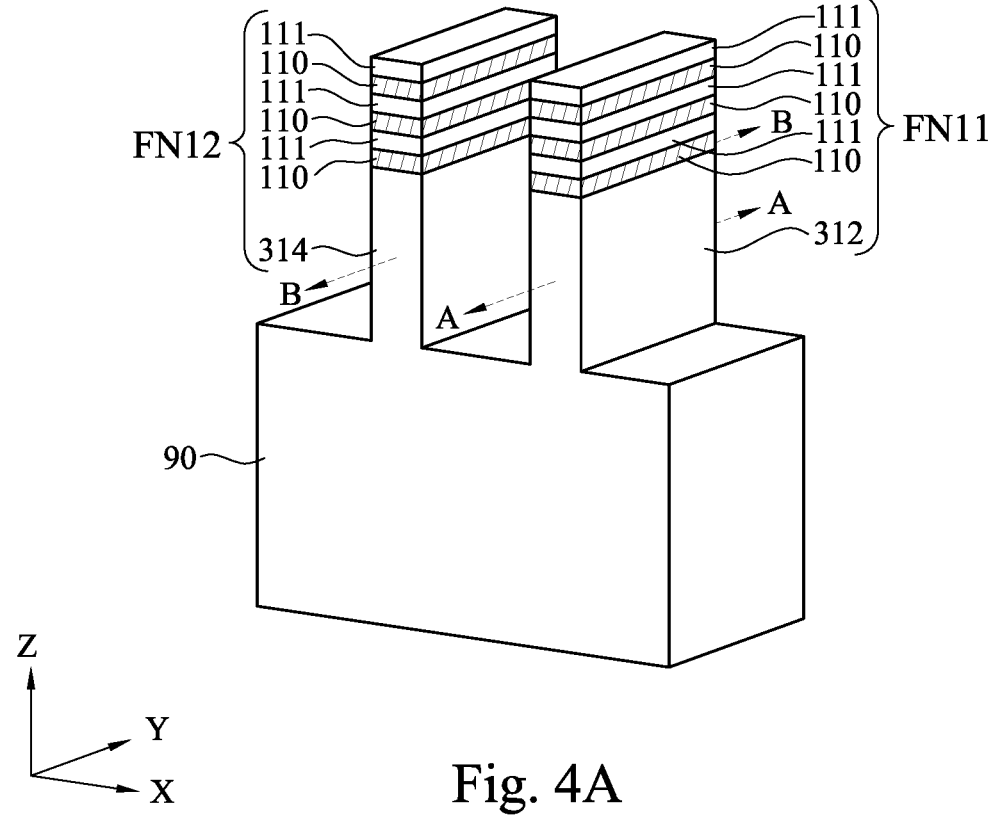
Figure 4B:
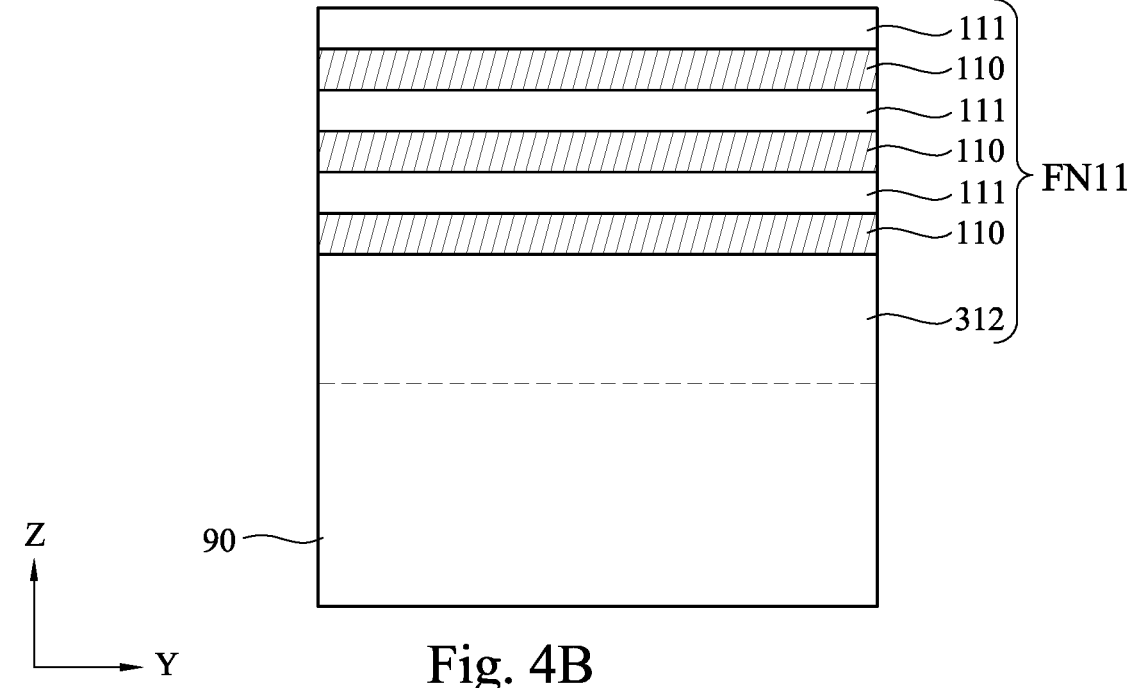
Figure 4C:
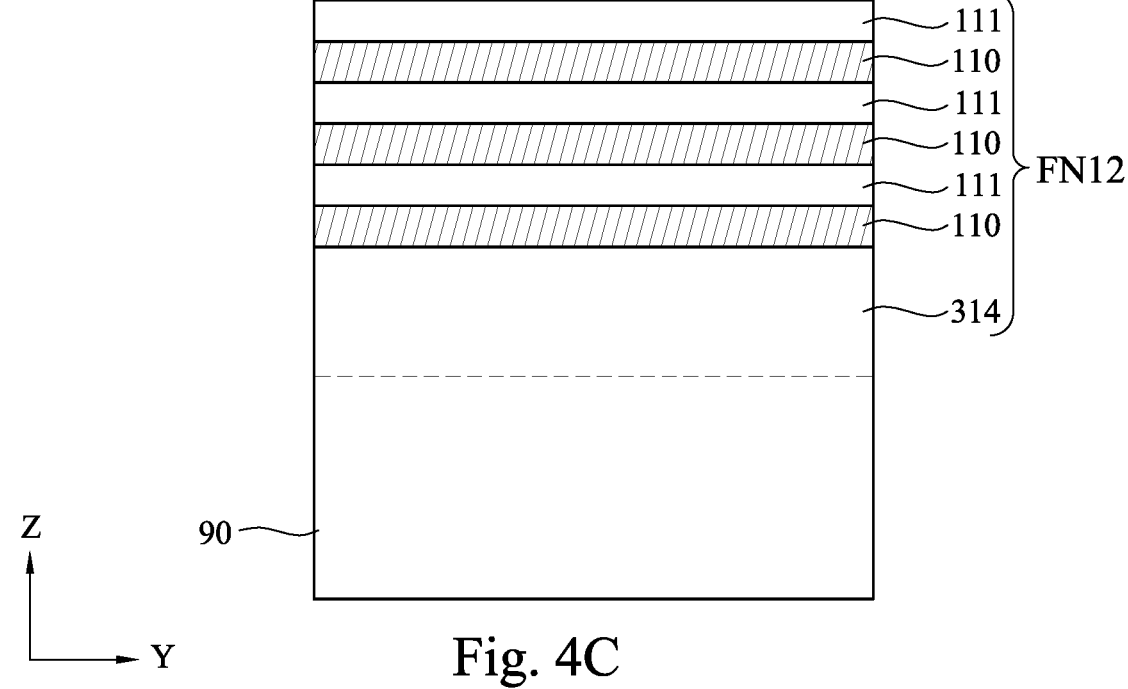

Reference is made to FIGS. 4A, 4B, and 4C, in which FIGS. 4B and 4C are cross-sectional views along lines B-B and C-C of FIG. 4A, respectively. The semiconductor layers 110 and 111, and the substrate 90 are patterned to form fin structures FN11 and FN12. In some embodiments, the fin structure FN11 includes a semiconductor strip 312 and a stack of semiconductor layers 110 and 111 over the semiconductor strip 312. The fin structure FN12 includes a semiconductor strip 314 and a stack of semiconductor layers 110 and 111 over the semiconductor strip 314. In some embodiments, the semiconductor layers 110 and 111, and the substrate 90 may be patterned by, for example, forming a patterned mask over the stack of the semiconductor layers 110 and 111, which defines the patterns of the fin structures FN11 and FN12, and then performing an etching process to remove unwanted portions of the semiconductor layers 110 and 111, and the substrate 90. Trenches are formed in the substrate 90 as a result of the patterning process, and the semiconductor strips 312 and 314 are formed between two adjacent trenches.

Figure 5:
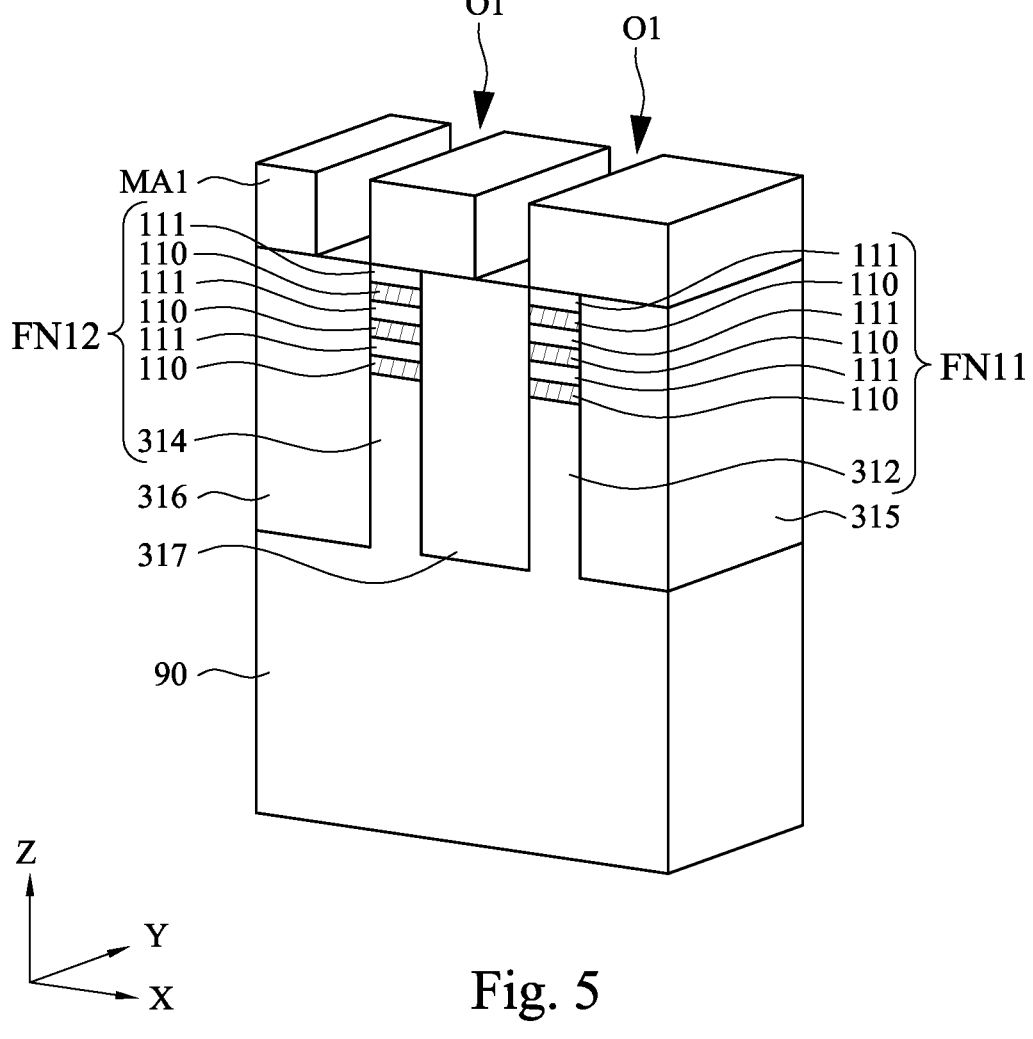

Reference is made to FIG. 5. Isolation structures 315, 316, and 317 are formed over the substrate 90 and laterally surrounding the fin structures FN11 and FN12. In greater detail, the fin structure FN11 is between the isolation structures 315 and 317, and the fin structure FN12 is between isolation structures 316 and 317. The isolation structures 315, 316, and 317 may be formed by, for example, depositing a dielectric material over the substrate 90 and filling the spaces outside the fin structures FN11 and FN12, and then performing a planarization process (e.g., a chemical mechanical polishing; CMP) to remove excess dielectric material until the topmost one of the semiconductor layers 110 is exposed.

Afterward, a patterned mask MA1 is formed over the substrate 90. The patterned mask MA1 includes openings O1 that expose portions of the isolation structures 316 and 317. In some embodiments, the fin structures FN11, FN12 and the isolation structure 315 are covered by the patterned mask MA1. In some embodiments, the patterned mask MA1 may be photoresist.

Figure 6:
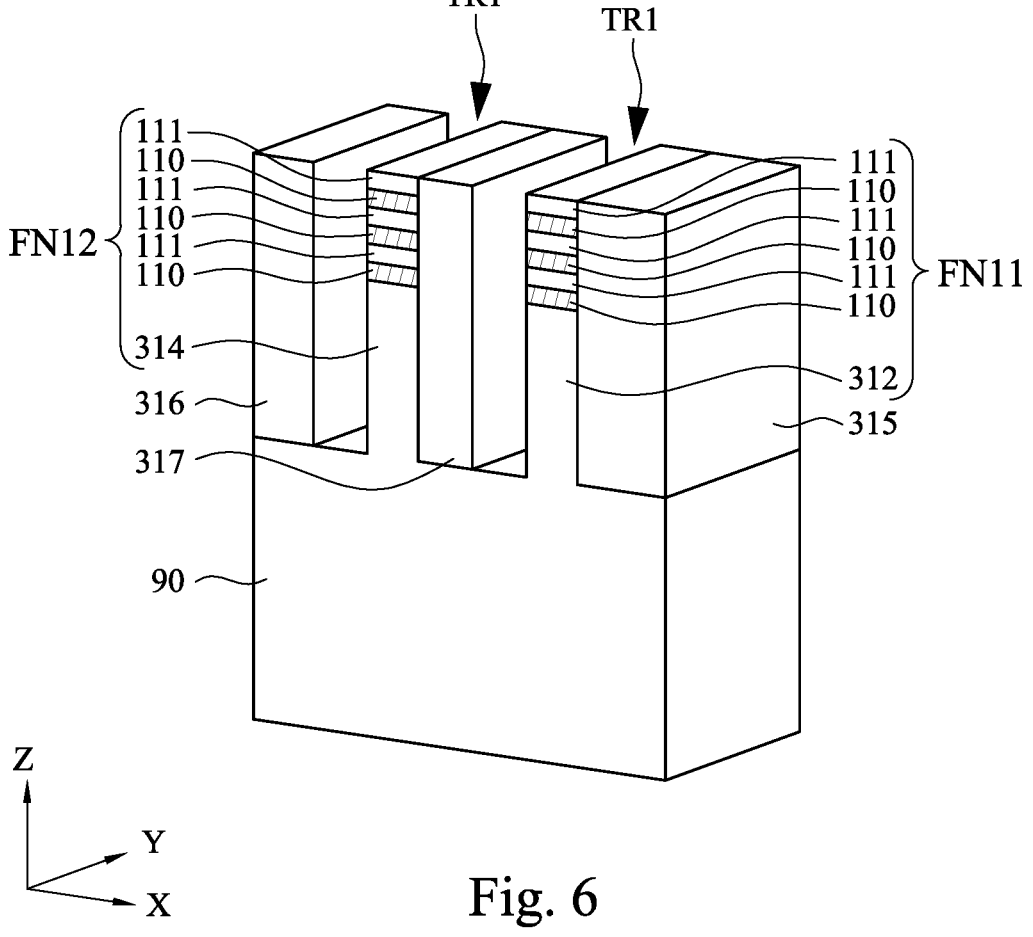

Reference is made to FIG. 6. An etching process is performed to remove the exposed portions of the isolation structures 316 and 317, so as to form trenches TR1. After the trenches are formed. The patterned mask MA1 is removed.

Figure 7:
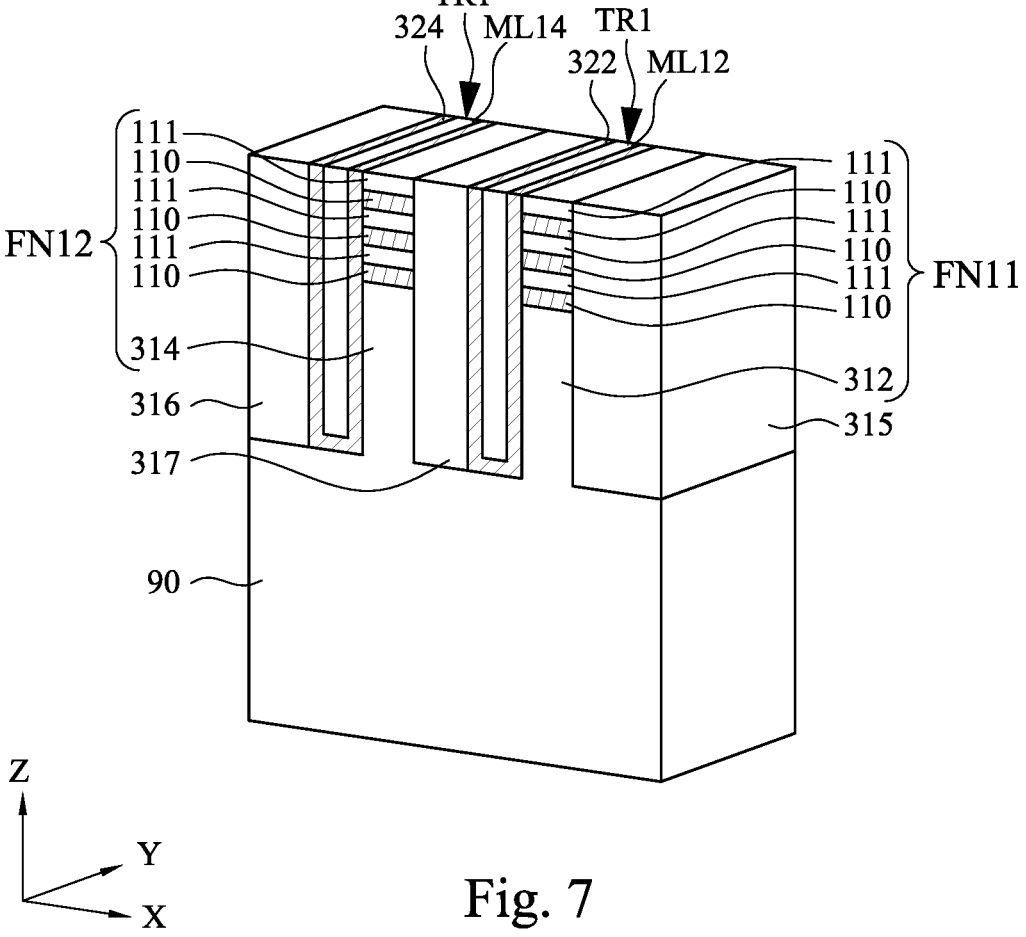

Reference is made to FIG. 7. Metal lines ML12 and ML14 are formed in the trenches TR1, and liners 322 and 324 are formed lining the metal lines ML12 and ML14, respectively. In some embodiments, a liner material (e.g., a dielectric material) is deposited lining the trenches TR1, a conductive material is then deposited over the liner material, and a planarization process (e.g., CMP) is performed to remove excess liner material and excess conductive material until the topmost one of the semiconductor layers 110 is exposed. Accordingly, the metal lines ML12 and ML14 and the liners 322 and 324 are formed.

Figure 8:
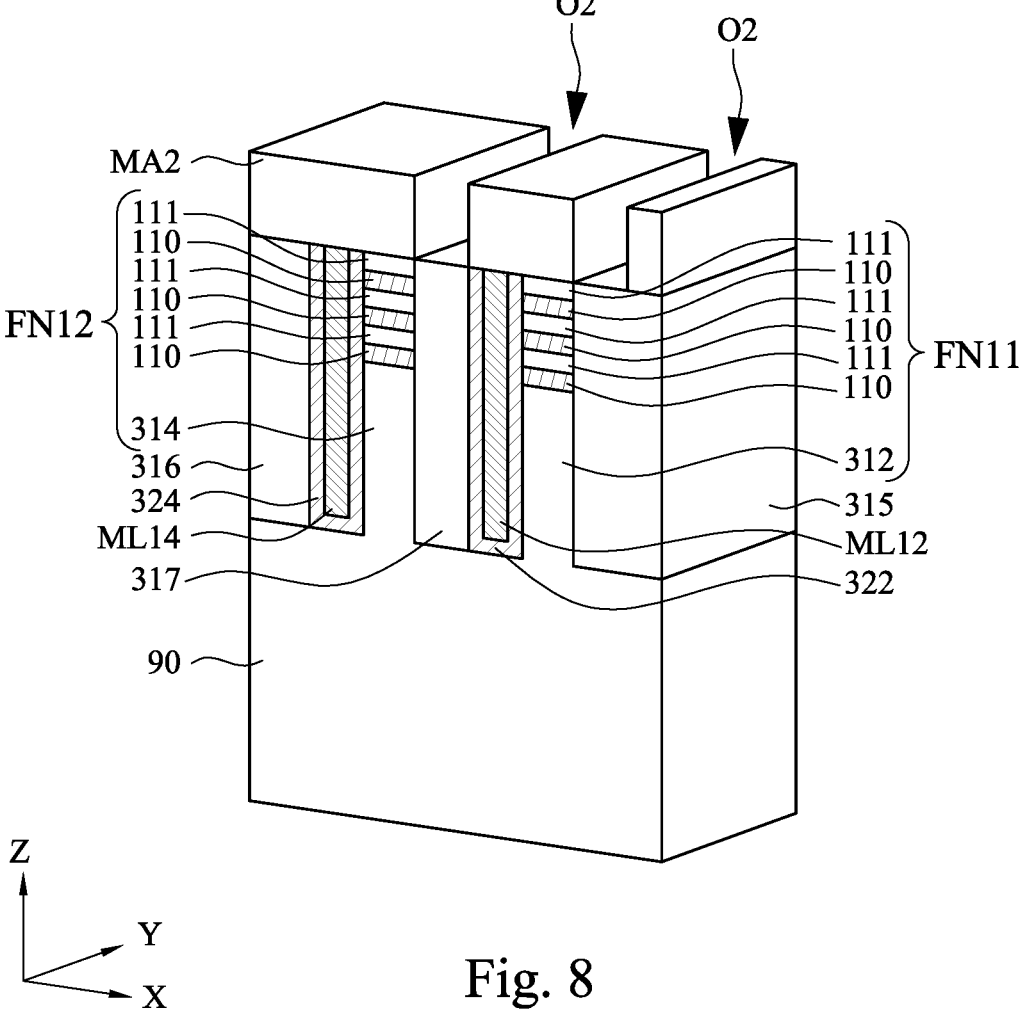

Reference is made to FIG. 8. A patterned mask MA2 is formed over the substrate 90. The patterned mask MA2 includes openings O2 that expose portions of the isolation structures 315 and 317. In some embodiments, the fin structures FN1, FN2, the isolation structure 316, the metal lines ML12 and ML14, and the liners 322 and 324 are covered by the patterned mask MA2. In some embodiments, the patterned mask MA2 may be photoresist.

Figure 9:
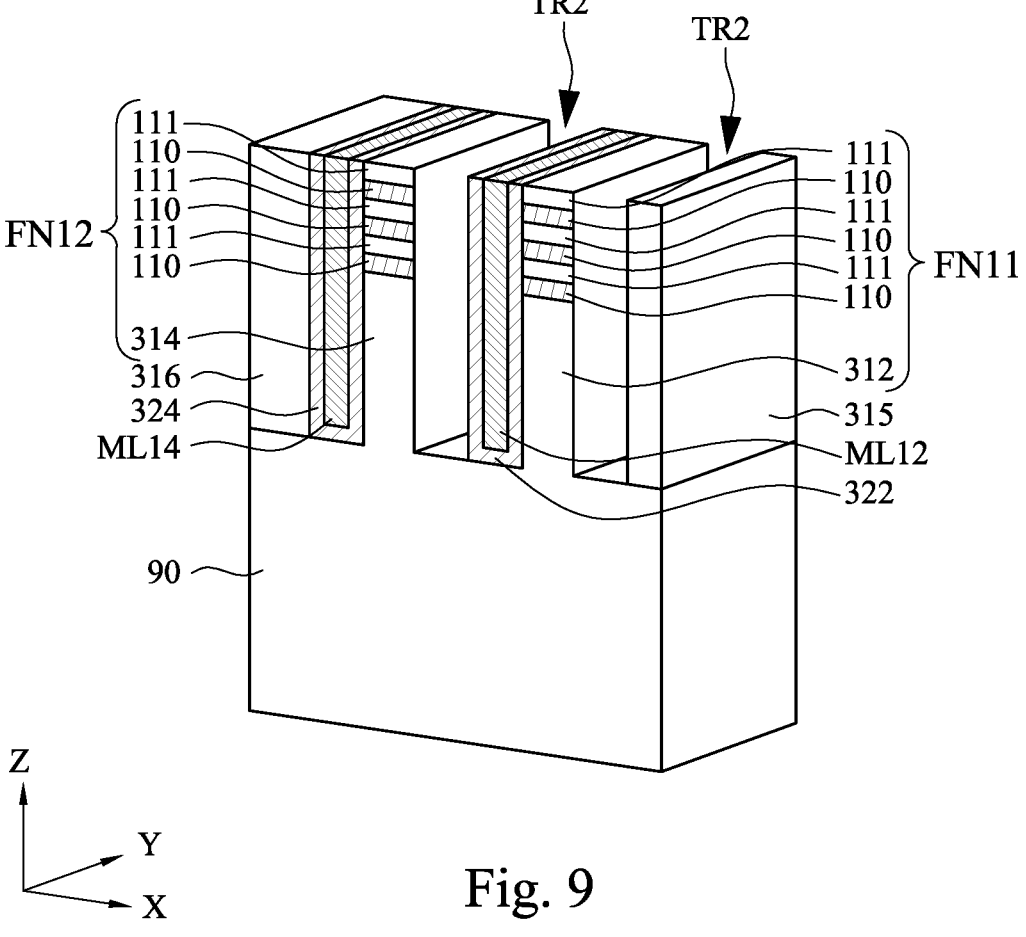

Reference is made to FIG. 9. An etching process is performed to remove the expose portions of the isolation structures 315 and 317, so as to form trenches TR2. After the trenches are formed. The patterned mask MA2 is removed. In some embodiments, an entirety of the isolation structure 315 between the fin structures FN11 and FN12 may be removed after the etching process is completed.

Figure 10:
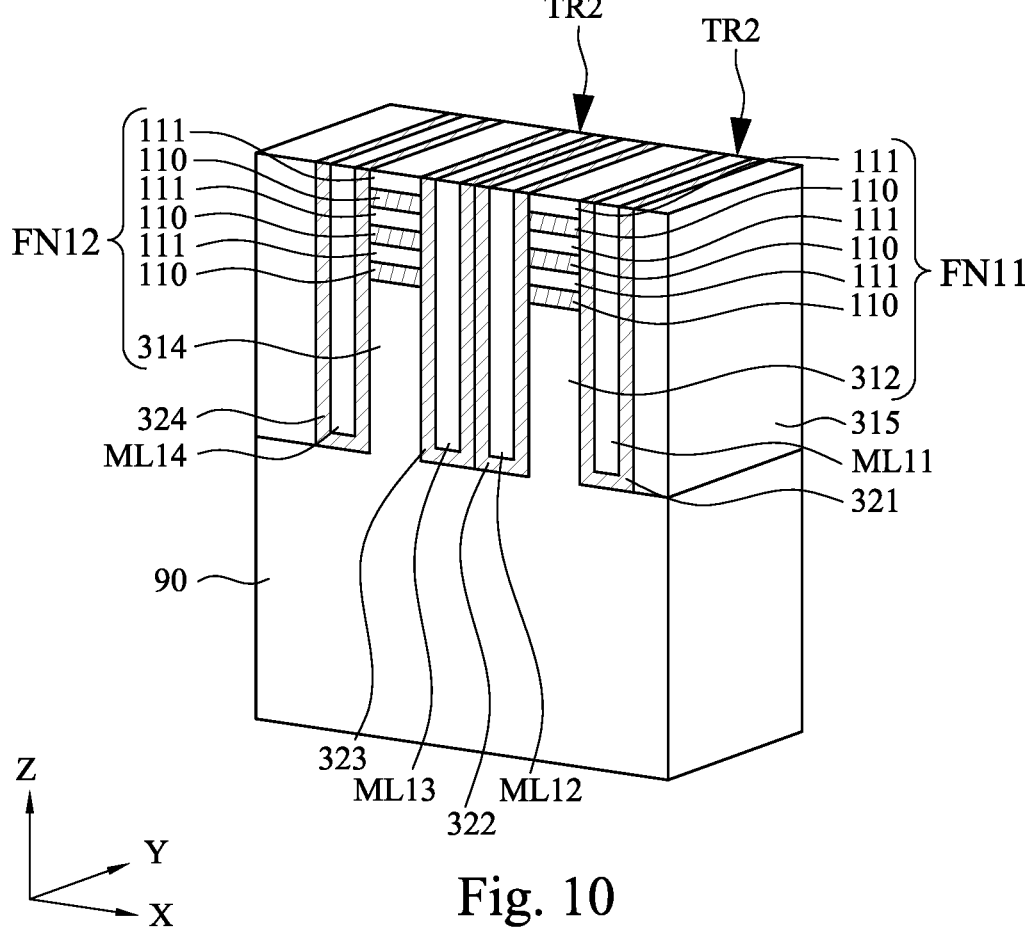

Reference is made to FIG. 10. Metal lines ML11 and ML13 are formed in the trenches TR2, and liners 321 and 323 are formed lining the metal lines ML11 and ML13, respectively. In some embodiments, a liner material (e.g., a dielectric material) is deposited lining the trenches TR2, a conductive material is then deposited over the liner material, and a planarization process (e.g., CMP) is performed to remove excess liner material and excess conductive material until the topmost one of the semiconductor layers 110 is exposed. Accordingly, the metal lines ML11 and ML13 and the liners 321 and 323 are formed. The metal lines ML12 and ML14 are formed prior to the metal lines ML11 and ML13, while in some other embodiments the metal lines ML11 and ML13 can be formed prior to the metal lines ML12 and ML14.

Figure 11:
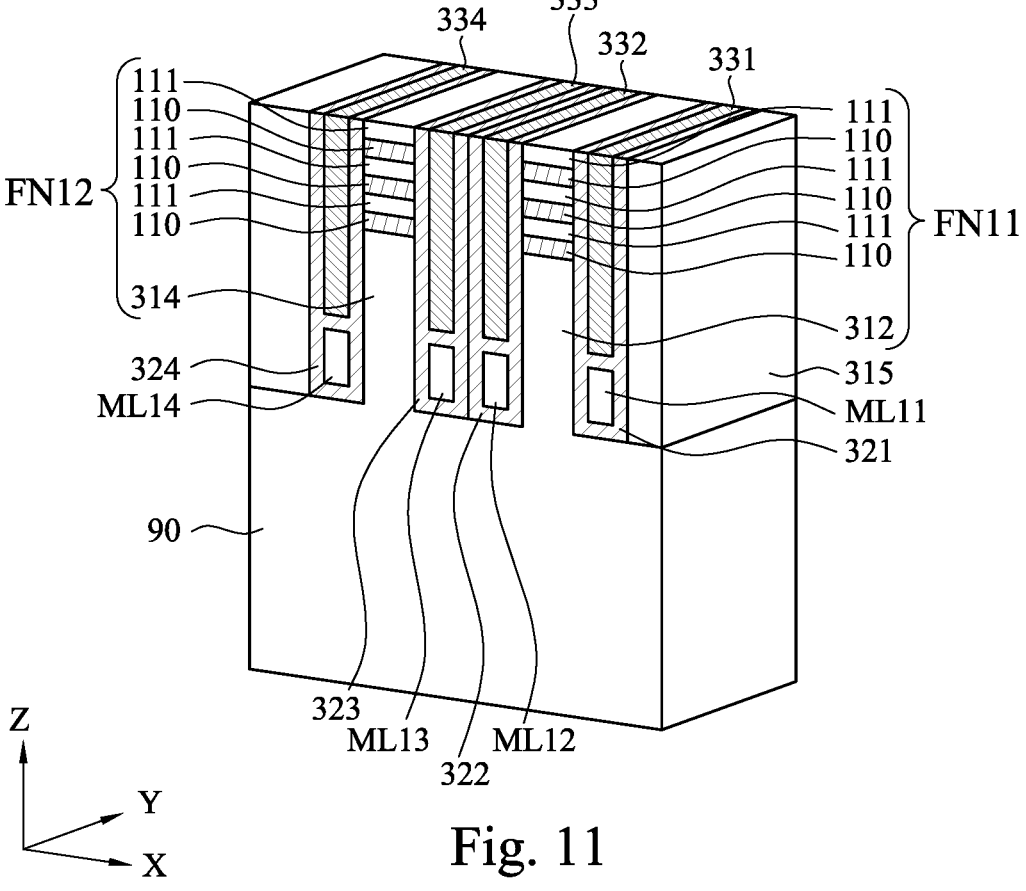

Reference is made to FIG. 11. The metal lines ML11, ML12, ML13, and ML14 are etched back by using the fin structures FN11 and FN12, the isolation structures 315 and 316, and the liners 321, 322, 323, and 324 as etch masks. After the etching back process, top surfaces of the metal lines ML11, ML12, ML13, and ML14 are lowered to a position that is below top surfaces of the semiconductor strips 312 and 314.

After the metal lines ML11, ML12, ML13, and ML14 are etched back, liner materials are formed covering top surfaces of the etched back metal lines ML11, ML12, ML13, and ML14. In some embodiments, the liner materials may be the same as the materials of the liners 321, 322, 323, and 324. Accordingly, the liner materials respectively over the etched back metal lines ML11, ML12, ML13, and ML14 can be regarded as extended portions of the liners 321, 322, 323, and 324, respectively.

Afterwards, dielectric materials 331, 332, 333, and 334 are formed over the metal lines ML11, ML12, ML13, and ML14, respectively. In some embodiments, the dielectric materials 331, 332, 333, and 334 can be formed by, for example, depositing a dielectric material over the substrate 90 and filling the spacers in the liners 321, 322, 323, and 324, and then performing a planarization process (e.g., CMP) to remove excess dielectric material until the topmost one of the semiconductor layers 110 is exposed.

Figure 12:
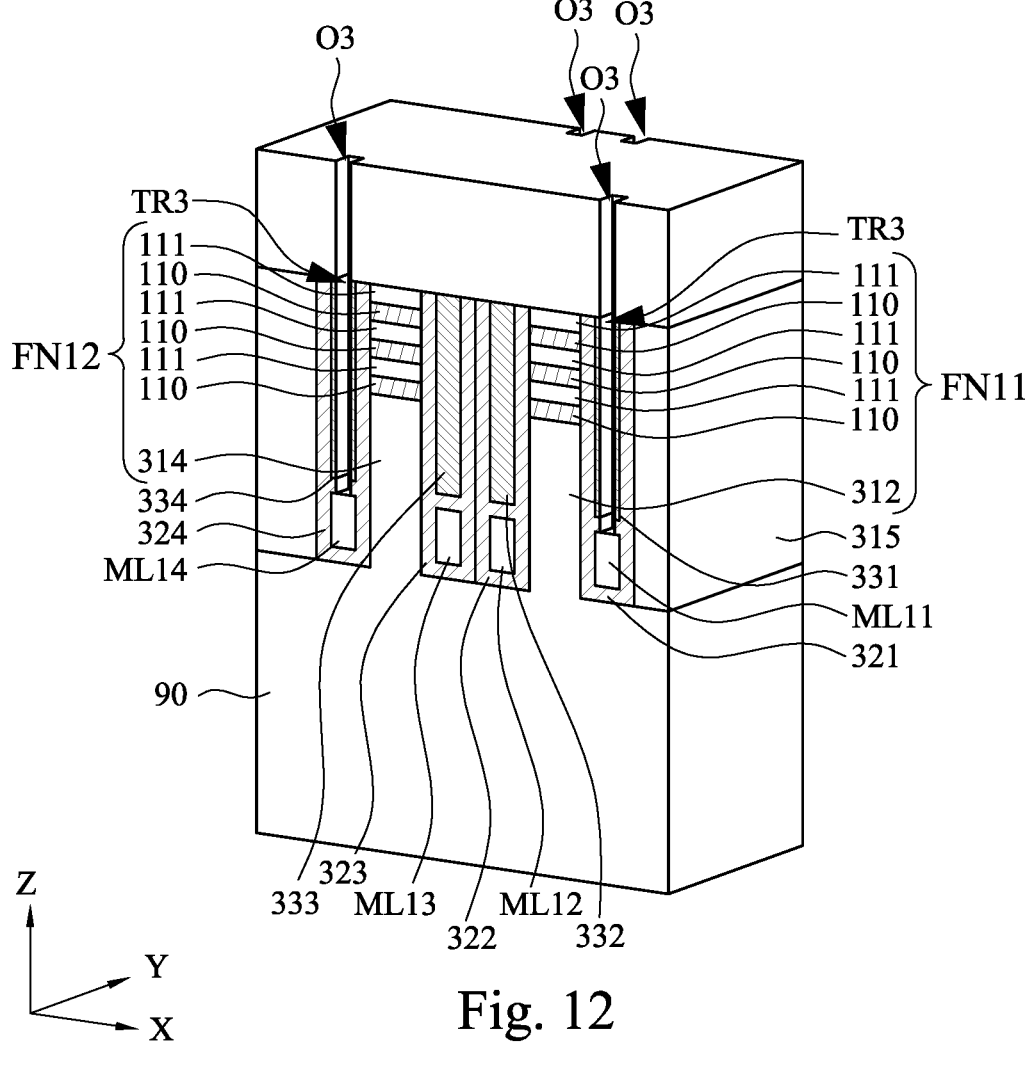

Reference is made to FIG. 12. A patterned mask MA3 is formed over the substrate 90. The patterned mask MA3 includes openings O3 that expose portions of the dielectric materials 331, 332, 333, and 334. Then, an etching process is performed to remove exposed portions of the dielectric materials 331, 332, 333, and 334 through the openings O3 of the patterned mask MA3 to form trenches TR3 in the dielectric materials 331, 332, 333, and 334 until the metal lines ML11, ML12, ML13, and ML14 are exposed. In some embodiments, the extended portions of the liners 321, 322, 323, and 324 may be etched through to expose the underlying metal lines ML11, ML12, ML13, and ML14. In some embodiments, the trenches TR3 may define the positions of metal vias MV11, MV12, MV13, and MV14 formed in later steps.

Figure 13:
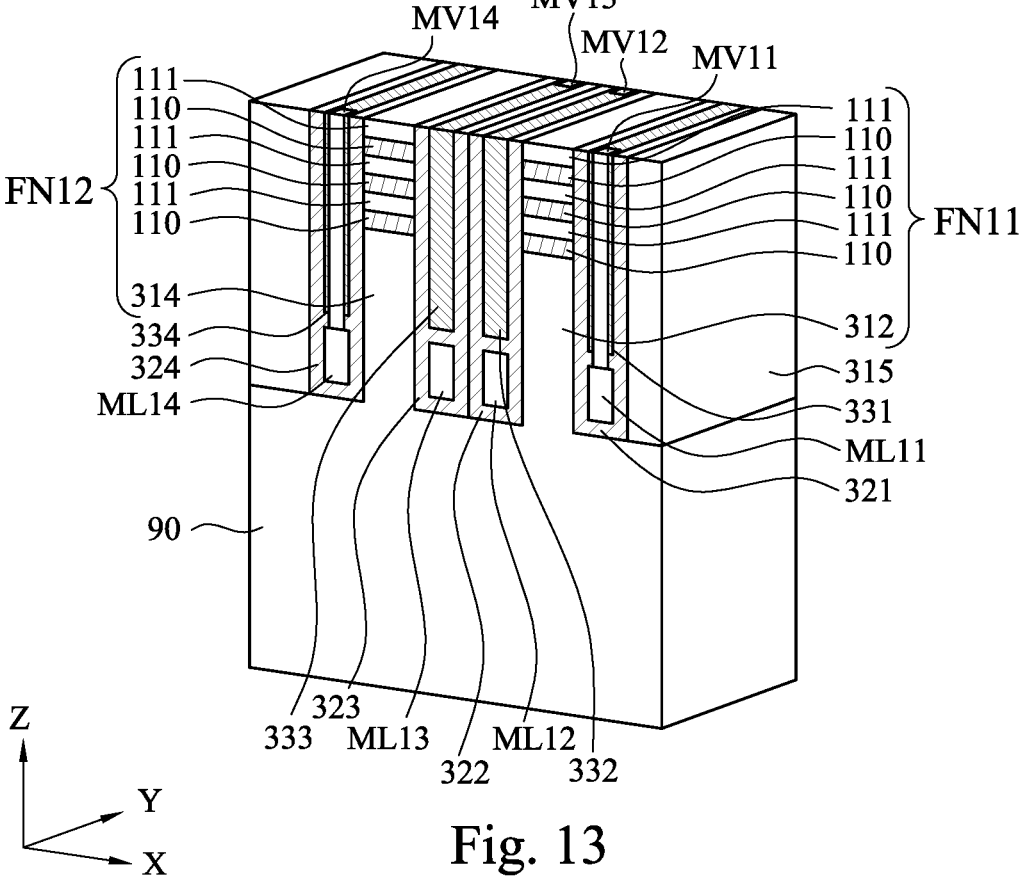

Reference is made to FIG. 13. After the trenches TR3 are formed, the patterned mask MA3 is removed. Then, metal vias MV11, MV12, MV13, and MV14 are formed in the trenches TR3 and in contact with metal lines ML11, ML12, ML13, and ML14, respectively. In some embodiments, the metal vias MV11, MV12, MV13, and MV14 may be formed by, for example, depositing a conductive material overfilling the trenches TR3, and the performing a planarization process (e.g., CMP) to remove excess conductive material until the topmost one of the semiconductor layers 110 is exposed.

Figure 14:
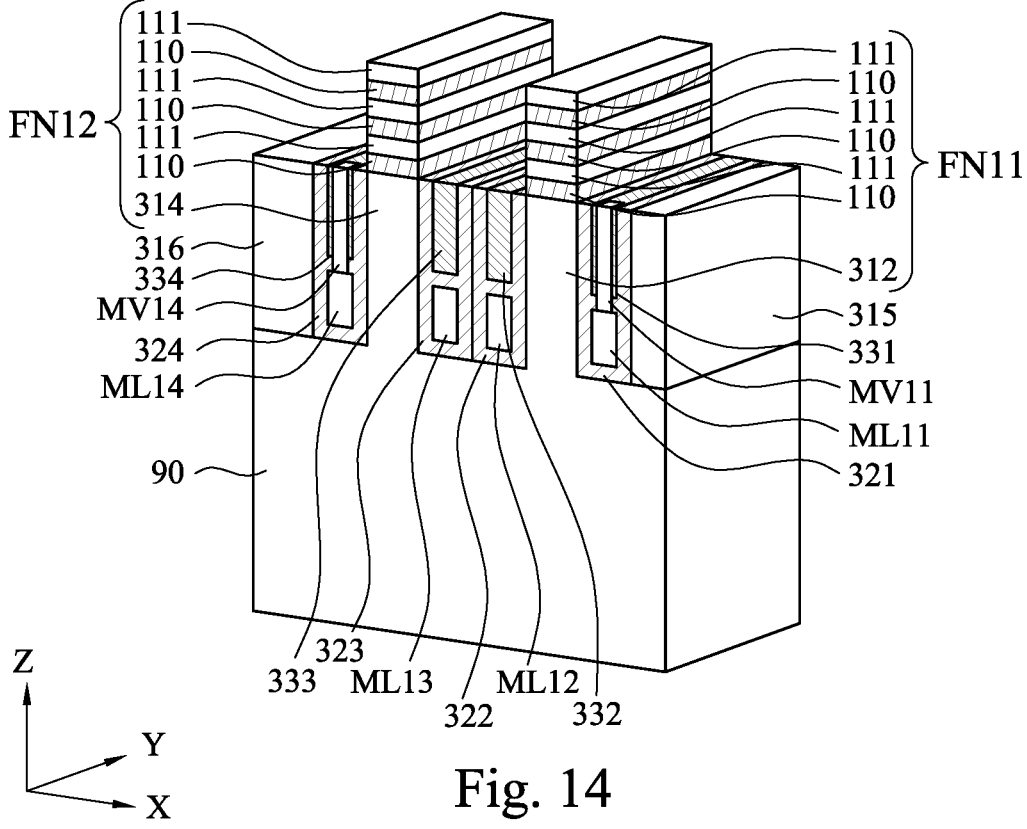

Reference is made to FIG. 14. The metal vias MV11, MV12, MV13, and MV14, the isolation structures 315 and 316, the liners 321, 322, 323, and 324, the dielectric materials 331, 332, 333, and 334 are etched back by using the fin structures FN11, FN12 as etch masks. In some embodiments, the etching back process is performed to lower top surfaces of the metal vias MV11, MV12, MV13, and MV14, the isolation structures 315 and 316, the liners 321, 322, 323, and 324, the dielectric materials 331, 332, 333, and 334 to a position that is below the bottommost semiconductor layers 111.

Figure 15A:
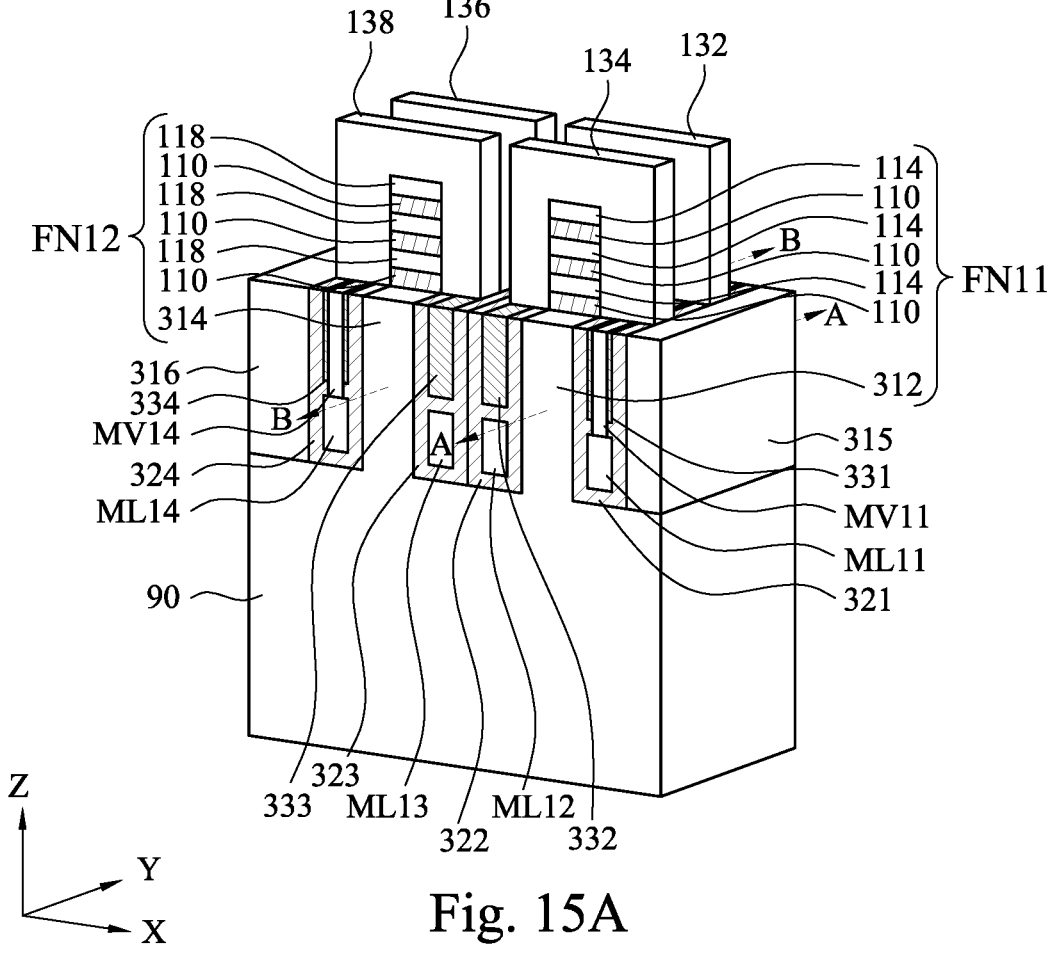
Figure 15B:
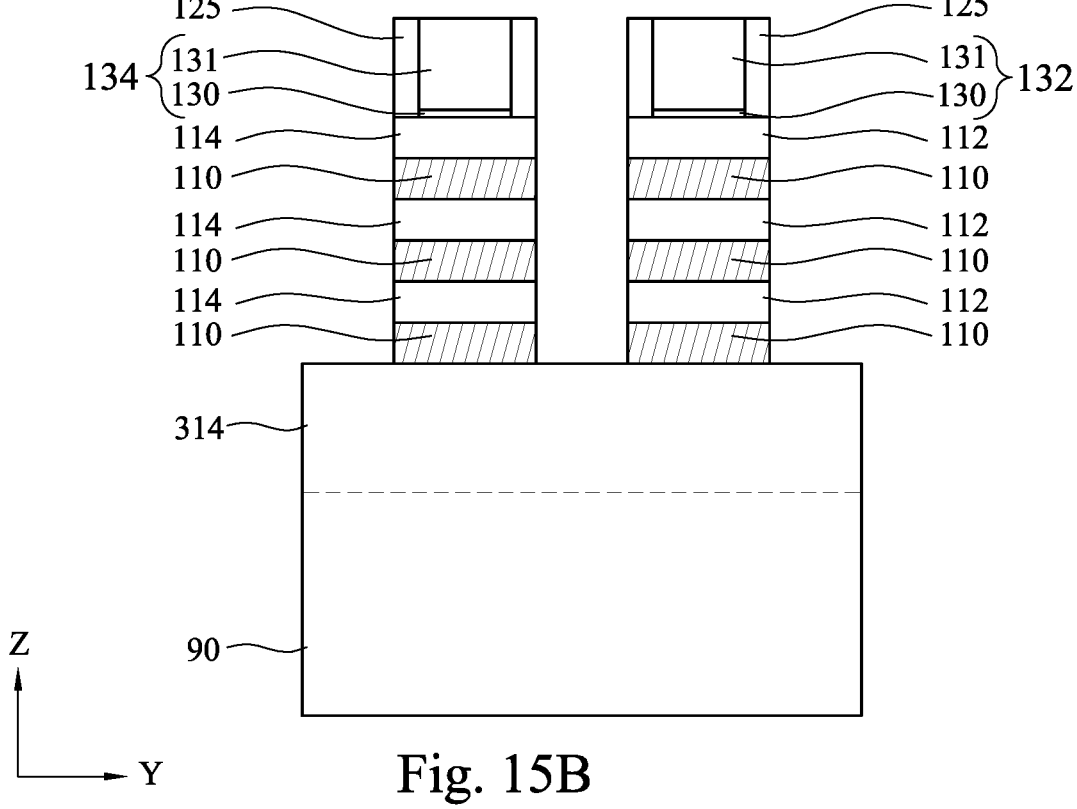
Figure 15C:
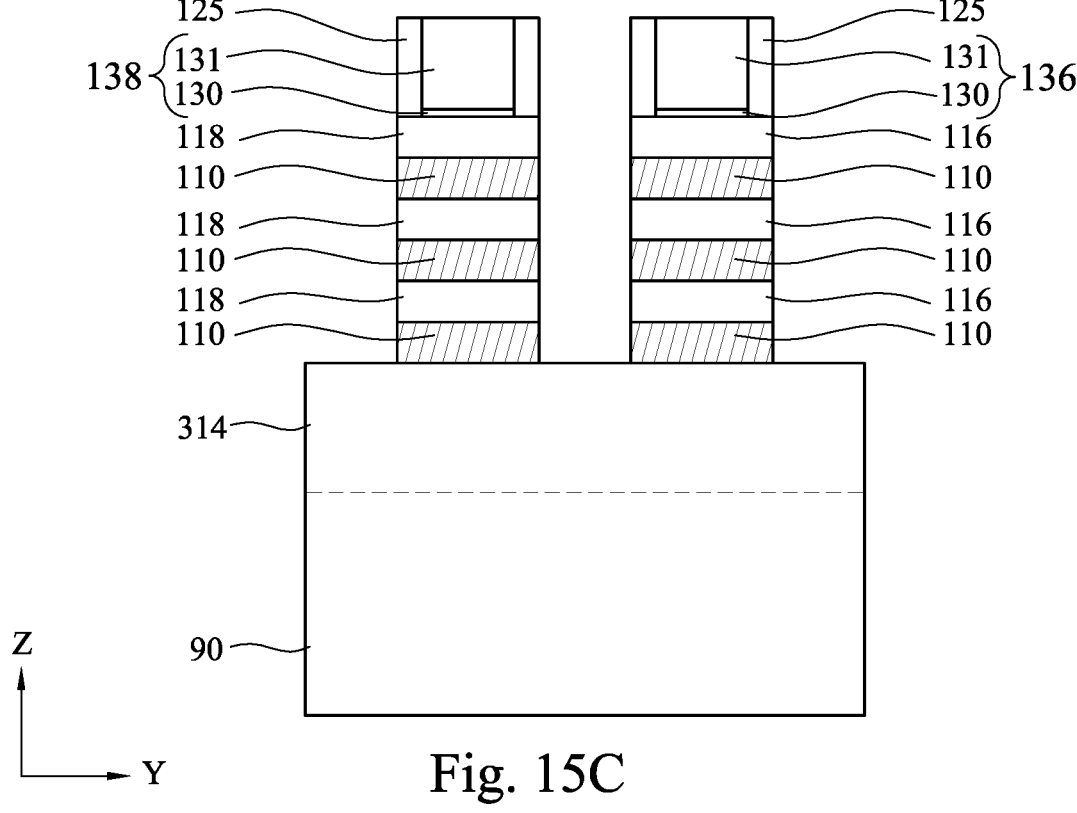

Reference is made to FIGS. 15A, 15B, and 15C, in which FIGS. 15B and 15C are cross-sectional views along lines B-B and C-C of FIG. 15A, respectively. Dummy gate structures 132, 134, 136, and 138 are formed over the substrate 90 and crossing the fin structures FN11 and FN12. In some embodiments, each of the dummy gate structures 132, 134, 136, and 138 includes a dummy gate dielectric 130 and a dummy gate electrode 131 over the dummy gate dielectric 130. The dummy gate dielectric 130 may be, for example, silicon oxide, silicon nitride, a combination thereof, or the like, and may be deposited or thermally grown according to acceptable techniques. The dummy gate electrode 131 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals.

The dummy gate structures 132, 134, 136, and 138 may be formed by, for example, depositing a dummy dielectric layer and a dummy gate layer over the substrate 90, and then patterning the dummy dielectric layer and the dummy gate layer. In some embodiments, the dummy gate electrode 131 may be deposited by physical vapor deposition (PVD), CVD, sputter deposition, or other techniques for depositing the selected material. In some embodiments, the dummy gate dielectric 130 may be formed by thermal oxidation.

As shown in FIGS. 15B and 15C. Gate spacers 125 are formed on opposite sidewalls of each of the dummy gate structures 132, 134, 136, and 138, respectively. In some embodiments, the gate spacers 125 may be formed by, for example, depositing a spacer layer blanket over the substrate 90, and then performing an anisotropic etching process to remove horizontal portions of the spacer layer, such that vertical portions of the spacer layer remain on sidewalls of the dummy gate structures 132, 134, 136, and 138.

After the gate spacers 125 are formed, an etching process is performed to remove portions of the stack of the semiconductor layers 110 and 111 that are exposed by the dummy gate structures 132, 134, 136, and 138 and the gate spacers 125, so as to form source/drain recesses within the fin structures FN11 and FN12. In some embodiments, the remaining portions of the semiconductor layers 111 respectively covered by the dummy gate structures 132, 134, 136, and 138 are referred to as semiconductor channel layers 112, 114, 116, and 118, respectively.

Figure 16A:
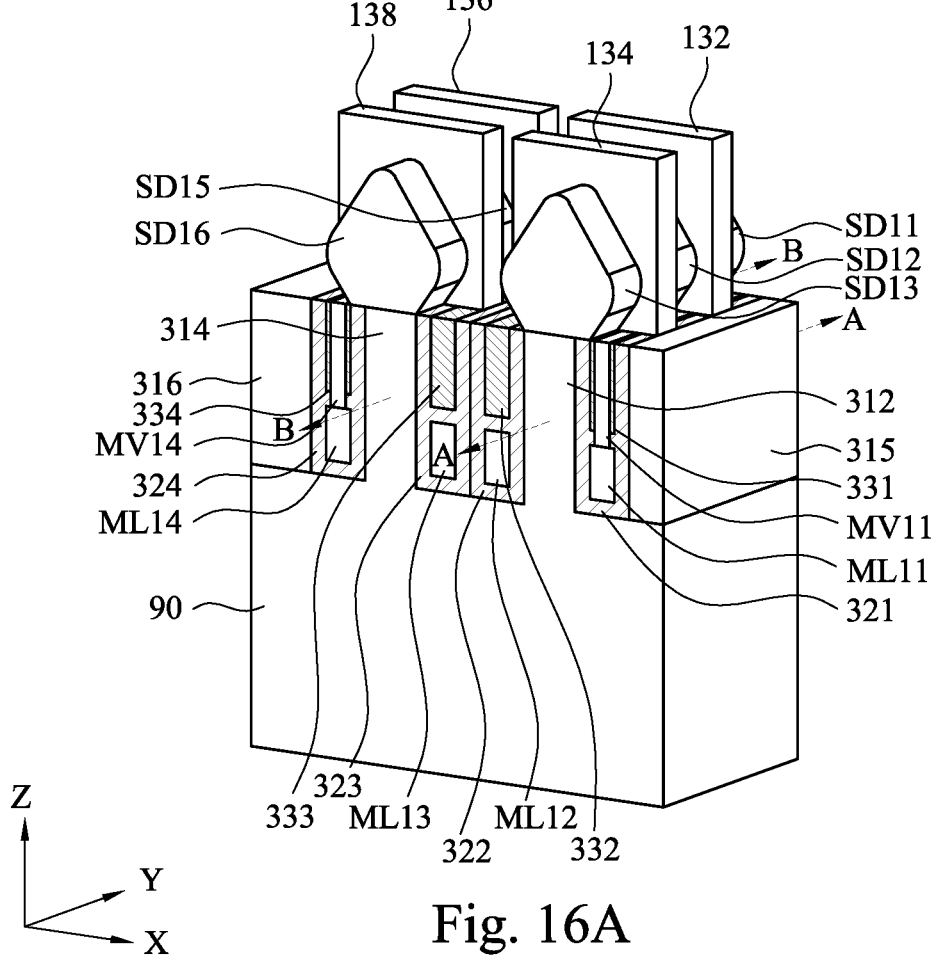
Figure 16B:
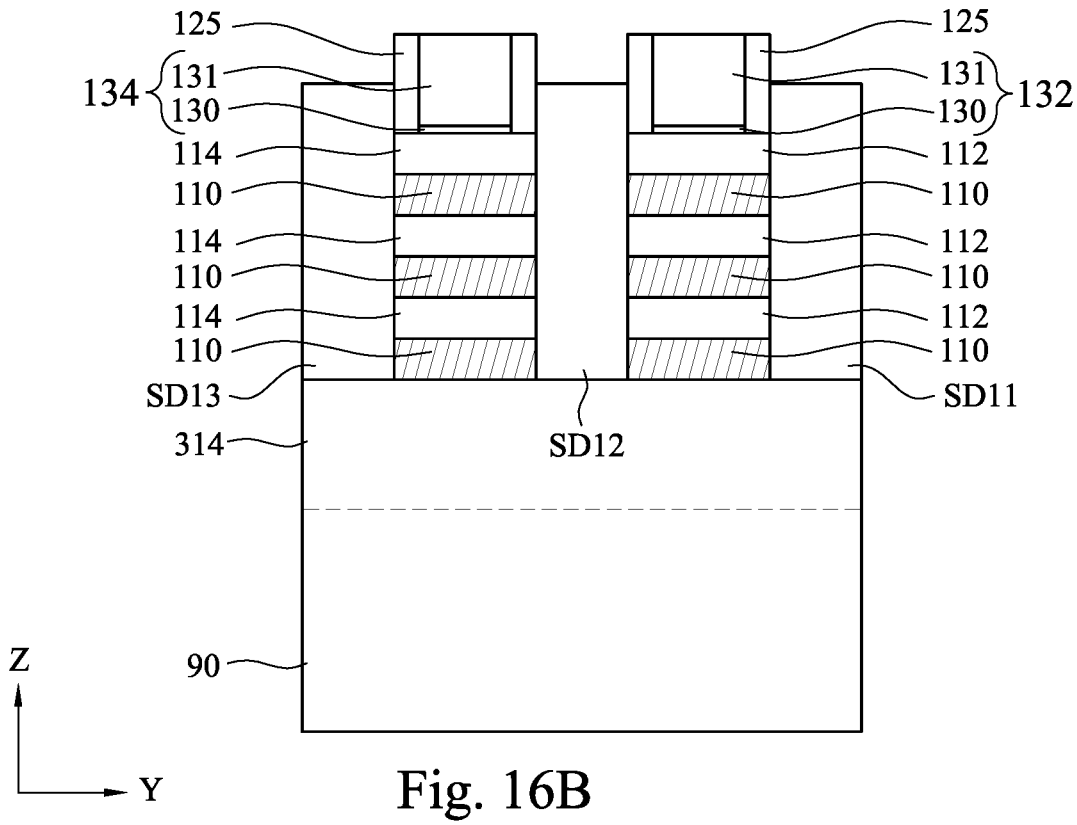
Figure 16C:
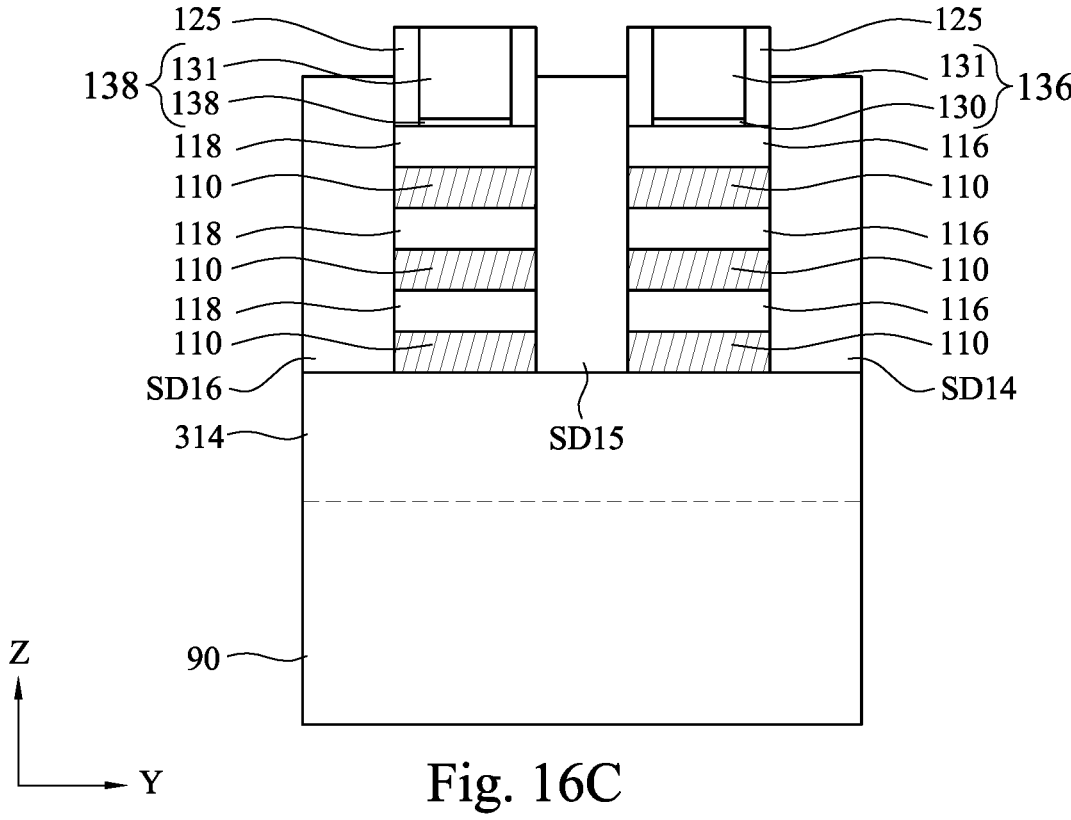

Reference is made to FIGS. 16A, 16B, and 16C, in which FIGS. 16B and 16C are cross-sectional views along lines B-B and C-C of FIG. 16A, respectively. Portions of the semiconductor layers 110 exposed by the source/drain recesses are laterally etched to form sidewall recesses, and then inner spacers 126 are formed in the sidewall recesses (see FIGS. 16B and 16C). The inner spacers 126 may be deposited by a conformal deposition process, such as CVD, ALD, or the like. The inner spacers 126 may be formed by, for example, depositing an inner spacer layer blanket over the substrate 90 and filling the sidewall recesses of the semiconductor layers 110, and then performing an anisotropic etching to remove portions of the inner spacer layer outside the sidewall recesses.

Afterwards, source/drain epitaxy structures SD11, SD12, SD13, SD14, SD15, and SD16 are formed in the source/drain recesses, respectively. In some embodiments, the formation of the source/drain epitaxy structures SD11, SD12, SD13, SD14, SD15, and SD16 may include epitaxial growth (SEG) process.

Figure 17A:
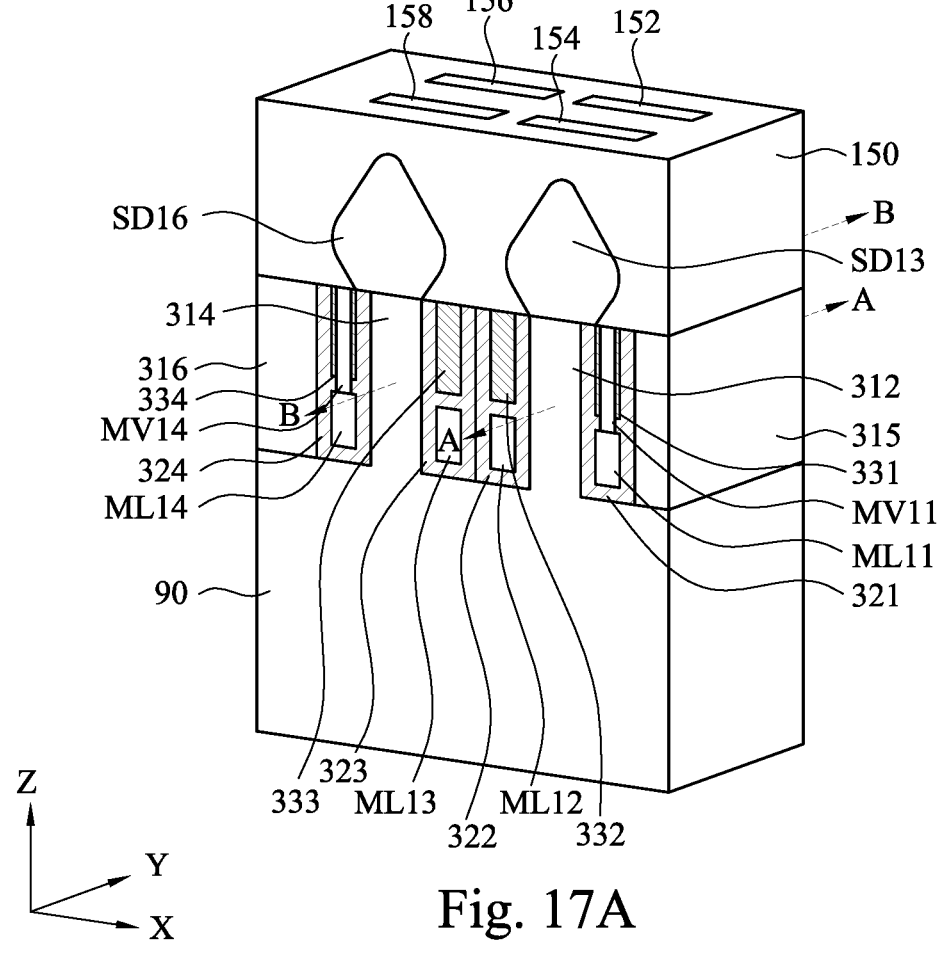
Figure 17B:
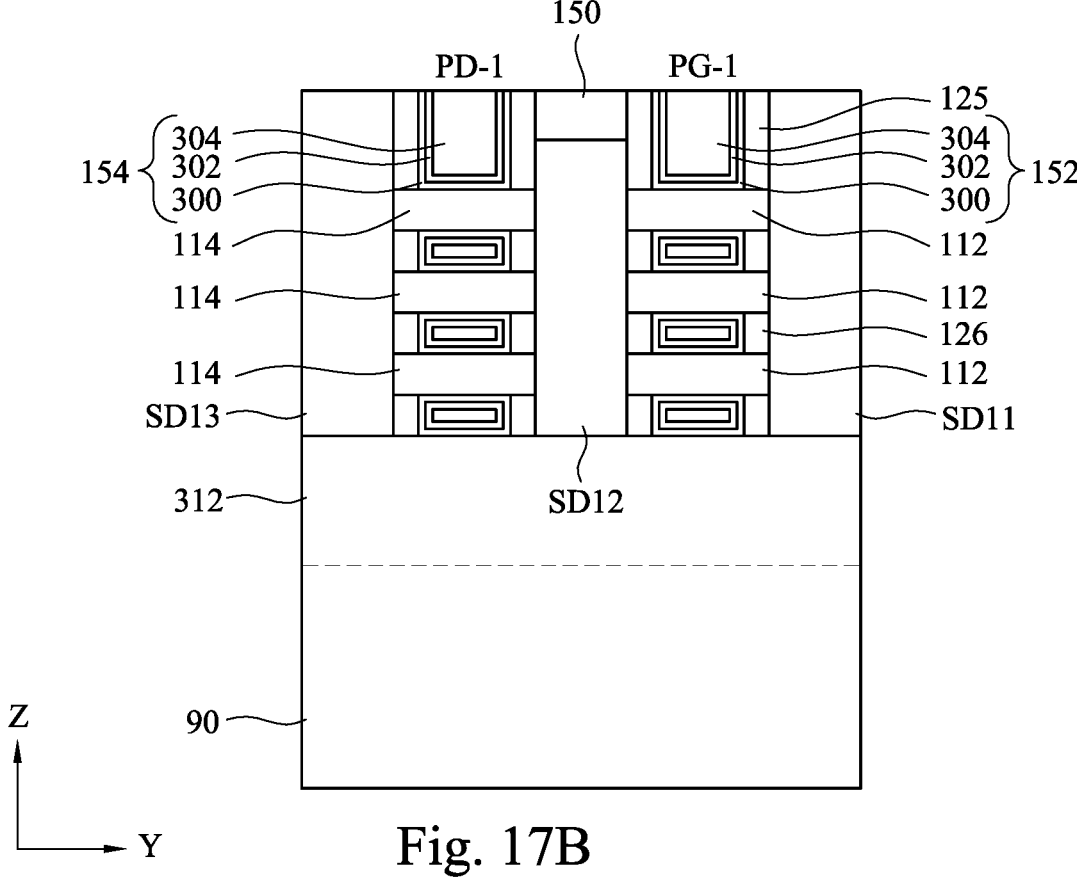
Figure 17C:
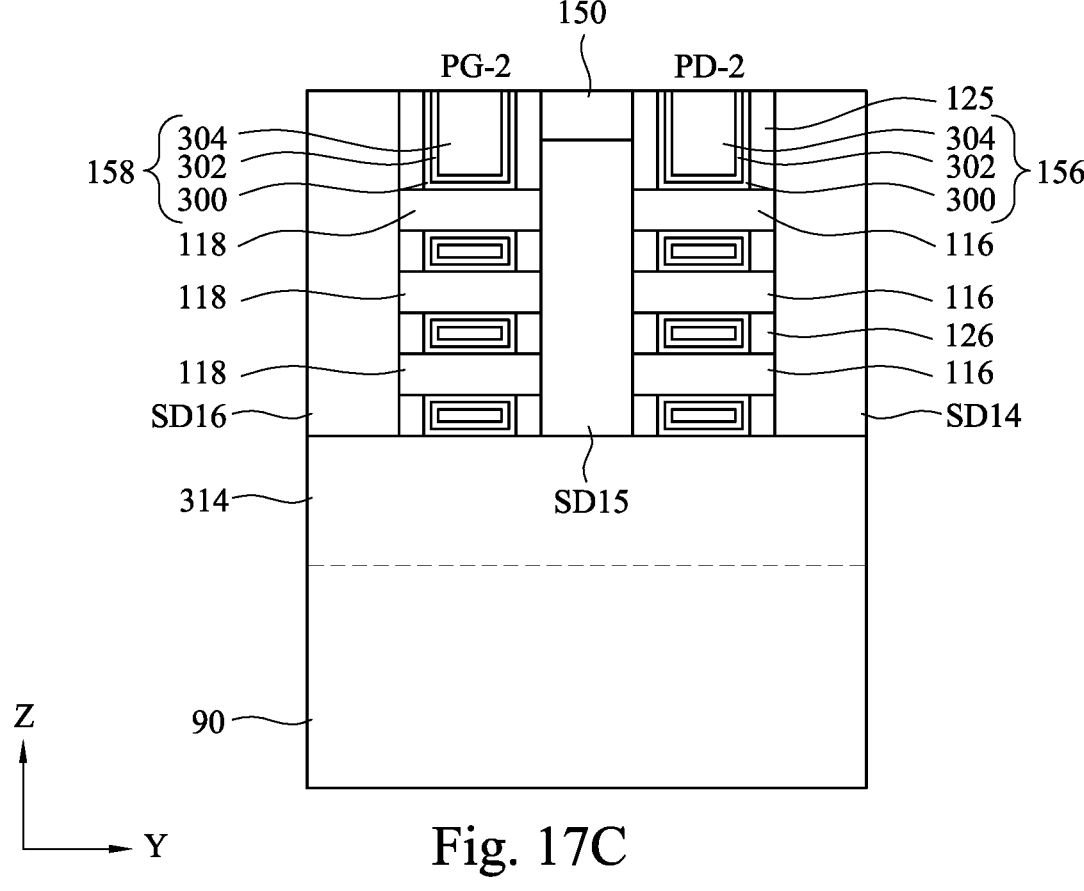

Reference is made to FIGS. 17A, 17B, and 17C, in which FIGS. 17B and 17C are cross-sectional views along lines B-B and C-C of FIG. 17A, respectively. An interlayer dielectric (ILD) layer 150 is formed over the substrate 90 and covering the source/drain epitaxy structures SD11, SD12, SD13, SD14, SD15, and SD16. In some embodiments, the ILD layer 150 can be formed by, for example, depositing a dielectric material over the substrate 90, followed by a CMP process to remove the excessive dielectric material until the dummy gate structures 132, 134, 136, and 138 are exposed.

After the ILD layer 150 is formed. The dummy gate structures 132, 134, 136, and 138 are removed to form gate trenches between each pair of the gate spacers 125. Then, portions of the semiconductor layers 110 exposed through the gate trenches are removed, such that semiconductor channel layers 112, 114, 116, and 118 are suspended over the substrate 90.

Metal gate structures 152, 154, 156, and 158 are formed over the substrate 90. In greater detail, metal gate structures 152, 154, 156, and 158 are formed in the gate trenches between the gate spacers 125 and wrap around the respective semiconductor channel layers 112, 114, 116, and 118. In some embodiments, the metal gate structures 152, 154, 156, and 158 may be formed by, for example, sequentially depositing a gate dielectric layer 300, a work function metal layer 302, and a filling metal 304 over the substrate 90 and filling the gate trenches between the gate spacers 125, and then performing a CMP process to remove excess material of gate dielectric layer 300, excess material of work function metal layer 302, and excess material of filling metal 304 until the ILD layer 150 is exposed.

Figure 18A:
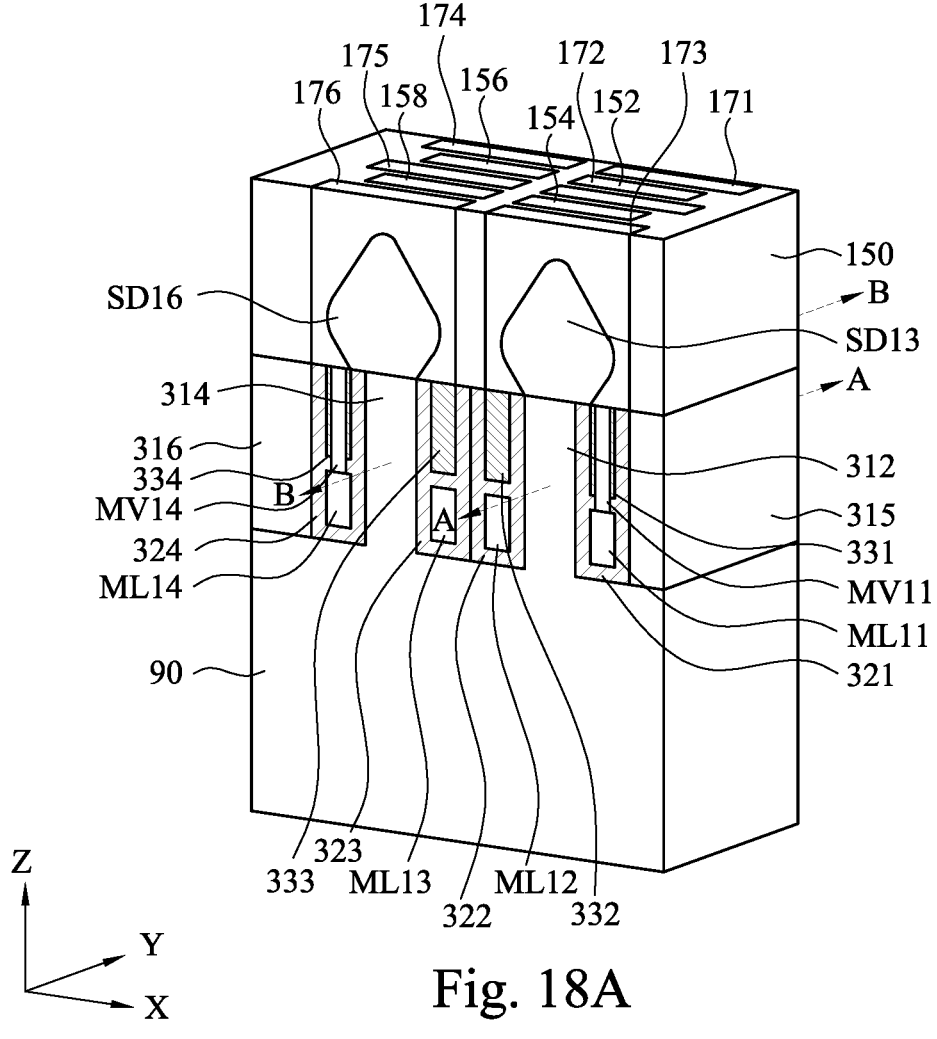
Figure 18B:
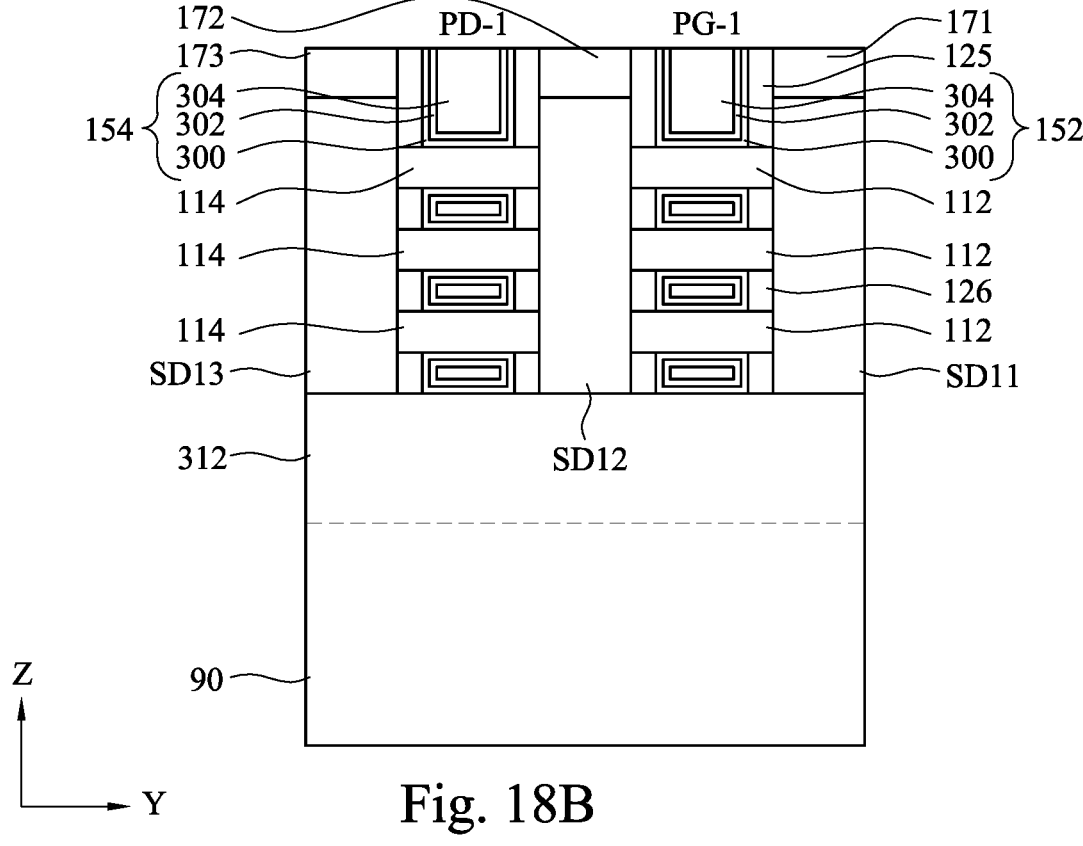
Figure 18C:
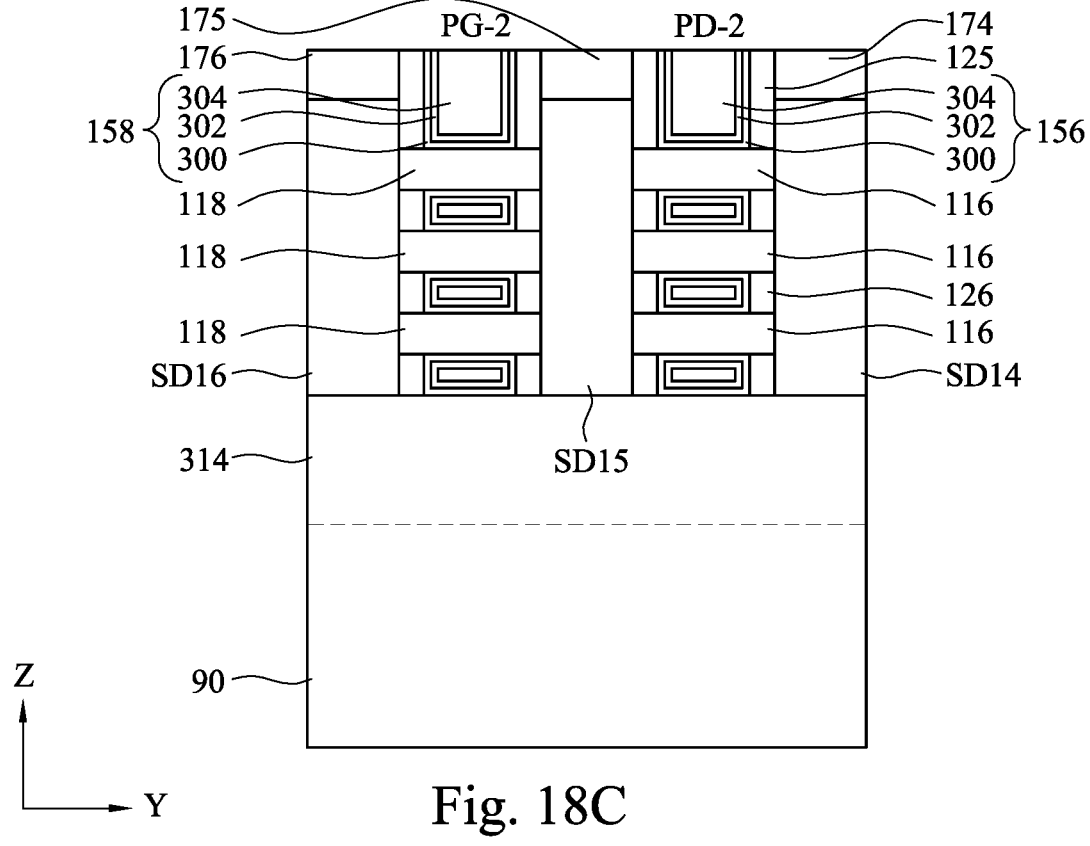

Reference is made to FIGS. 18A, 18B, and 18C, in which FIGS. 18B and 18C are cross-sectional views along lines B-B and C-C of FIG. 18A, respectively. Portions of the ILD layer 150 are removed to form openings exposing the source/drain epitaxy structures SD11, SD12, SD13, SD14, SD15, and SD16. Source/drain contacts 171, 172, 173, 174, 175, and 176 are then formed in the openings and covering the source/drain epitaxy structures SD11, SD12, SD13, SD14, SD15, and SD16, respectively. In some embodiments, the source/drain contacts 171, 172, 173, 174, 175, and 176 may be formed by, for example, depositing conductive material(s) in the openings, and then performing a CMP process to remove excess materials of the conductive material until the gate structures 152, 154, 156, and 158 are exposed.

Figure 19:
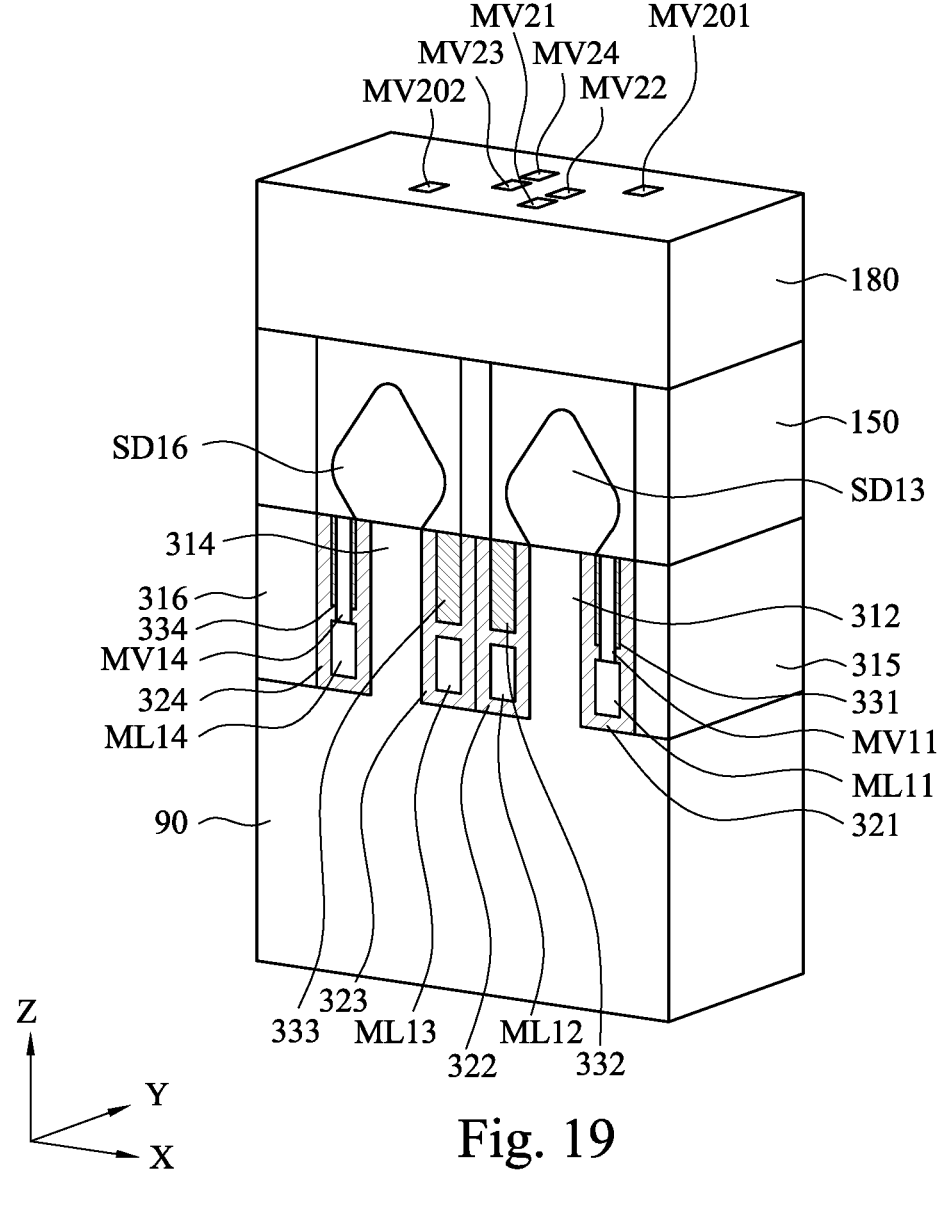

Reference is made to FIG. 19. A semiconductor layer 180 is formed over the ILD layer 150. In some embodiments, the semiconductor layer 180 can be formed over the ILD layer 150 using suitable deposition process. In some other embodiments, the semiconductor layer 180 can be bonded to the ILD layer 150 using a suitable bonding process.

After the semiconductor layer 180 is formed over the ILD layer 150, metal vias MV21, MV22, MV23, MV24, MV201, MV202 are formed in the semiconductor layer 180. In some embodiments, the metal vias MV21, MV22, MV23, MV24, MV201, MV202 can be formed by, for example, patterning the semiconductor layer 180 to form openings in the semiconductor layer 180, filling the openings with a conductive material, and then performing a CMP process to remove excess conductive material until the semiconductor layer 180 is exposed. In some embodiments, the metal vias MV21, MV22, MV23, MV24 are in contact with top surfaces of the gate structure 154, the source/drain contact 172, the source/drain contact 175, the gate structure 156, respectively. Moreover, the metal vias MV201 and MV202 are in contact with top surfaces of the gate structure 152 and the gate structure 158, respectively.

Figure 20:
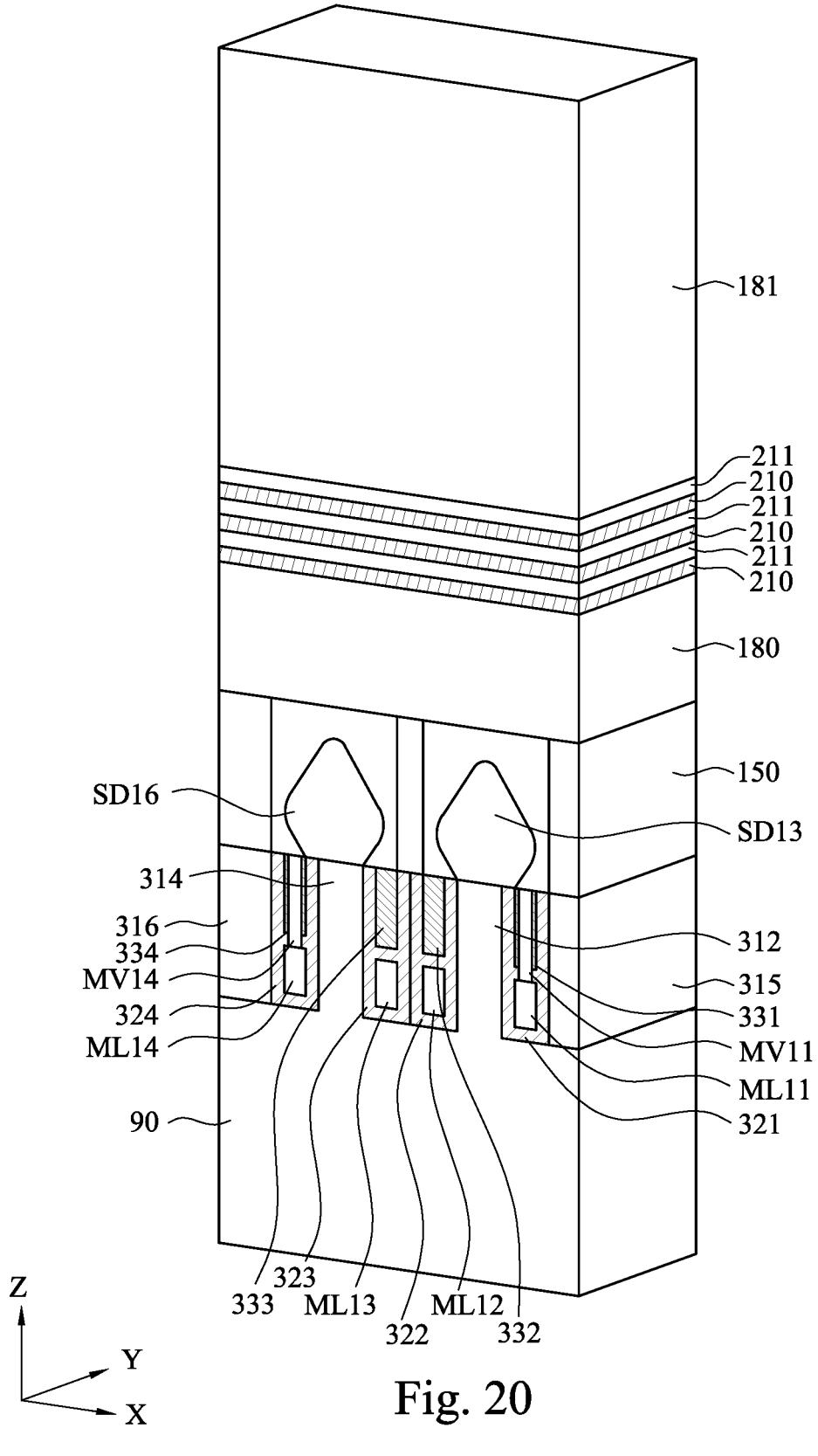

Reference is made to FIG. 20. A stack of alternating semiconductor layers 210, 211, and a semiconductor layer 181 is formed over the semiconductor layer 180. In some embodiments, the semiconductor layers 210 are made from germanium, while the semiconductor layers 211 are made from germanium tin (GeSn). In some embodiments, the germanium percentage (atomic percentage concentration) of the semiconductor layers 211 is about 95 percent. For example, the semiconductor layers 211 may include $Ge_{0.95}Sn_{0.05}$. In some embodiments, the germanium percentage of the semiconductor layers 211 is greater than the germanium percentage of the semiconductor layers 210. In some embodiments, the semiconductor layer 181 may be made of silicon.

In some embodiments, the stack of alternating semiconductor layers 210, 211 may be deposited over the semiconductor layer 181. Afterwards, the structure including the semiconductor layers 210, 211, and the semiconductor layer 181 is transferred to the semiconductor layer 180 and is then bonded to the semiconductor layer 180.

In some other embodiments, the semiconductor layers 210 and 211 may be deposited over the semiconductor layer 180 using suitable deposition process, and then the semiconductor layer 181 is formed over the topmost one of the semiconductor layers 210. The semiconductor layers 210 and 211 and the semiconductor layer 181 may be deposited using suitable deposition process, such as chemical vapor deposition (CVD), molecular beam epitaxy (MBE), or other suitable process(es).

Figure 21:
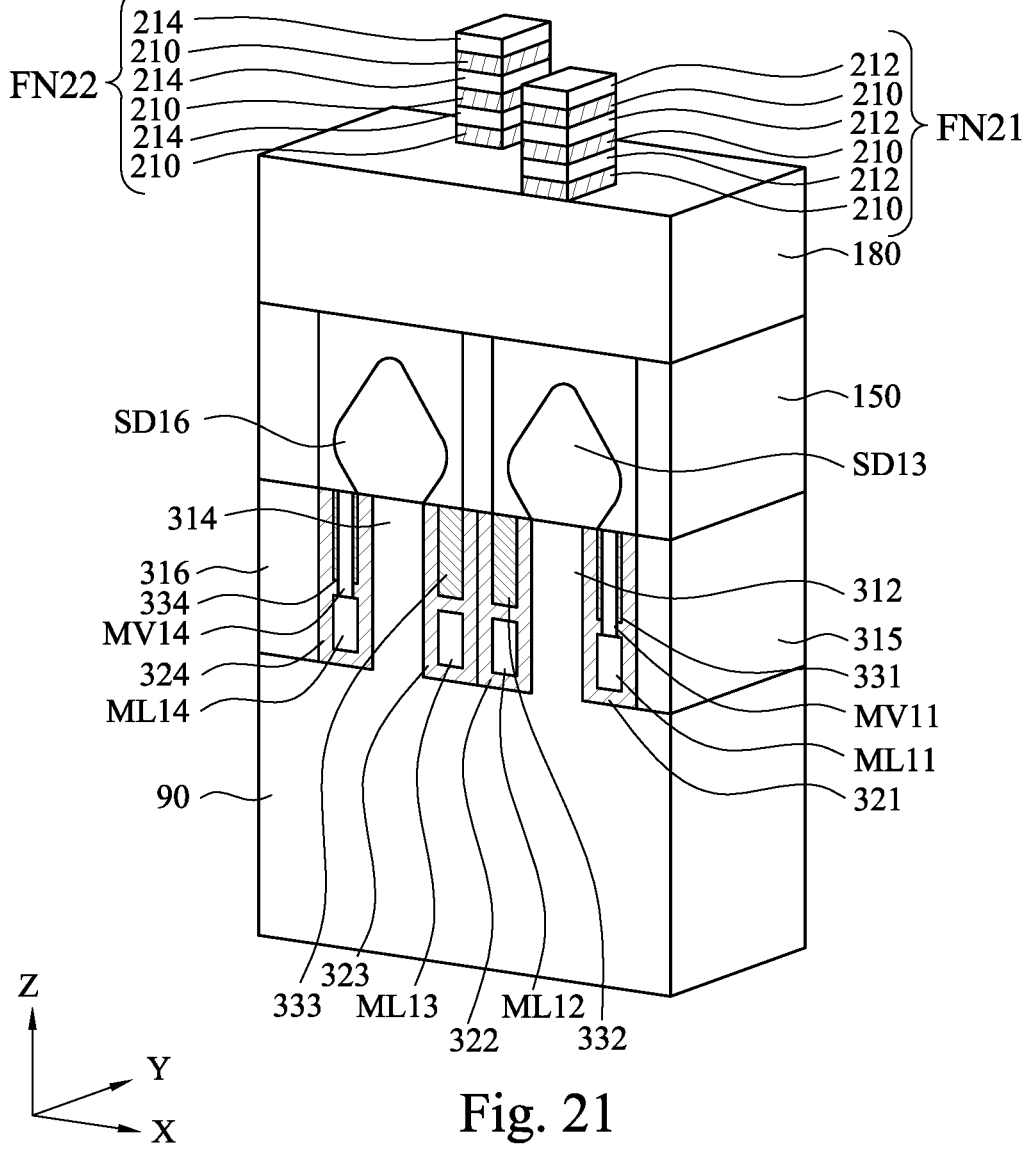

Reference is made to FIG. 21. The semiconductor layer 181 is etched back to expose the topmost one of the semiconductor layers 210. Then, the stack of the semiconductor layers 210 and semiconductor layers 211 are patterned to form fin structures FN21 and FN22. In some embodiments, each of the fin structures FN21 and FN22 includes the stack of semiconductor layers 210 and 211. The semiconductor layers 211 within the fin structure FN21 can be referred to as semiconductor channel layers 212, and the semiconductor layers 211 within the fin structure FN22 can be referred to as semiconductor channel layers 214.

Figure 22A:
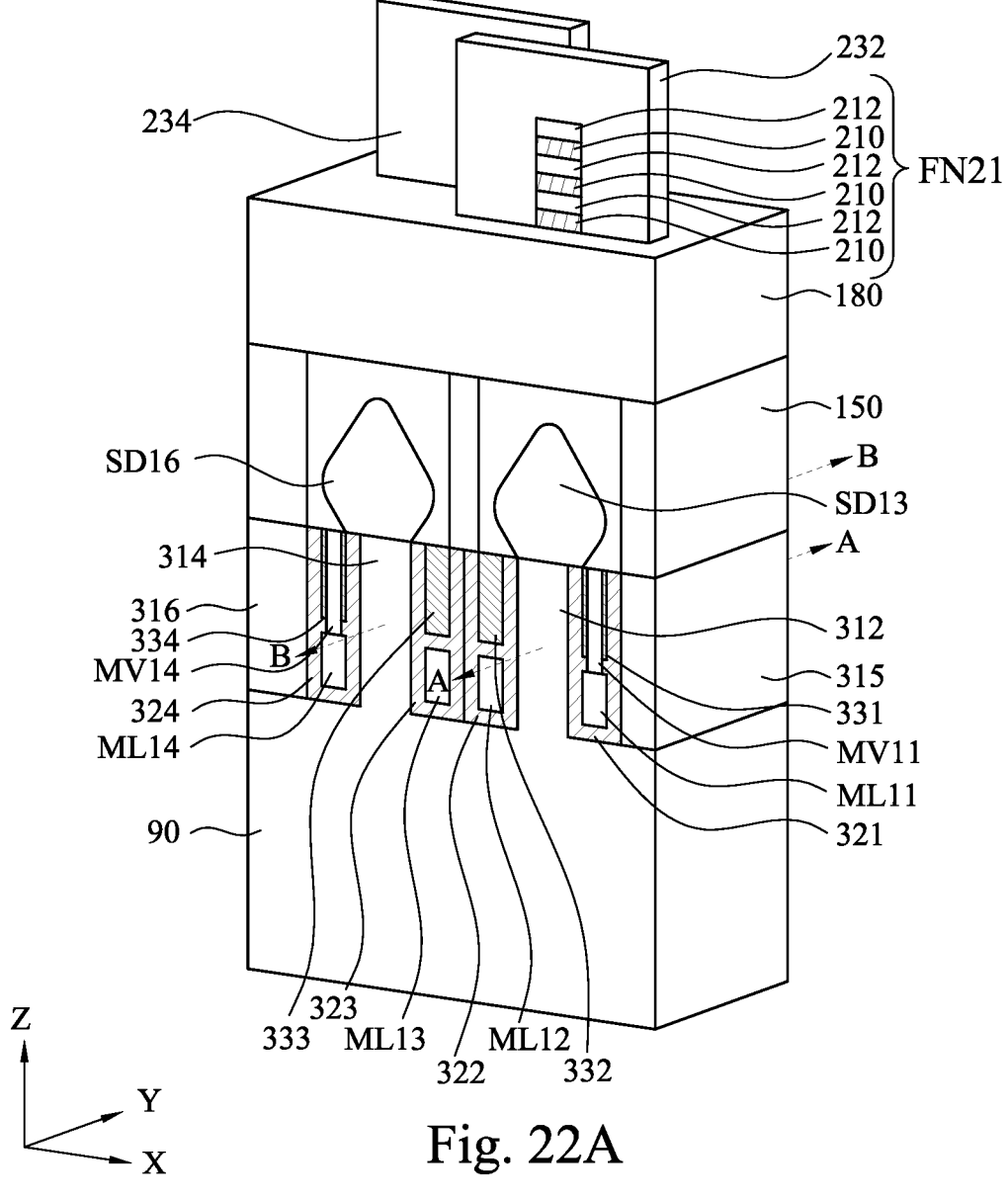
Figure 22B:
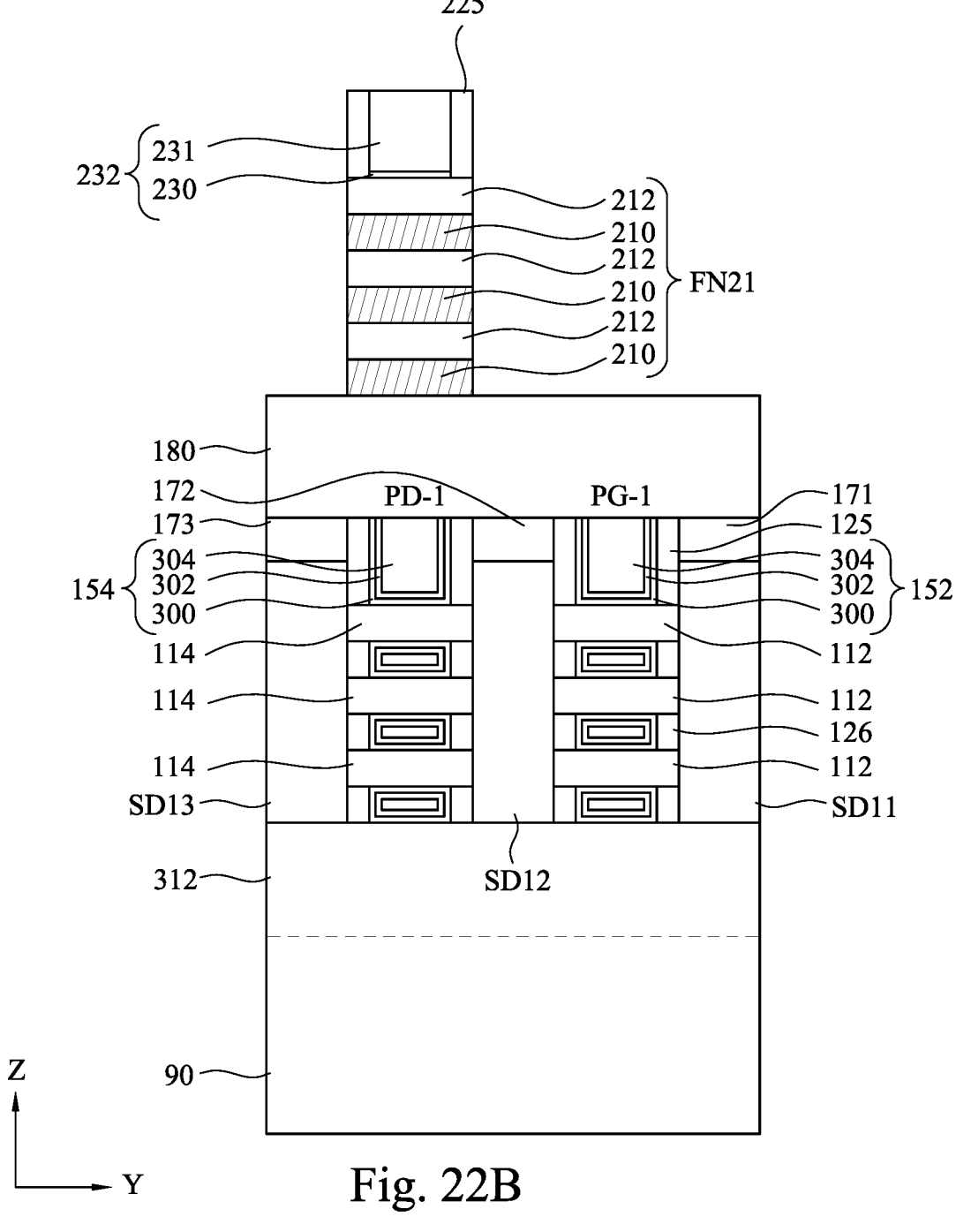
Figure 22C:
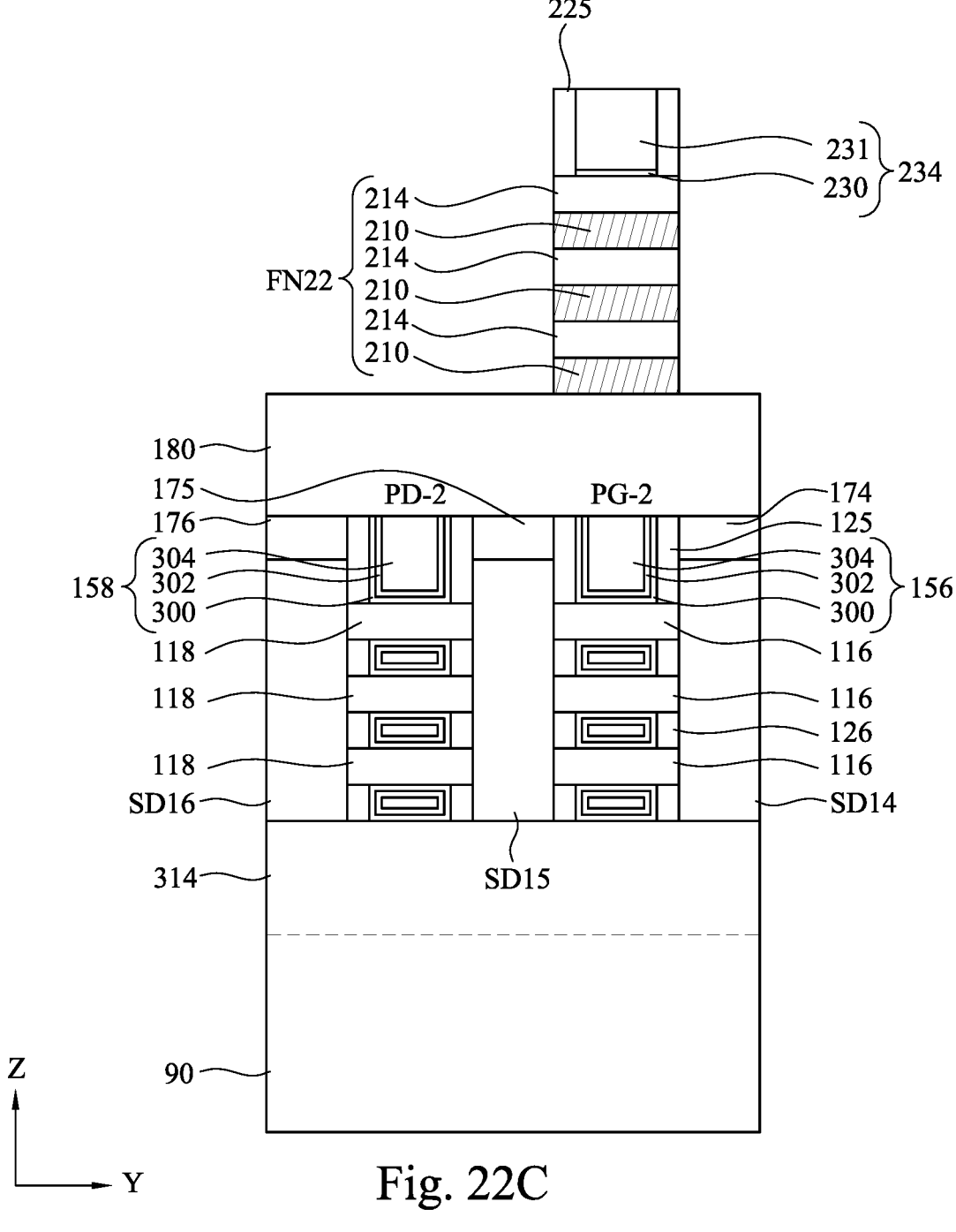

Reference is made to FIGS. 22A, 22B, and 22C, in which FIGS. 22B and 22C are cross-sectional views along lines B-B and C-C of FIG. 22A, respectively. Dummy gate structures 232 and 234 are formed over the semiconductor layer 180 and crossing the fin structures FN21 and FN22. In some embodiments, each of the dummy gate structures 232 and 234 includes a dummy gate dielectric 230 and a dummy gate electrode 231 over the dummy gate dielectric 230. The dummy gate dielectric 230 may be, for example, silicon oxide, silicon nitride, a combination thereof, or the like, and may be deposited or thermally grown according to acceptable techniques. The dummy gate electrode 231 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate structures 232 and 234 are formed using similar method as forming the dummy gate structures 132, 134, 136, and 138 as described above, and thus relevant detail will not be repeated for brevity.

In FIGS. 22B and 22C, gate spacers 225 are formed on opposite sidewalls of each of the dummy gate structures 232 and 234, respectively. In some embodiments, the gate spacers 225 may be formed using similar method as forming the gate spacers 125 described above, and thus relevant detail will not be repeated for brevity.

Figure 23A:
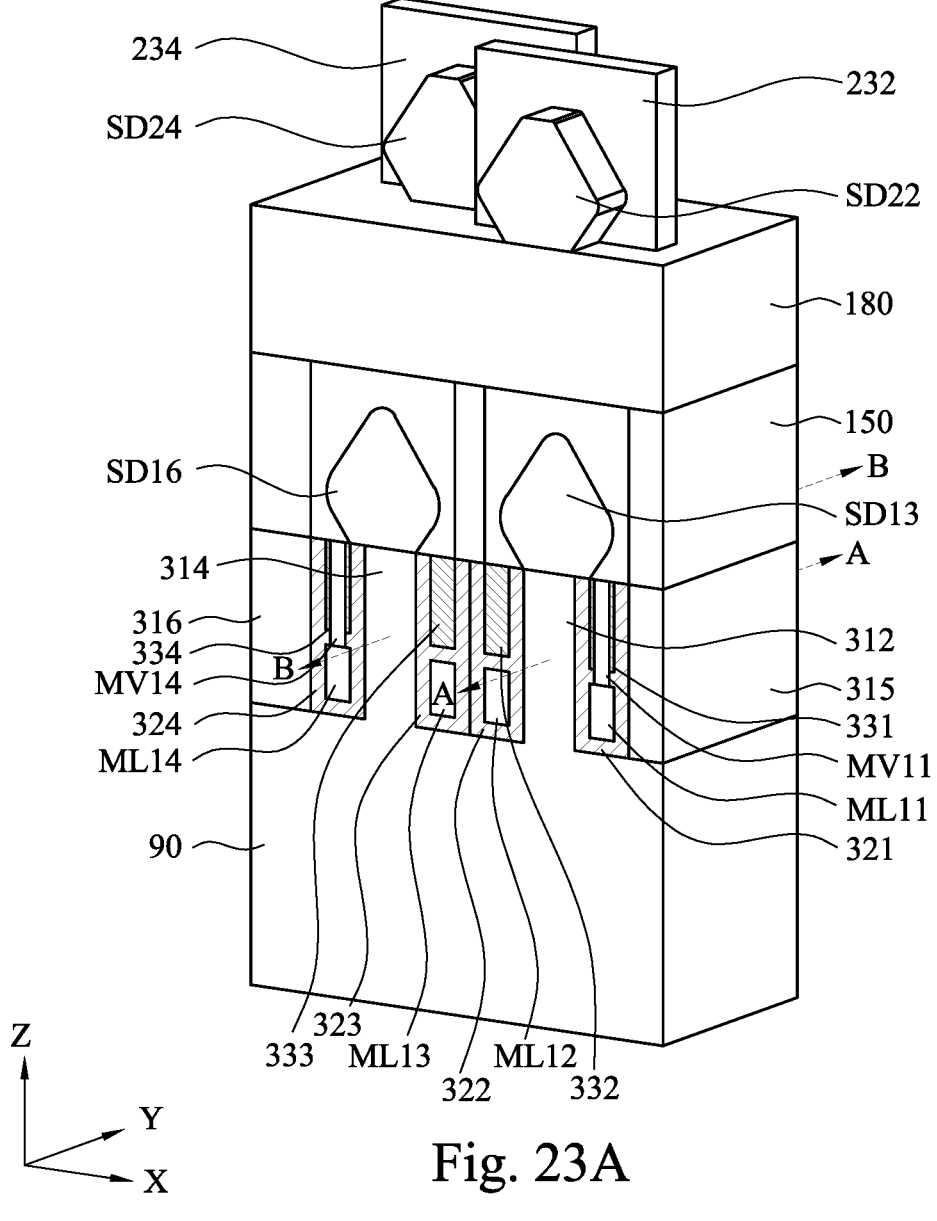
Figure 23B:
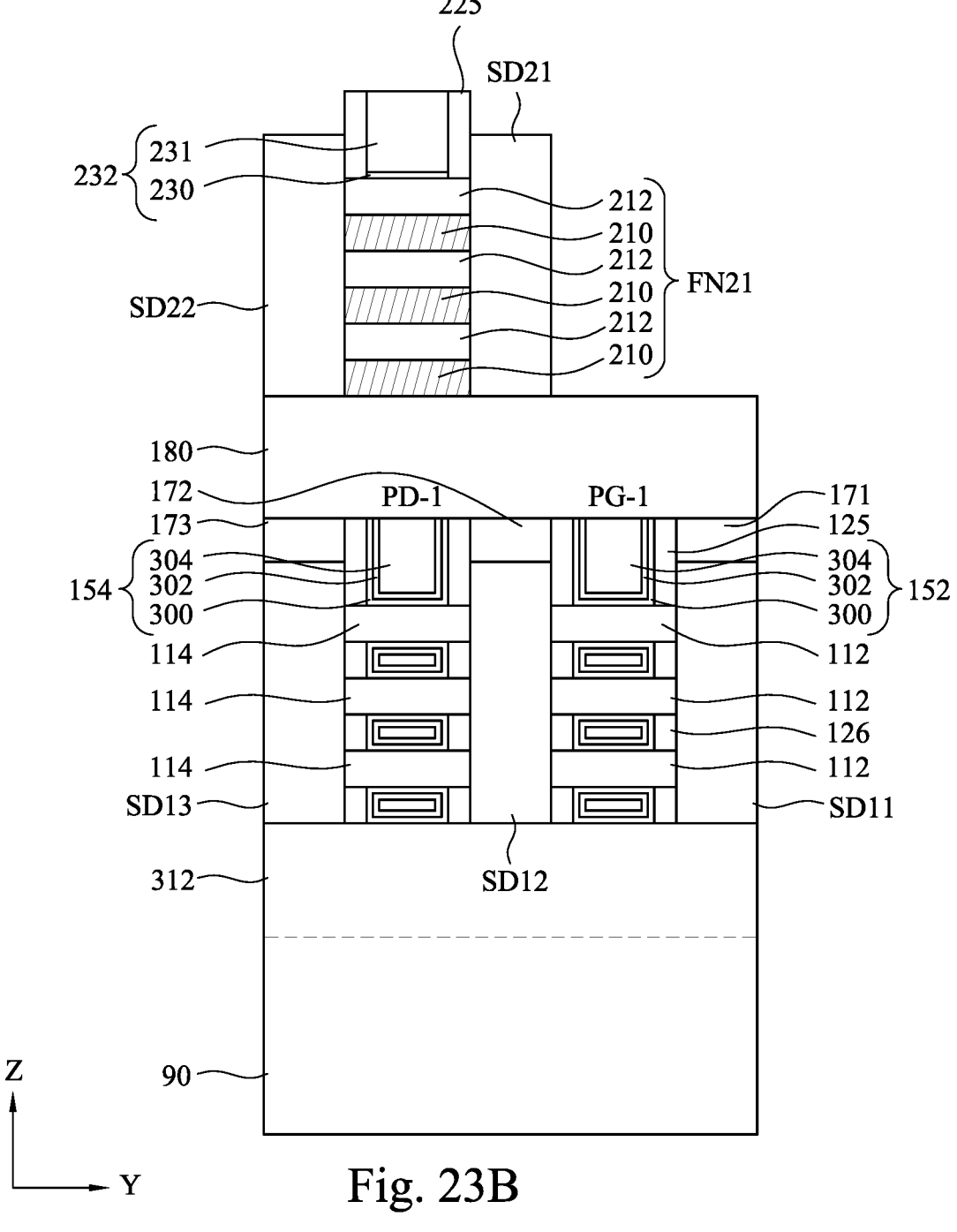
Figure 23C:
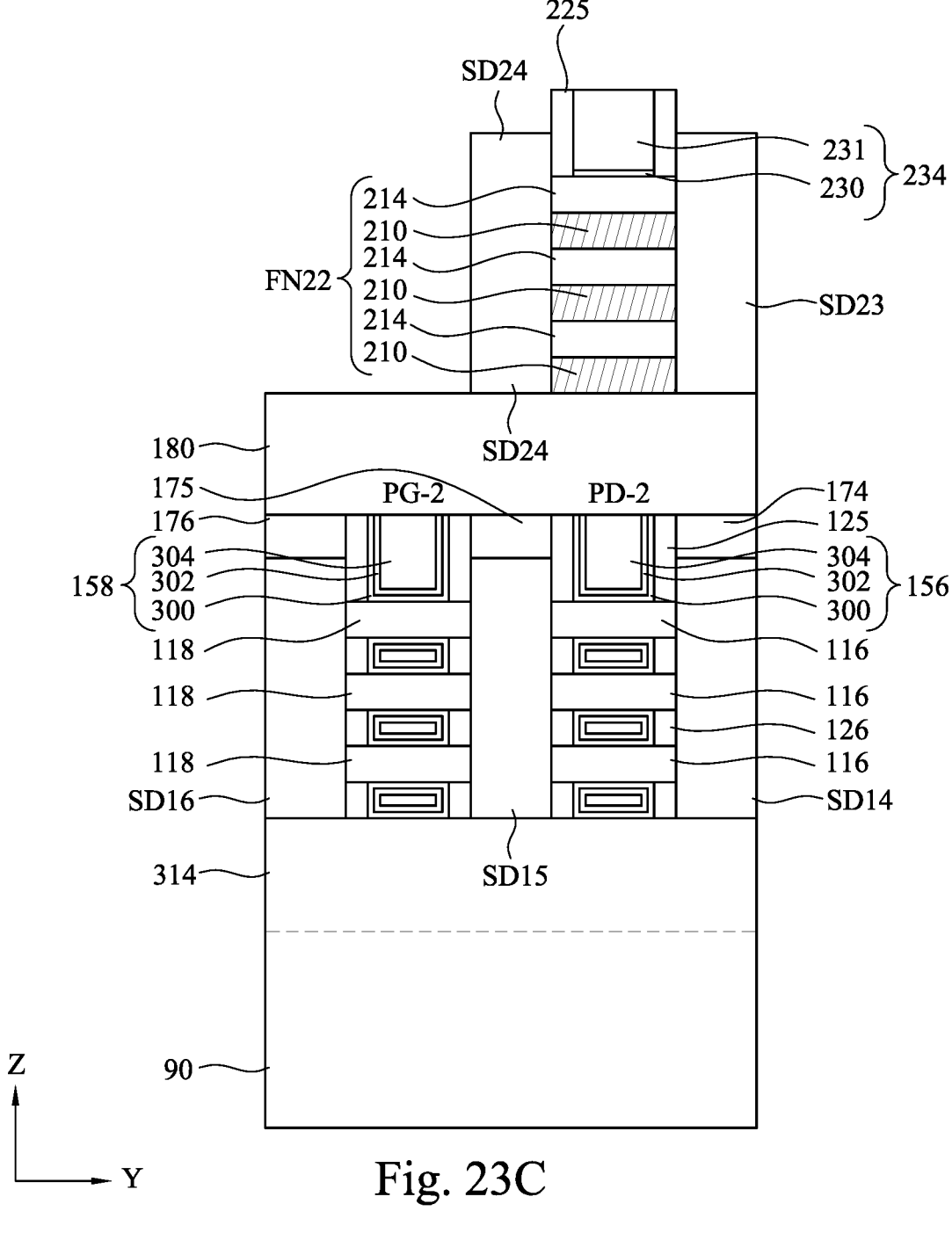

Reference is made to FIGS. 23A, 23B, and 23C, in which FIGS. 23B and 23C are cross-sectional views along lines B-B and C-C of FIG. 23A, respectively. Portions of the semiconductor layers 210 are laterally etched to form sidewall recesses, and then inner spacers 226 are formed in the sidewall recesses. The inner spacers 226 may be formed using similar method as forming the inner spacers 126.

Source/drain epitaxy structures SD21, SD22, SD23, and SD24 are formed on opposite sides of the dummy gate structures 232 and 234, respectively. In some embodiments, the source/drain epitaxy structures SD21, SD22, SD23, and SD24 may be formed using similar method as forming the inner spacers source/drain epitaxy structures SD11, SD12, SD13, SD14, SD15, and SD16, and thus relevant detail will not be repeated for brevity.

Figure 24A:
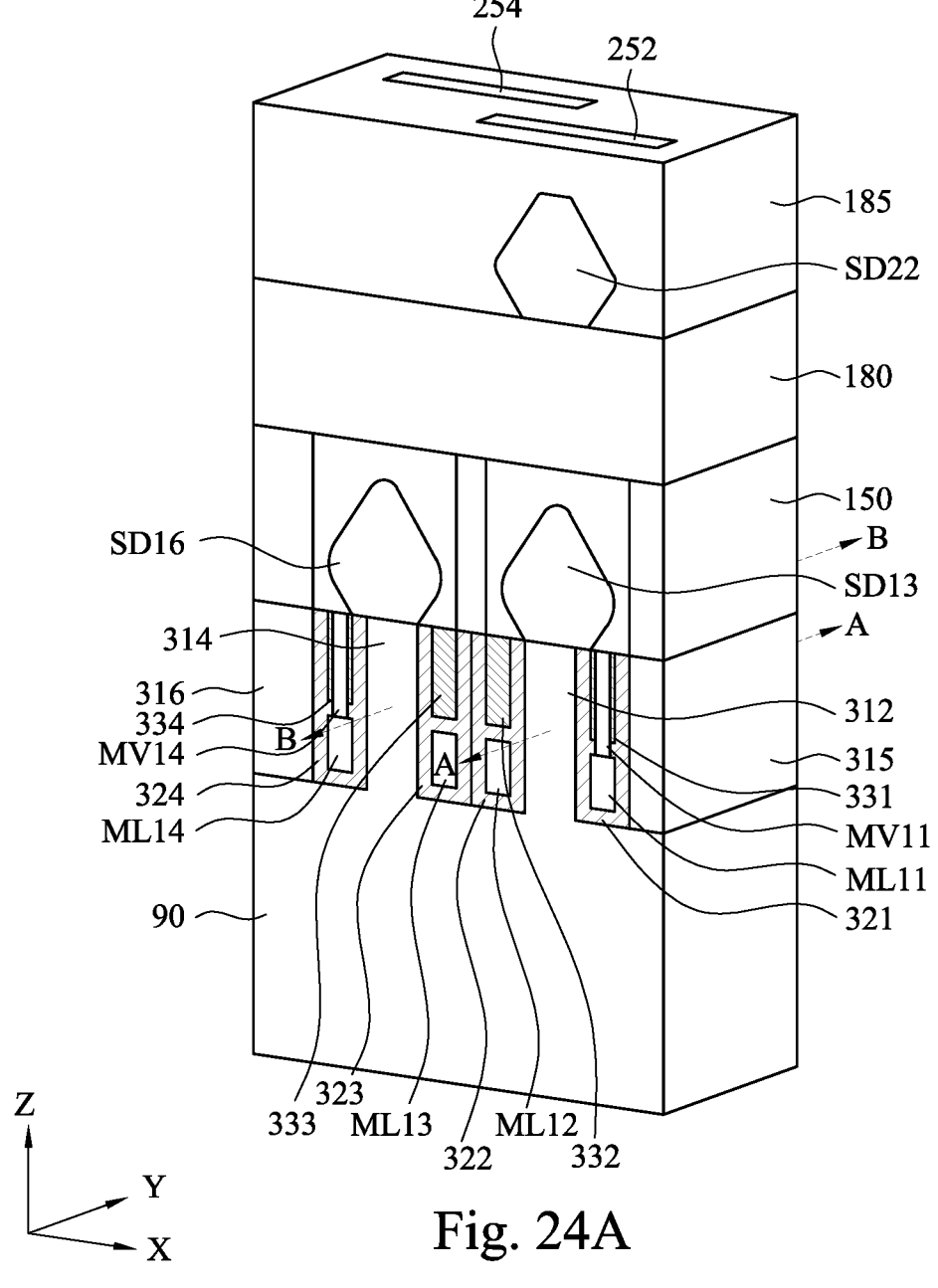
Figure 24B:
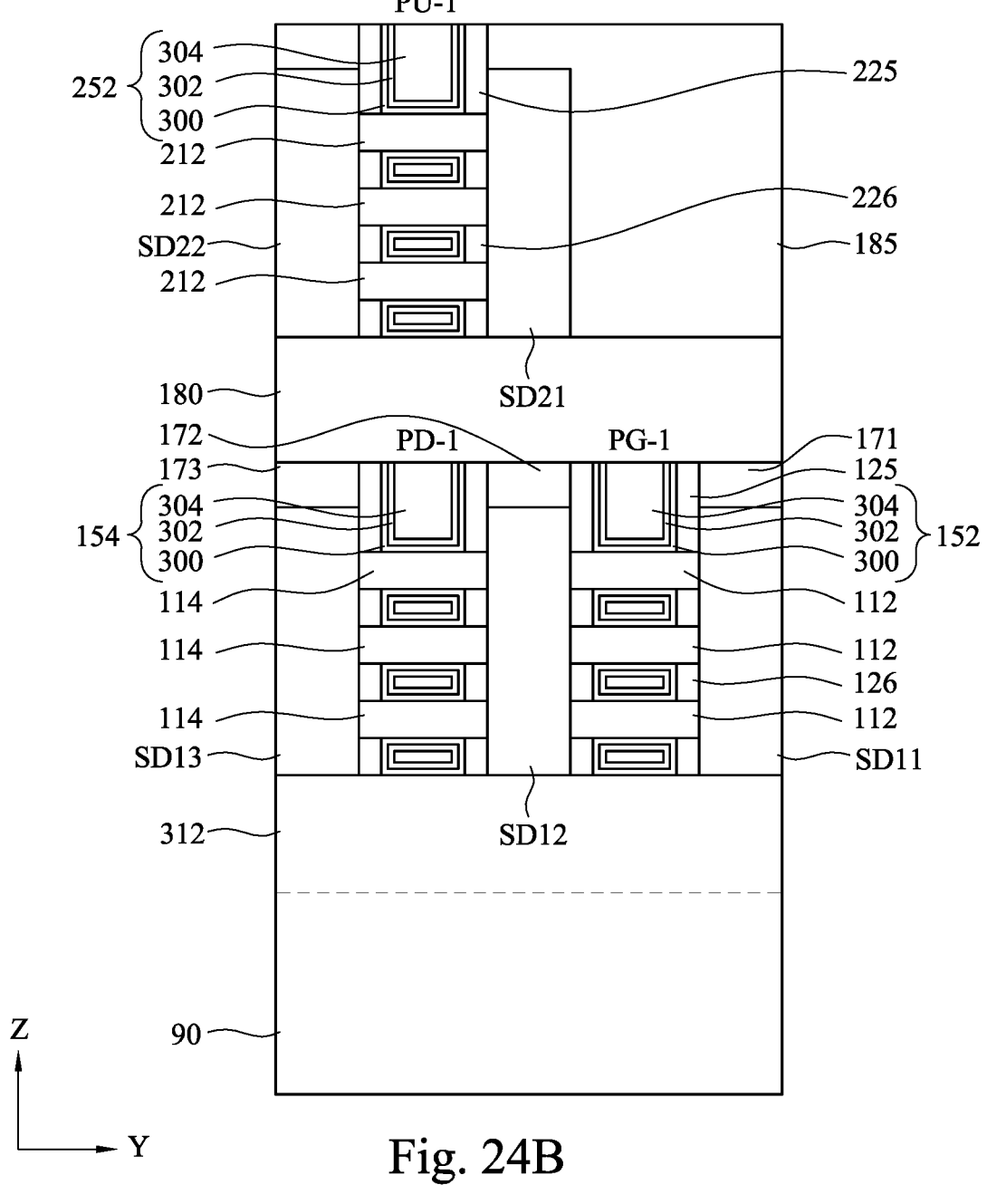
Figure 24C:
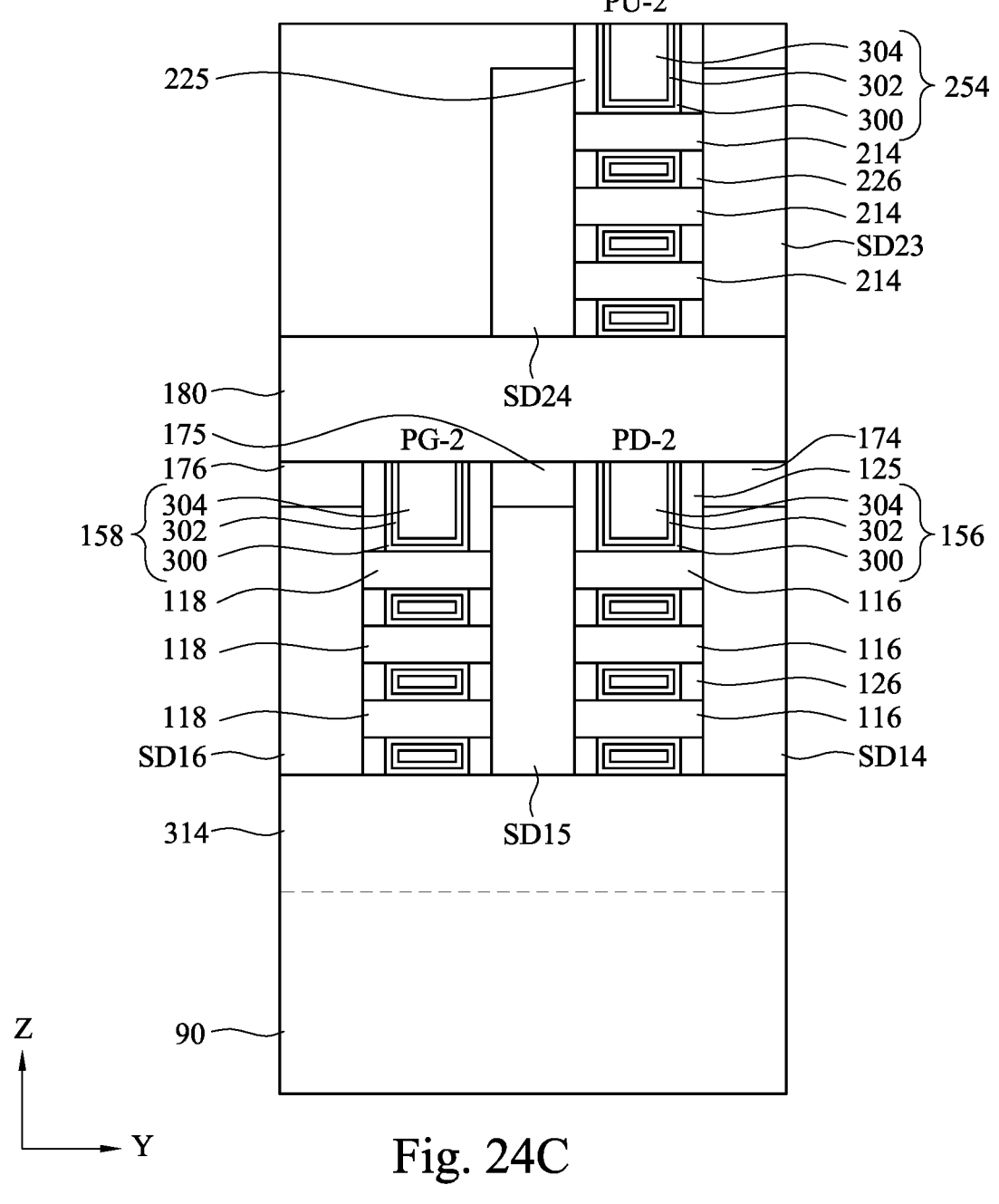

Reference is made to FIGS. 24A, 24B, and 24C, in which FIGS. 24B and 24C are cross-sectional views along lines B-B and C-C of FIG. 24A, respectively. An interlayer dielectric (ILD) layer 185 is formed over the semiconductor layer 180 and covering the source/drain epitaxy structures SD21, SD22, SD23, and SD24. In some embodiments, the ILD layer 185 can be formed by, for example, depositing a dielectric material over the semiconductor layer 180, followed by a CMP process to remove the excessive dielectric material until the dummy gate structures 232 and 234 are exposed.

After the ILD layer 185 is formed. The dummy gate structures 232 and 234 are removed to form gate trenches between each pair of the gate spacers 225. Then, portions of the semiconductor layers 210 exposed through the gate trenches are removed, such that semiconductor channel layers 212 and 214 are suspended over the substrate 90.

Metal gate structures 252 and 254 are formed over the substrate 90. In greater detail, metal gate structures 252 and 254 are formed in the gate trenches between the gate spacers 225 and wrap around the semiconductor channel layers 212 and 214, respectively. In some embodiments, the metal gate structures 252 and 254 may be formed by, for example, sequentially depositing a gate dielectric layer 300, a work function metal layer 302, and a filling metal 304 over the substrate 90 and filling the gate trenches between the gate spacers 225, and then performing a CMP process to remove excess material of gate dielectric layer 300, excess material of work function metal layer 302, and excess material of filling metal 304 until the ILD layer 185 is exposed.

Figure 25A:
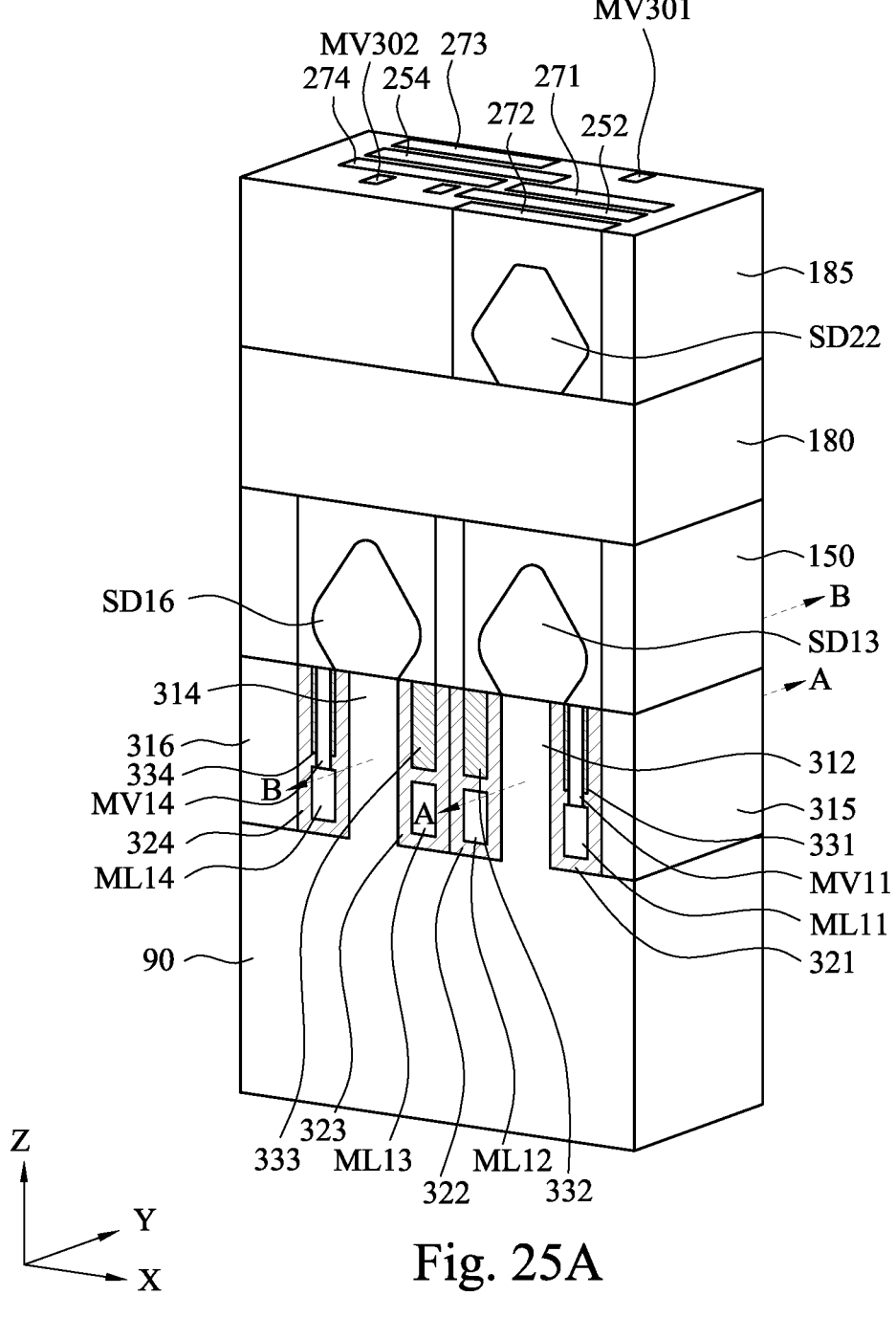
Figure 25B:
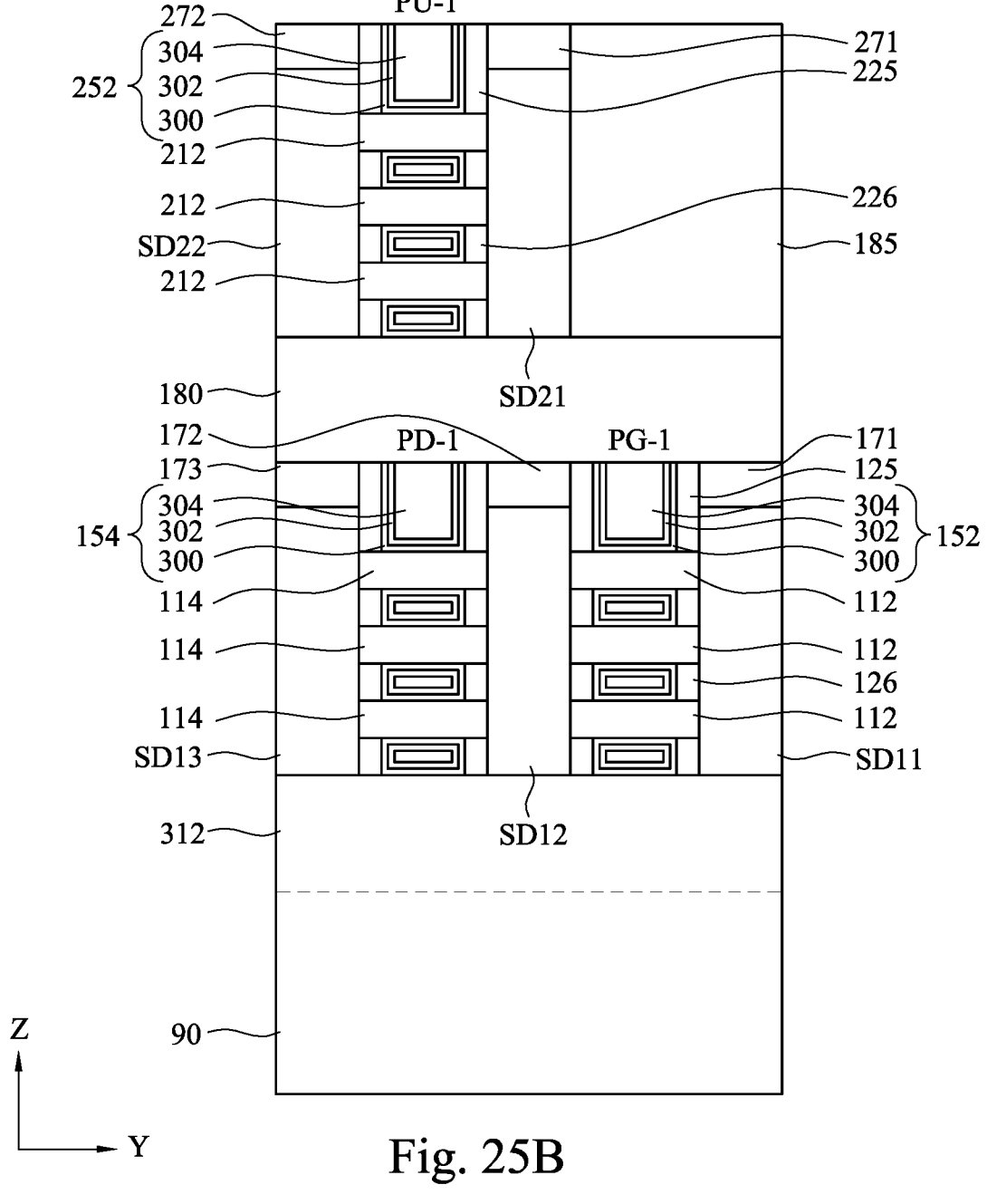
Figure 25C:
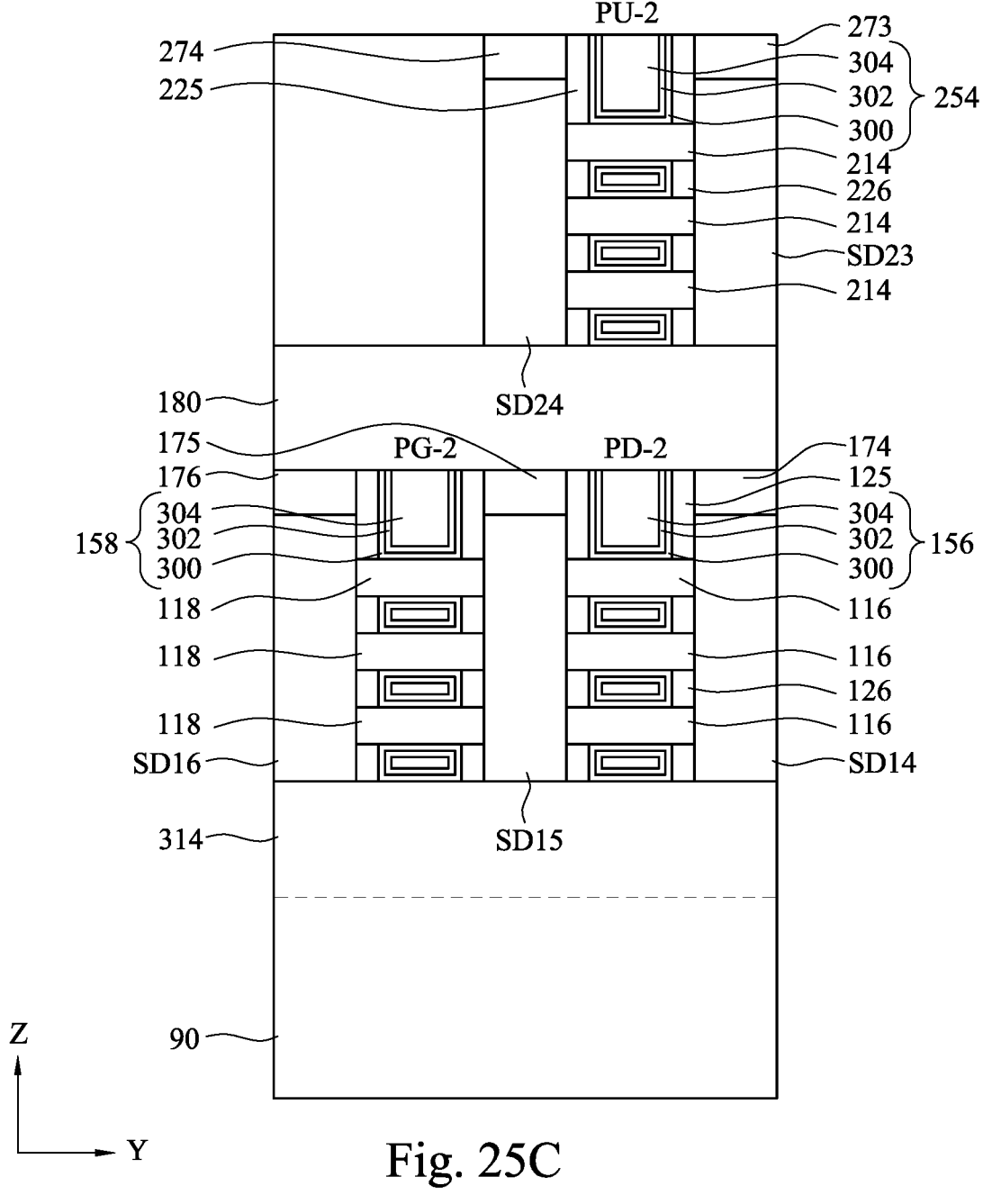

Reference is made to FIGS. 25A, 25B, and 25C, in which FIGS. 25B and 25C are cross-sectional views along lines B-B and C-C of FIG. 25A, respectively. Portions of the ILD layer 185 are removed to form openings exposing the source/drain epitaxy structures SD21, SD22, SD23, and SD24, and exposing the metal vias MV201 and MV202 in the semiconductor layer 180. Source/drain contacts 271, 272, 273, and 274, 175, and 176 are then formed in the openings and covering the source/drain epitaxy structures SD21, SD22, SD23, and SD24, respectively. Moreover, metal vias MV301 and MV302 are formed in the openings and in contact with the metal vias MV201 and MV202 in the semiconductor layer 180, respectively. In some embodiments, the source/drain contacts 271, 272, 273, and 274 and the metal vias MV301 and MV302 may be formed by, for example, depositing conductive material(s) in the openings, and then performing a CMP process to remove excess materials of the conductive material until the gate structures 252 and 254 are exposed.

Figure 26:
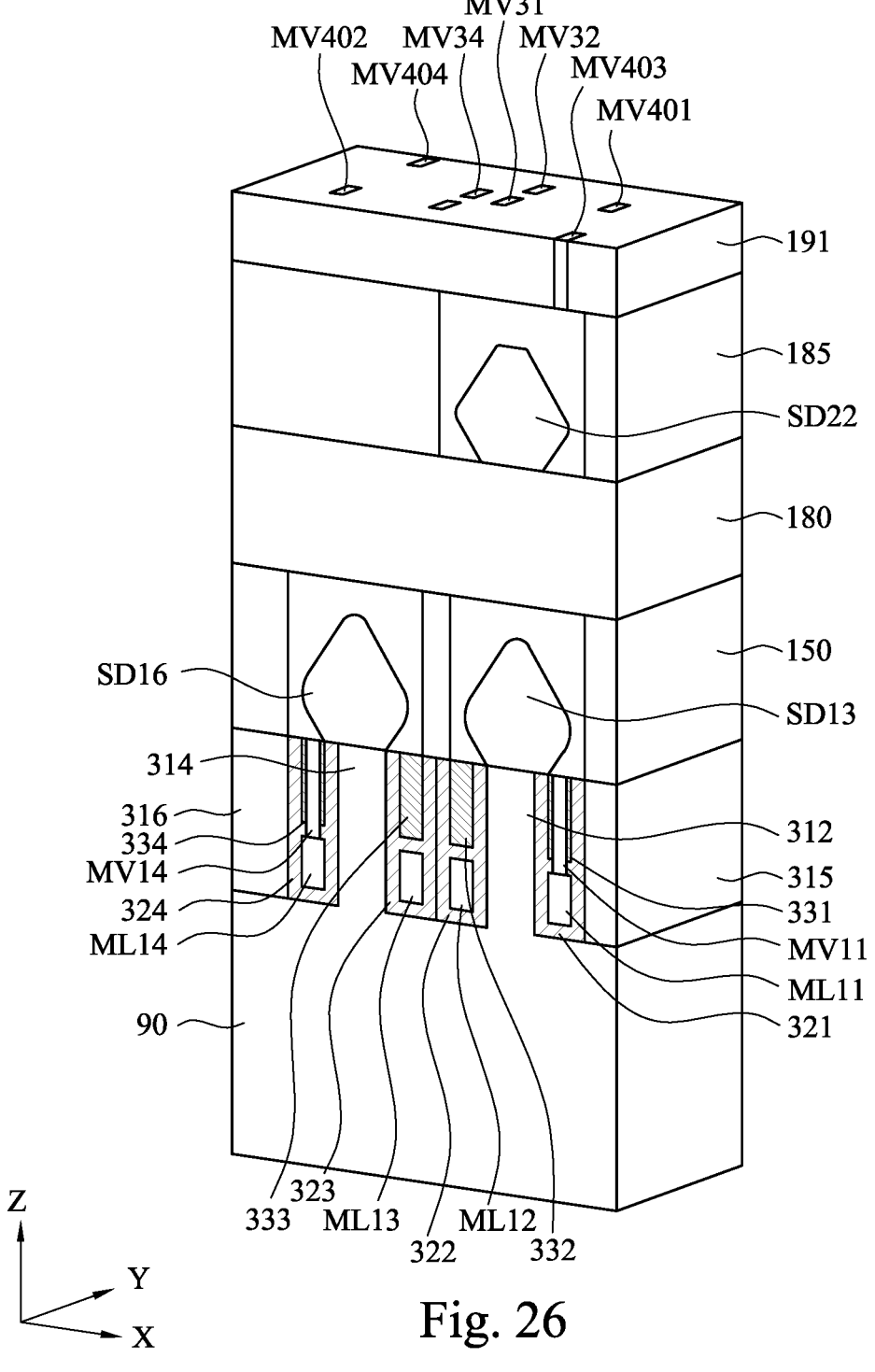

Reference is made to FIG. 26. An inter-metal dielectric (IMD) layer 191 is formed over the ILD layer 185. Afterwards, metal vias MV31, MV32, MV33, MV34, MV401, MV402, MV403, and MV404 are formed in the IMD layer 191. In greater detail, the metal vias MV31, MV32, MV33, and MV34 are formed in contact with the source/drain contact 271, the gate structure 254, the gate structure 252, and the source/drain contact 274, respectively. The metal vias MV401 and MV402 are in contact with the metal vias MV301 and MV302, respectively. The metal vias MV403, MV404 are in contact with the source/drain contacts 272 and 273, respectively.

Figure 27:
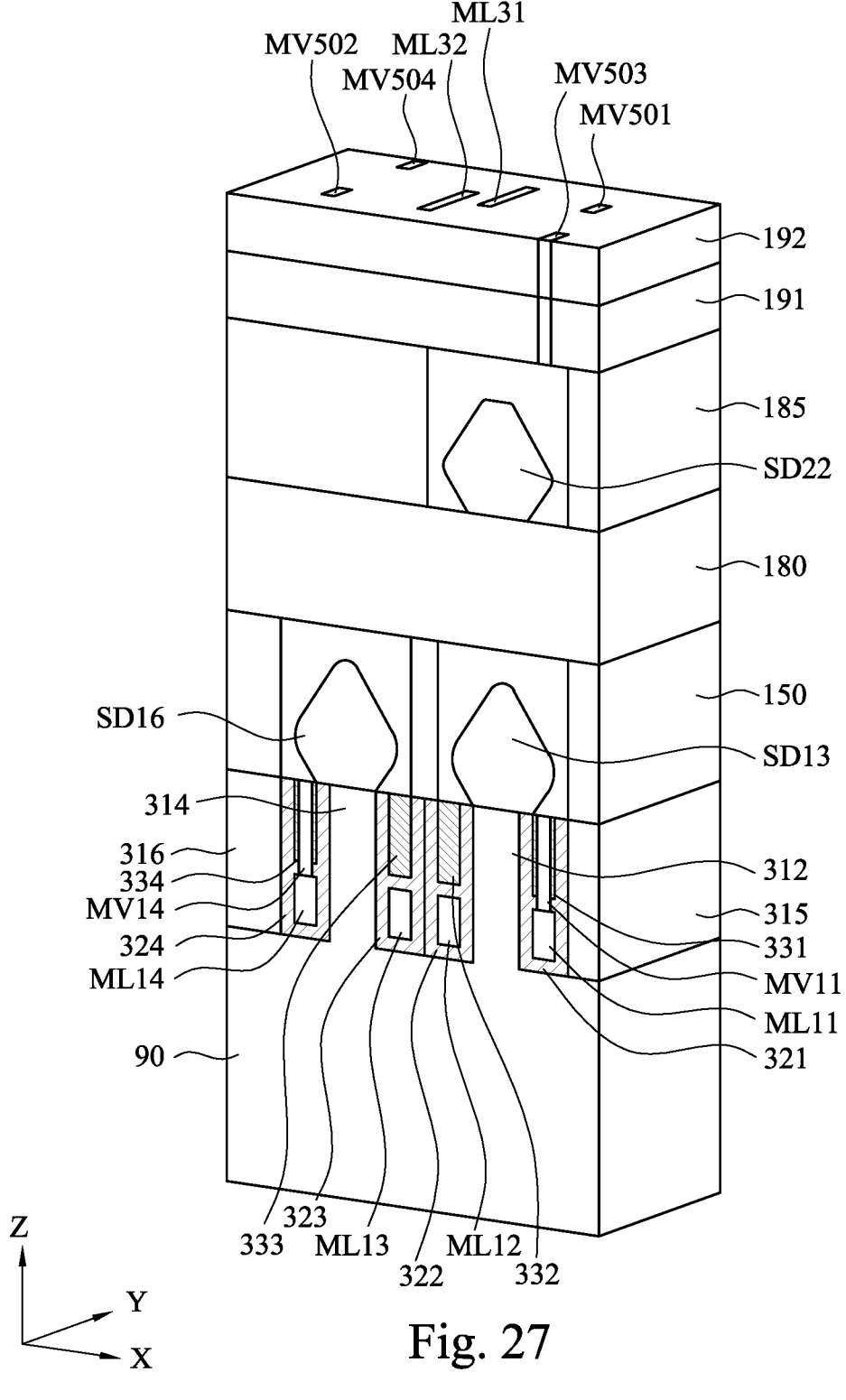

Reference is made to FIG. 27. An inter-metal dielectric (IMD) layer 192 is formed over the IMD layer 191. Afterwards, metal lines ML31 and ML32, and metal vias MV501, MV502, MV503, and MV504 are formed in the IMD layer 192. In greater detail, the metal line ML31 is in contact with the metal vias MV31 and MV32. The metal line ML32 is in contact with the metal vias MV33 and MV34. The metal vias MV501 and MV502 are in contact with the metal vias MV401 and MV402, respectively. The metal vias MV503 and MV504 are in contact with the metal vias MV403 and MV404, respectively.

Figure 28:
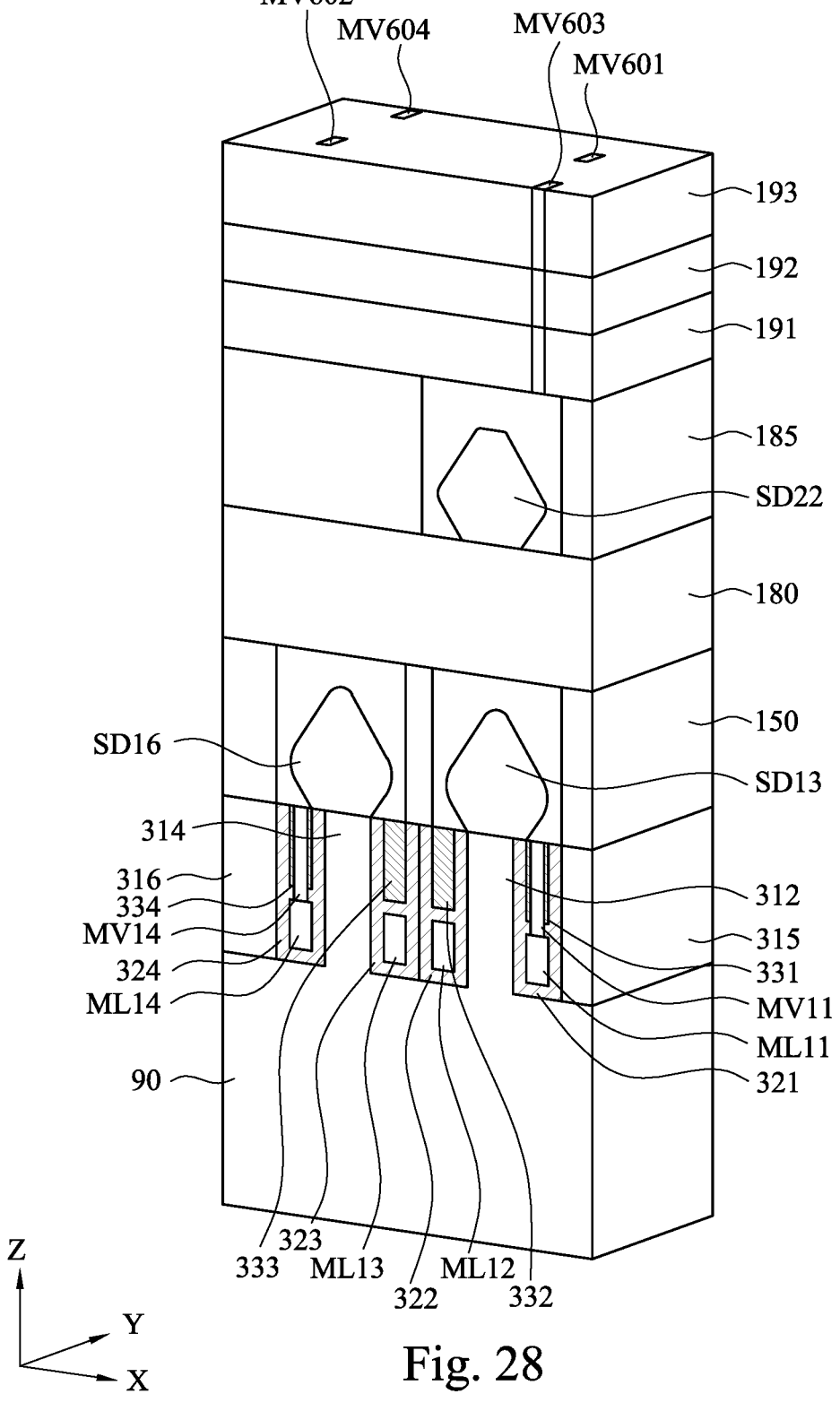

Reference is made to FIG. 28. An inter-metal dielectric (IMD) layer 193 is formed over the IMD layer 192. Afterwards, metal vias MV601, MV602, MV603, and MV604 are formed in the IMD layer 193. In greater detail, the metal vias MV601 and MV602 are in contact with the metal vias MV501 and MV502, respectively. The metal vias MV603 and MV604 are in contact with the metal vias MV503 and MV504, respectively. In some embodiments, the metal vias MV201, MV301, MV401, MV501, and MV601 collectively form the metal via MV41 as discussed in FIGS. 2A to 2E. Similarly, the metal vias MV202, MV302, MV402, MV502, and MV602 collectively form the metal via MV42 as discussed in FIGS. 2A to 2E.

Figure 29:
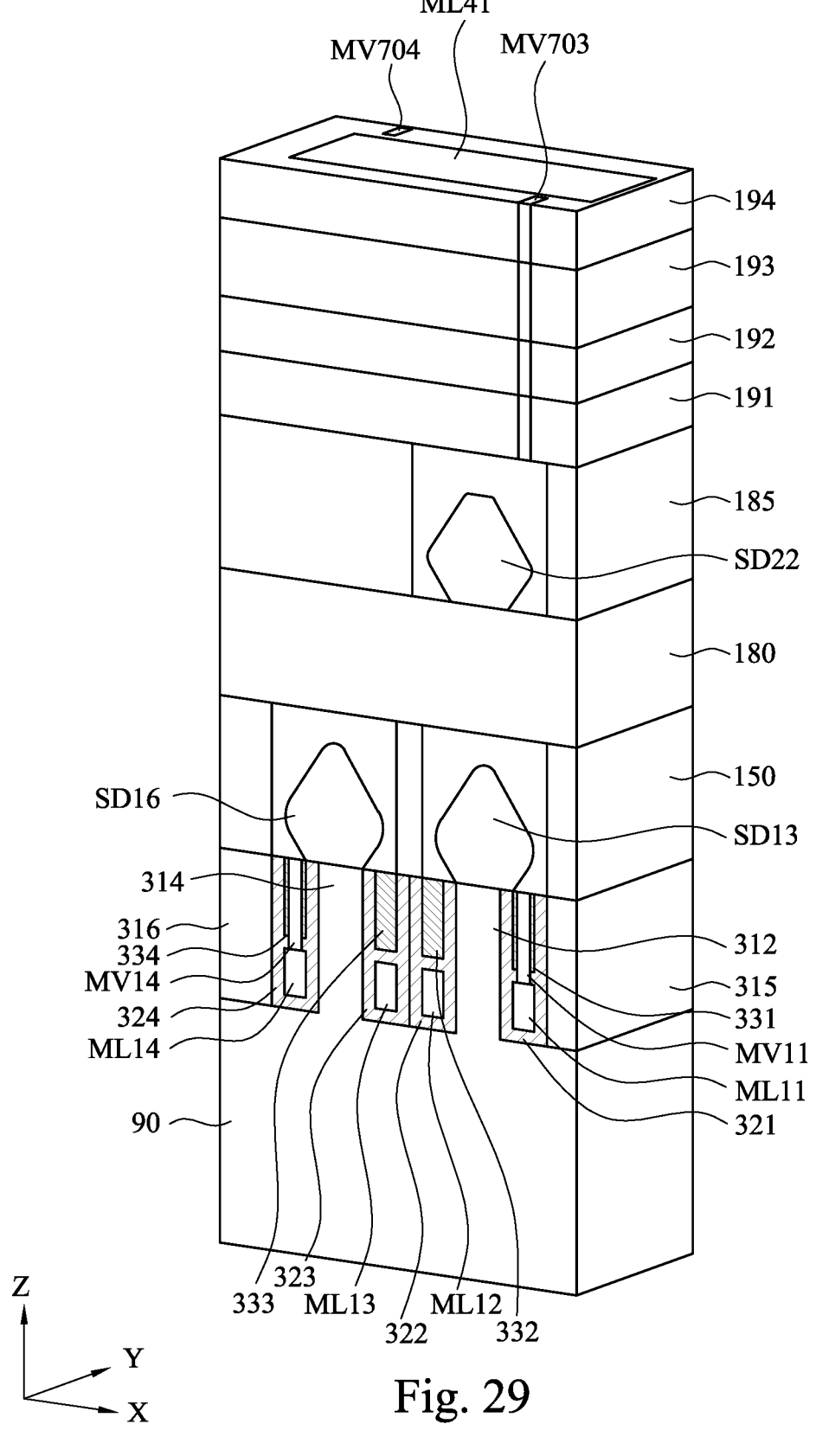

Reference is made to FIG. 29. An inter-metal dielectric (IMD) layer 194 is formed over the IMD layer 193. Afterwards, metal line ML41 and metal vias MV703 and MV704 are formed in the IMD layer 194. In greater detail, the metal line ML41 is in contact with the metal vias MV601 and MV602. The metal vias MV703 and MV704 are in contact with the metal vias MV603 and MV604, respectively.

Figure 30:
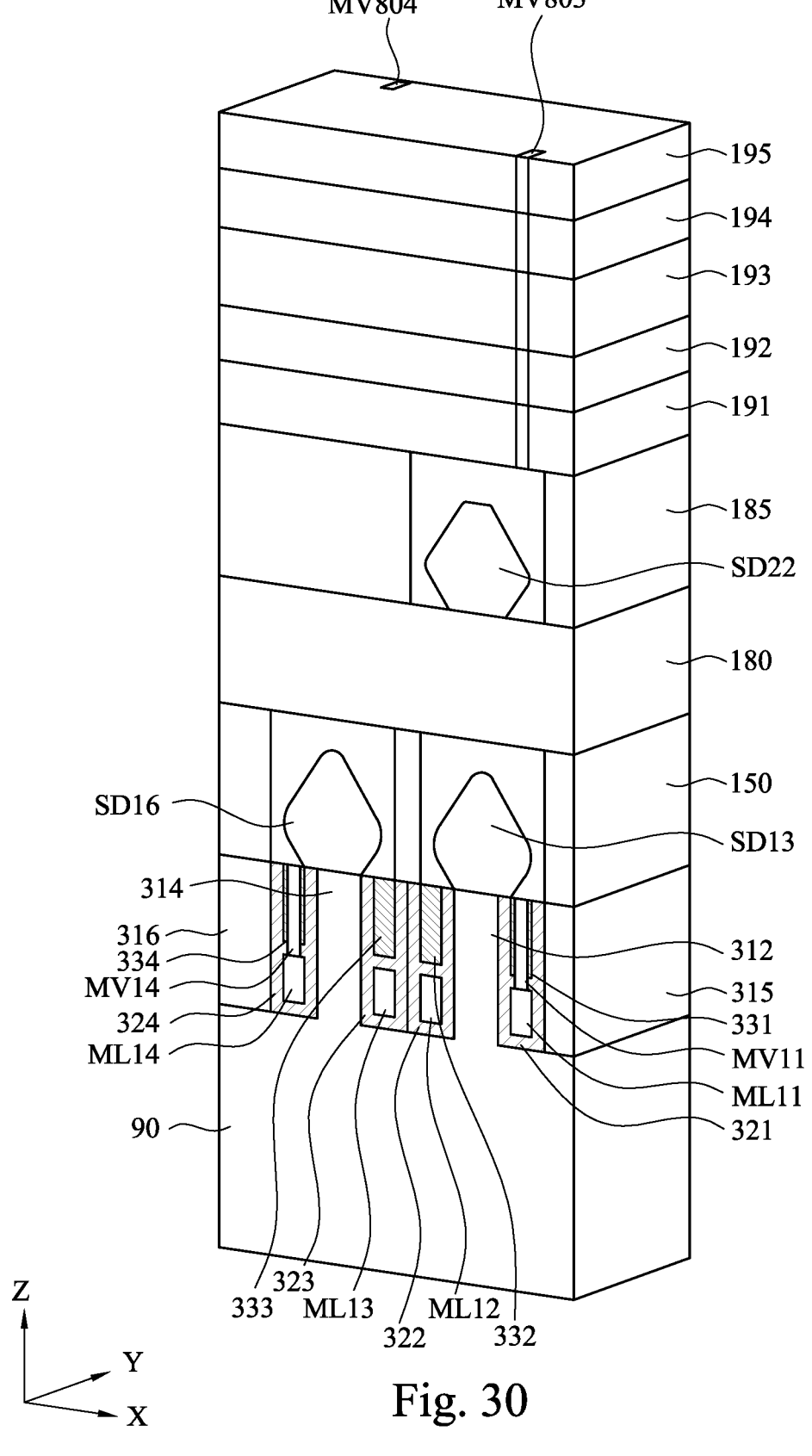

Reference is made to FIG. 30. An inter-metal dielectric (IMD) layer 195 is formed over the IMD layer 194. Afterwards, metal vias MV803 and MV804 are formed in the IMD layer 195. In greater detail, the metal vias MV803 and MV804 are in contact with the metal vias MV703 and MV704, respectively. In some embodiments, the metal vias MV303, MV403, MV503, MV603, and MV703 collectively form the metal via MV51 as discussed in FIGS. 2A to 2E. Similarly, the metal vias MV304, MV404, MV504, MV604, and MV704 collectively form the metal via MV52 as discussed in FIGS. 2A to 2E.

Figure 31:
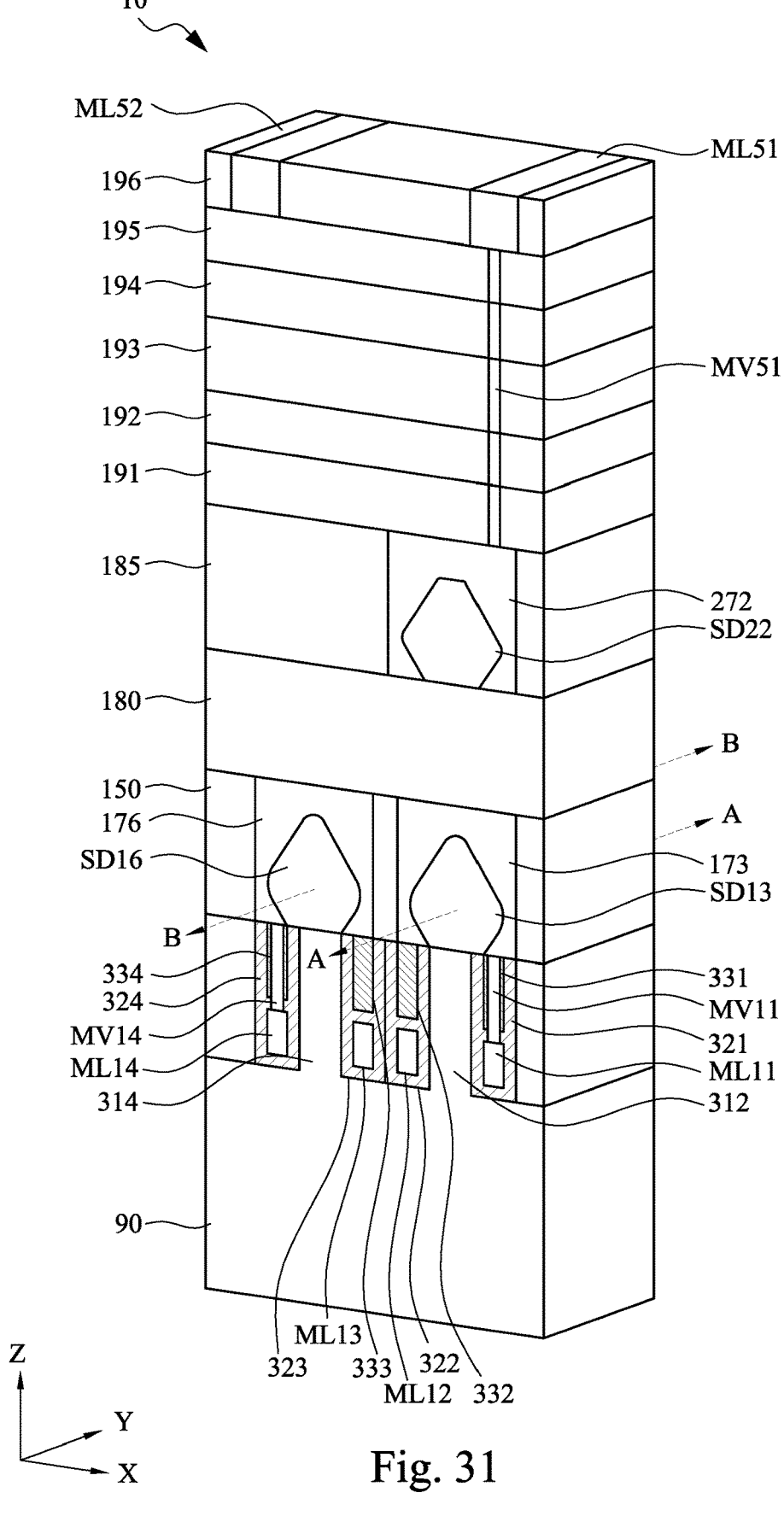

Reference is made to FIG. 31. An inter-metal dielectric (IMD) layer 196 is formed over the IMD layer 195. Afterwards, metal lines ML51 and ML52 are formed in the IMD layer 196. In greater detail, the metal lines ML51 and ML52 are in contact with the metal vias MV803 and MV804, respectively. As a result, the SRAM device 10 is formed.

Figure 32:
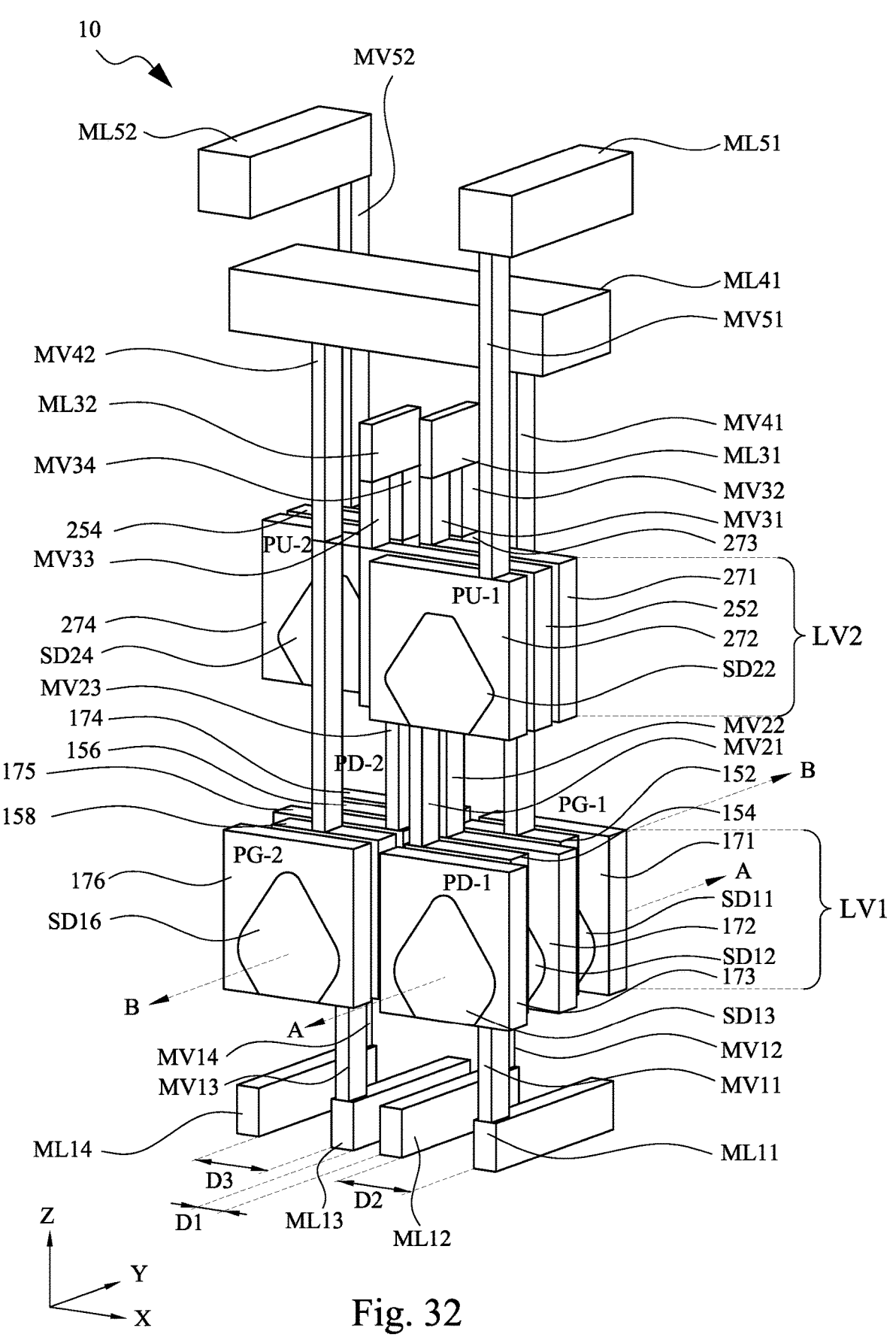
FIG. 32 is a perspective view of an SRAM device according to some embodiments of the present disclosure.

FIG. 32 is a perspective view of an SRAM device according to some embodiments of the present disclosure. FIG. 32 has substantially the same structure as FIG. 2C, similar elements are labeled the same and relevant details will not be repeated for brevity. The difference between FIGS. 32 and 2C is the positions of the metal vias MV13 and MV14 where in FIG. 32 the metal via MV13 is in contact with bottom surface of the source/drain contact 176, and the metal via MV14 is in contact with bottom surface of the source/drain contact 174. In some embodiments, the metal via MV11 is aligned at least in part with the metal via MV13 along the X direction. The metal via MV12 is aligned at least in part with the metal via MV14 along the X direction.

In some embodiments where the PU-1, PU-2 transistors are p-type transistors and the PD-1, PD-2, PG-1, PG-2 transistors are n-type transistors, the metal lines ML11 and ML14 may collectively serve as the power line VSS (see FIG. 1) of the SRAM device 10. Stated another way, the metal lines ML11 and ML14 can be regarded as first and second portions of the power line VSS. The metal line ML12 may act as the bit line BL (see FIG. 1) of the SRAM device 10, and the metal line ML13 may act as the bit line BLB (see FIG. 1) of the SRAM device 10. Alternatively, the metal line ML12 may act as the bit line BLB of the SRAM device 10, and the metal line ML13 may act as the bit line BL of the SRAM device 10.

In some embodiments where the PU-1, PU-2 transistors are n-type transistors and the PD-1, PD-2, PG-1, PG-2 transistors are p-type transistors, the metal lines ML11 and ML14 may collectively serve as the power line VDD of the SRAM device 10. Stated another way, the metal lines ML11 and ML14 can be regarded as first and second portions of the power line VDD. The metal line ML12 may act as the bit line BL of the SRAM device 10, and the metal line ML13 may act as the bit line BLB of the SRAM device 10. Alternatively, the metal line ML12 may act as the bit line BLB of the SRAM device 10, and the metal line ML13 may act as the bit line BL of the SRAM device 10.

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. Embodiments of the present disclosure provide an SRAM structure with a CFET configuration, in which PU-1 and PU-2 transistors are stacked over the PD-1, PG-1, PD-2, PG-2 transistors. Moreover, signal lines (e.g., bit lines) and power lines (e.g., Vdd or Vss) are disposed below the PD-1, PG-1, PD-2, PG-2 transistors, and signal lines (e.g., word line) and power lines (e.g., Vss or Vdd) are disposed above the PU-1 and PU-2 transistors. Such configuration may achieve small SRAM bitcell area by stacking transistors. Embodiments of the present disclosure provide an SRAM structure with interleaved metal layout configuration to separate signal lines (e.g. bit lines BL, BLB) by the power line (e.g. Vdd or Vss). Such configuration may prevent signal coupling between bit line BL and bit line BLB. Accordingly, the voltage drop at bit line BLB may be reduced, which will increase the read speed, and therefore improve the device performance.

In some embodiments of the present disclosure. A memory device is provided. A first pull-down transistor, a first pass-gate transistor, a second pull-down transistor, and a second pass-gate transistor are at a first level over a substrate. A first pull-up transistor and a second pull-up transistor are at a second level above the first level. A first power line, a first bit line, and a second bit line, the first power line includes first and second portions separated from each other, wherein in a cross-sectional view, the second portion of the first power line is laterally between the first and second bit lines along a direction. A first via is in contact with a top surface of the first portion of the first power line and electrically connected to a source/drain region of the first pull-down transistor. A second via is in contact with a top surface of the first bit line and electrically connected to a source/drain region of the first pass-gate transistor. A third via is in contact with a top surface of the second portion of the first power line and electrically connected to a source/drain region of the second pull-down transistor. A fourth via is in contact with a top surface of the second bit line and electrically connected to a source/drain region of the second pass-gate transistor, wherein in a top view, the first via is laterally aligned with the fourth via along the direction, and the second via is laterally aligned with the third via along the direction.

In some embodiments, a first semiconductor strip protrudes over the substrate and laterally between the first portion of the first power line and the first bit line. A second semiconductor strip protrudes over the substrate and laterally between the second portion of the first power line and the second bit line.

In some embodiments, a distance between the first bit line and the second portion of the first power line is shorter than a distance between the first portion of the first power line and the first bit line.

In some embodiments, a liner lines sidewalls and a bottom surface of the first bit line.

In some embodiments, a dielectric material lines sidewalls of the first via, wherein the liner extends to a sidewall of the dielectric material.

In some embodiments, a word line is electrically connected to a gate structure of the first pass-gate transistor and a gate structure of the second pass-gate transistor. A second power line is electrically connected to a source/drain region of the first pull-up transistor and a source/drain region of the second pull-up transistor.

In some embodiments, the first pull-up transistor vertically overlaps the first pull-down transistor and the second pull-down transistor vertically overlaps the second pass-gate transistor.

In some embodiments of the present disclosure. A memory device is provided. a first pull-down transistor, a first pass-gate transistor, a second pull-down transistor, and a second pass-gate transistor at a first level over a substrate. A first pull-down transistor and a second pull-up transistor are at a second level above the first level, wherein a gate structure of the first pull-up transistor vertically overlaps a gate structure of the first pull-down transistor and a gate structure of the second pull-up transistor vertically overlaps a gate structure of the second pull-down transistor. A first power line, a first bit line, and a second bit line, wherein the first power line comprises first and second portions separated from each other. A first via is in contact with a top surface of the first portion of the first power line and electrically connected to a source/drain region of the first pull-down transistor. A second via is in contact with a top surface of the second portion of the first power line and electrically connected to a source/drain region of the second pull-down transistor. A third via is in contact with a top surface of the first bit line and electrically connected to a source/drain region of the first pass-gate transistor. A fourth via is in contact with a top surface of the second bit line and electrically connected to a source/drain region of the second pass-gate transistor. First, second, third and fourth liners line sidewalls of the first portion of the first power line, sidewalls of the second portion of the first power line, sidewalls of the first bit line, and sidewalls of the second bit line, respectively. First, second, third and fourth dielectric materials line sidewalls of the first via, sidewalls of the second via, sidewalls of the third via, and sidewalls of the fourth via, respectively, wherein the first, second, third and fourth liners are made of a different material than the first, second, third and fourth dielectric materials.

In some embodiments, the first, second, third and fourth liners further extend to sidewalls of the first, second, third and fourth dielectric materials, respectively.

In some embodiments, the first, second, third and fourth dielectric materials are separated from the first portion of the first power line, the second portion of the first power line, the first bit line, and the second bit line, respectively.

In some embodiments, the first, second, third and fourth liners further extend to top surfaces of the first power line, the second portion of the first power line, the first bit line, and the second bit line, respectively.

In some embodiments, a semiconductor strip protrudes over the substrate, and wherein the first and second liners are in contact with the semiconductor strip.

In some embodiments, the second liner is in contact with the third liner.

In some embodiments, the first power line, the first bit line, and the second bit line are below the first level.

In some embodiments, a word line is electrically connected to a gate structure of the first pass-gate transistor and a gate structure of the second pass-gate transistor. A second power line is electrically connected to a source/drain region of the first pull-up transistor and a source/drain region of the second pull-up transistor.

In some embodiments of the present disclosure, forming a first semiconductor strip and a second semiconductor strip protruding over a substrate; forming first, second, and third isolation structures over the substrate, the first semiconductor strip being between the first and second isolation structures, and the second semiconductor strip being between the second and third isolation structures; patterning the second and third isolation structures to form first and second trenches in the second and third isolation structures, respectively; forming first and second metal lines in the first and second trenches, respectively; after forming the first and second metal lines, patterning the first and second isolation structures to form third and fourth trenches in the first and second isolation structures, respectively; forming third and fourth metal lines in the third and fourth trenches, respectively; forming a first pull-down transistor electrically connected to the third metal line, a first pass-gate transistor electrically connected to the first metal line, a second pull-down transistor electrically connected to the fourth metal line, and a second pass-gate transistor electrically connected to the second metal line; and forming a first pull-up transistor and a second pull-up transistor vertically stacked over the first pull-down transistor, the first pass-gate transistor, the second pull-down transistor, and the second pass-gate transistor.

In some embodiments, the method further includes prior to forming the first and second metal lines, forming first and second liners in the first and second trenches, respectively; prior to forming the third and fourth metal lines, forming third and fourth liners in the first and second trenches, respectively; and etching back the first, second, third, and fourth metal lines, such that top surfaces of the first, second, third, and fourth metal lines are lowered to a position below top ends of the first, second, third, and fourth liners.

In some embodiments, the method further includes after etching back the first, second, third, and fourth metal lines, forming first, second, third, and fourth vias in contact with the first, second, third, and fourth metal lines, respectively.

In some embodiments, the method further includes prior to forming the first, second, third, and fourth vias, forming first, second, third, and fourth dielectric materials over the second, third, and fourth metal lines, respectively, wherein the first, second, third, and fourth vias are formed in the first, second, third, and fourth dielectric materials, respectively.

In some embodiments, the first metal line serves as a first bit line, the second metal line serves as a second bit line, and the third and fourth metal lines collectively serve as a first power line, and wherein the method further includes forming a word line electrically connected to the first and second pass-gate transistors; and forming a second power line electrically connected to the first and second pull-up transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a first semiconductor strip and a second semiconductor strip protruding over a substrate;

forming first, second, and third isolation structures over the substrate, the first semiconductor strip being between the first and second isolation structures, and the second semiconductor strip being between the second and third isolation structures;

patterning the second and third isolation structures to form first and second trenches in the second and third isolation structures, respectively;

forming first and second metal lines in the first and second trenches, respectively;

after forming the first and second metal lines, patterning the first and second isolation structures to form third and fourth trenches in the first and second isolation structures, respectively;

forming third and fourth metal lines in the third and fourth trenches, respectively;

forming a first pull-down transistor electrically connected to the third metal line, a first pass-gate transistor electrically connected to the first metal line, a second pull-down transistor electrically connected to the fourth metal line, and a second pass-gate transistor electrically connected to the second metal line; and forming a first pull-up transistor and a second pull-up transistor vertically stacked over the first pull-down transistor, the first pass-gate transistor, the second pull-down transistor, and the second pass-gate transistor.

2. The method of claim 1, further comprising:

prior to forming the first and second metal lines, forming first and second liners in the first and second trenches, respectively;

prior to forming the third and fourth metal lines, forming third and fourth liners in the first and second trenches, respectively; and etching back the first, second, third, and fourth metal lines, such that top surfaces of the first, second, third, and fourth metal lines are lowered to a position below top ends of the first, second, third, and fourth liners.

3. The method of claim 2, further comprising after etching back the first, second, third, and fourth metal lines, forming first, second, third, and fourth vias in contact with the first, second, third, and fourth metal lines, respectively.

4. The method of claim 3, further comprising prior to forming the first, second, third, and fourth vias, forming first, second, third, and fourth dielectric materials over the second, third, and fourth metal lines, respectively, wherein the first, second, third, and fourth vias are formed in the first, second, third, and fourth dielectric materials, respectively.

5. The method of claim 1, wherein the first metal line serves a first bit line, the second metal line serves as a second bit line, and the third and fourth metal lines collectively serve as a first power line, and wherein the method further comprises:

forming a word line electrically connected to the first and second pass-gate transistors; and forming a second power line electrically connected to the first and second pull-up transistors.

6. A method, comprising:

forming a semiconductor strip protruding over a substrate;

forming an isolation structure over the substrate and adjacent to the semiconductor strip;

etching the isolation structure to form a trench;

depositing a liner in the trench;

depositing a conductive material in the trench and over the liner;

etching back the conductive material;

depositing a dielectric material over the conductive material; and forming a semiconductor device over the semiconductor strip and electrically connected to the conductive material.

7. The method of claim 6, wherein etching back the conductive material is performed to lower a top surface of the conductive material to a position lower than a top surface of the semiconductor strip.

8. The method of claim 6, further comprising forming a liner material over the conductive material after etching back the conductive material and prior to depositing the dielectric material over the conductive material.

9. The method of claim 6, further comprising forming a via in the dielectric material and electrically connected to the conductive material.

10. The method of claim 6, further comprising forming a source/drain contact over a source/drain structure of the semiconductor device, wherein the conductive material is electrically connected to the source/drain contact.

11. The method of claim 10, further comprising forming a via in the dielectric material and electrically connecting the conductive material and the source/drain contact.

12. The method of claim 6, further comprising forming another semiconductor device vertically above the semiconductor device.

13. The method of claim 6, further comprising etching back the isolation structure, the liner, and the dielectric material prior to forming the semiconductor device.

14. The method of claim 6, wherein the conductive material serves as a power line or a bit line of the semiconductor device.

15. A method, comprising:

forming a first metal line and a second metal line over a substrate and at a first level;

forming a first transistor and a second transistor over the substrate and at a second level higher than the first level, wherein the first metal line is electrically connected to the first transistor, and the second metal line is electrically connected to the second transistor;

forming a third transistor over the substrate and at a third level higher than the second level, wherein the third transistor is electrically connected to the first transistor and the second transistor, and forming a third metal line over the substrate and at a fourth level higher than the third level, wherein the third metal line is electrically connected to the second transistor wherein the first metal line serves as a power line, the second metal line serves as a bit line, and the third metal line serves as a word line.

16. The method of claim 15, further comprising forming a first via and a second via over the first metal line and the second metal line, respectively, wherein the first metal line is electrically connected to the first transistor through the first via, and the second metal line is electrically connected to the second transistor through the second via.

17. The method of claim 15, further comprising forming a semiconductor strip over the substrate, wherein the first metal line and the second metal line are on opposite sides of the semiconductor strip.

18. The method of claim 15, further comprising forming an isolation structure over the substrate, wherein the first metal line and the second metal line are formed in the isolation structure.

19. The method of claim 15, wherein the first, second, and third transistor has a gate-all-around (GAA) configuration.

20. The method of claim 15, wherein the first transistor and the second transistor have a first conductivity type, and the third transistor has a second conductivity type opposite to the first conductivity type.

* * * * *